(12) United States Patent
Pahlevaninezhad et al.

(10) Patent No.: US 11,502,540 B2
(45) Date of Patent: Nov. 15, 2022

(54) HYBRID-ENERGY APPARATUS, SYSTEM, AND METHOD THEREFOR

(71) Applicant: 10644137 CANADA INC., Heritage Pointe (CA)

(72) Inventors: Majid Pahlevaninezhad, Calgary (CA); Sajjad Makhdoomi Kaviri, Calgary (CA); Behzad Poorali, Calgary (CA); Hadis Hajebrahimi, Calgary (CA); Hamid Pahlevaninezhad, Calgary (CA); Afshin Shahalizad, Calgary (CA); Sam Scherwitz, Heritage Pointe (CA)

(73) Assignee: 10644137 CANADA INC., Heritage Pointe (CA)

( * ) Notice: Subject to any disclaimer, the term of this patent is extended or adjusted under 35 U.S.C. 154(b) by 0 days.

(21) Appl. No.: 17/620,658

(22) PCT Filed: Jun. 18, 2020

(86) PCT No.: PCT/CA2020/050848
§ 371 (c)(1),
(2) Date: Dec. 17, 2021

(87) PCT Pub. No.: WO2020/252584
PCT Pub. Date: Dec. 24, 2020

(65) Prior Publication Data
US 2022/0247204 A1   Aug. 4, 2022

Related U.S. Application Data

(60) Provisional application No. 62/862,898, filed on Jun. 18, 2019.

(51) Int. Cl.
| | |
|---|---|
| *H02J 7/35* | (2006.01) |
| *H02J 3/38* | (2006.01) |
| *H02S 40/38* | (2014.01) |
| *H02S 40/32* | (2014.01) |
| *H02M 7/00* | (2006.01) |

(52) U.S. Cl.
CPC ............ *H02J 7/35* (2013.01); *H02J 3/381* (2013.01); *H02S 40/32* (2014.12); *H02S 40/38* (2014.12);
(Continued)

(58) Field of Classification Search
CPC . H02J 7/35; H02J 2300/24; H02J 3/38; H02S 40/32; H02S 40/38; H02M 7/003; H02M 7/00
See application file for complete search history.

(56) References Cited

U.S. PATENT DOCUMENTS

| | | |
|---|---|---|
| 9,865,903 B1 | 1/2018 | Petrella |
| 2015/0160676 A1 | 6/2015 | Pan et al. |

(Continued)

OTHER PUBLICATIONS

M. K. Song et al. "A 20V 8.4W 20MHz Four-Phase GaN DC-DC Converter with Fully On-Chip Dual-SR Bootstrapped GaN FET Driver Achieving 4ns Constant Propagation Delay and 1ns Switching Rise Time". 2015 IEEE International Solid-State Circuits Conference (ISSCC) Digest of Technical Papers, San Francisco, CA, Mar. 19, 2015, pp. 302-304 (3 pages).

(Continued)

*Primary Examiner* — Robert L Deberadinis
(74) *Attorney, Agent, or Firm* — Chamberlain, Hrdlicka, White, Williams & Aughtry

(57) ABSTRACT

A multi-layer apparatus has a transparent or semi-transparent substrate, a solar-cell layer coupled to the substrate, an energy-storage layer coupled to the solar-cell layer, and a converter layer coupled to the energy-storage layer. The solar-cell layer has a plurality of solar cells for receiving light through the substrate and converting energy of the received light to a first electrical energy, the energy-storage layer has one or more energy-storage units for storing a second electrical energy, and the converter layer has one or more power converters electrically connected to the solar-
(Continued)

cell layer and the energy-storage layer for receiving the first electrical energy and the second electrical energy therefrom and outputting a third electrical energy via an output thereof.

12 Claims, 35 Drawing Sheets

(52) U.S. Cl.
CPC .......... *H02J 2300/24* (2020.01); *H02M 7/003* (2013.01)

(56) References Cited

U.S. PATENT DOCUMENTS

| | | |
|---|---|---|
| 2015/0200311 A1 | 7/2015 | Bredel et al. |
| 2016/0372926 A1 | 12/2016 | Pahlevaninezhad et al. |
| 2017/0018932 A1 | 1/2017 | Pahlevaninezhad et al. |

OTHER PUBLICATIONS

L. Fu et al. "A phase shift controlled current-fed Quasi-Switched-Capacitor isolated dc/dc converter with GaN HEMTs for photovoltaic applications". 2015 IEE Applied Power Electronics Conference and Exposition (APEC), Charlotte, NC, Mar. 11, 2015, pp. 191-198 (8 pages).
International Search Report dated Sep. 10, 2020, issued in corresponding PCT Application No. PCT/CA2020/050848 (5 pages).
Written Opinion dated Sep. 10, 2020, issued in corresponding PCT Application No. PCT/CA2020/050848 (9 pages).
International Preliminary Report on Patentability dated Jun. 30, 2021, issued in corresponding PCT Application No. PCT/CA2020/050848 (23 pages).

HYBRID-ENERGY APPARATUS, SYSTEM, AND METHOD THEREFOR

CROSS-REFERENCE TO RELATED APPLICATIONS

This application claims the benefit of U.S. Provisional Patent Application Ser. No. 62/862,898, filed Jun. 18, 2019, the content of which is incorporated herein by reference in its entirety.

FIELD OF THE DISCLOSURE

The present disclosure relates to energy apparatuses, systems, and methods therefor, and in particular to apparatuses and systems integrating hybrid-energy sources such as solar cells and batteries for providing electrical energy for various applications.

BACKGROUND

Solar energy has been used as a clean and practical energy source for various applications. For example, solar panels may be deployed at sunny locations such as rooftop for collecting solar energy and converting collected solar energy to electrical power for powering various electrical devices. Solar panels of various forms, styles, and sizes have been widely used as the energy-source components of various devices such as solar tiles, phone chargers, residential appliances, industrial equipment, and the like.

For example, FIGS. 1 to 3 show some prior-art solar-energy harvesting systems collectively denoted using reference numeral 10. In the solar-energy harvesting system 10 shown in FIG. 1, a solar panel 12 or more specifically a photovoltaic (PV) panel is used to convert solar energy to electricity and output it to an electronic power converter 14. The electronic power converter 14 converts the received electricity to a usable form for powering a load 16.

The electronic power converter 14 is also connected to an Alternating-Current (AC) utility grid 20 via a switch 18. Therefore, when the switch 18 is closed, the electronic power converter 14 may output power to the AC utility grid 20 for powering various devices (not shown) electrically connected thereto or for using the AC utility grid 20 to power the load 16 when the output of the electronic power converter 14 is insufficient.

Energy storage may be used for providing reliability to the system 10. As shown in FIG. 2, the prior-art system 10 in this example further comprises an energy storage 22 such as a battery assembly connecting to the load 16 and the AC utility grid 20 via another electronic power converter 24. With the use of the battery assembly 22, the system 10 may compensate for the intermittent nature of the solar-energy output from the PV panel 12 and improve the system reliability.

FIG. 3 shows a prior-art solar-energy harvesting system 10 similar to that shown in FIG. 2 but connected to a load 16 and a Direct-Current (DC) utility grid 26 instead of the AC utility grid 20.

The prior-art solar-energy harvesting systems have disadvantages and/or challenges such as:

Unreliability in solar-energy generation due to the intermittency of sunlight.

There is a wide range of variations in the operating points (e.g., voltage, current, and/or the like) of solar energy harvesting systems as the solar irradiance varies during the day, which significantly degrades the overall efficiency of the system.

The system usually requires a utility power grid in order to provide resiliency for the system, i.e., requiring the utility power grid for providing power to various loads when solar energy is insufficient or unavailable.

Due to these disadvantages and/or challenges, prior-art solar-energy harvesting systems may not provide an optimal solution for many emerging applications such as solar tiles, solar chargers, and the like. Thus, prior-art solar-energy harvesting systems with suboptimal or even non-optimized performances would adversely impact the otherwise fast growth of solar-energy systems. Therefore, there is a desire for a reliable solar-energy harvesting solution.

An electronic device usually employs at least two electrodes including a cathode and an anode for electrical connection with other devices, applying voltage to the device, or collecting current therefrom, depending on the application thereof. Some small-size devices such as photovoltaics and light emitting diodes (LEDs) require a thin layer of metal as the cathode and a conductive, transparent metal oxide as the anode. In a typical fabrication process of such devices, a layer of indium-tin-oxide (ITO) is the first layer of composition deposited as the anode typically by magneton sputtering or other thermal methods. The top electrode can also be transparent, depending on the application. Other layers of compositions are then deposited, coated, or otherwise coupled to the ITO layer as needed with the last layer being the cathode layer.

For example, FIGS. 4 and 5 are schematic diagrams showing the simplest single-layer structures of some prior-art photovoltaic and organic LED (OLED) devices. As shown in FIG. 4, a prior-art photovoltaic device 40 may comprise an anode layer 44 deposited onto a substrate 42 followed by an active layer 46 and a cathode layer 48. As shown in FIG. 5, an OLED device 60 may comprise an anode layer 64 deposited onto a substrate 62 followed by a hole injection/transport layer 66, an active layer 68, an electron injection layer 70, and a metallic cathode layer 72.

In prior art, various deposition methods such as thermal evaporation, radio-frequency (RF) sputtering, DC sputtering, and/or the like may be used in fabrication of these devices for depositing a thin film of metal such as silver or aluminum as the cathode layer on top of a previous layer such as an active layer.

FIG. 6 shows the prior-art thermal-evaporation device 80 widely used for small-scale fabrication of electronic devices. As shown, the prior-art thermal-evaporation device 80 comprises a vacuum chamber 82 receiving a heater 84 in a lower portion thereof and a sample holder 86 in an upper portion thereof. The sample holder 86 comprises a window 88.

A substrate 90 is placed on the sample holder 86 exposing to the window 88. The heater 84 heats a pure metal 92 thereon to evaporate the metal 92 into a gas phase which flows upwardly as indicated by the arrow 94 through the window 88 of the sample holder 86 and deposits onto the substrate 90 to form a metallic cathode layer. The prior-art thermal-evaporation device 80 may also comprise a vacuum gauge 96 for monitoring the level of vacuum in the vacuum chamber 82, and a gas inlet 98 for introducing an ambient gas (not shown) such as $O_2$, $N_2$, or the like for promoting surface reactions or maintaining film stoichiometry.

Conventional deposition methods generally require a high level of vacuum which may cause significant burden to large-scale fabrication of electronic devices. Moreover, above-listed conventional deposition methods also have other disadvantages such as:

(1) long operation-time,
(2) causing damages to previous layers due to the bombardment of metal particles during deposition of the current layer, and
(3) expensive procedure.

Due to above-described disadvantages, the conventional deposition methods may not provide an optimal solution for large-scale fabrication of electronic devices. Therefore, there is a desire for solution processing techniques with improved performance.

SUMMARY

Embodiments of this disclosure relate to a hybrid-energy apparatus or module that integrates solar cells, battery cells, and in some embodiments electronic circuits in an efficient and reliable manner, resulting in a reliable energy apparatus or module with high efficiency.

According to one aspect of this disclosure, there is provided a multi-layer apparatus has a transparent or semi-transparent substrate, a solar-cell layer coupled to the substrate, an energy-storage layer coupled to the solar-cell layer, and a converter layer coupled to the energy-storage layer. The solar-cell layer has a plurality of solar cells for receiving light through the substrate and converting energy of the received light to a first electrical energy, the energy-storage layer has one or more energy-storage units for storing a second electrical energy, and the converter layer has one or more power converters electrically connected to the solar-cell layer and the energy-storage layer for receiving the first electrical energy and the second electrical energy therefrom and outputting a third electrical energy through an output thereof.

In some embodiments, the substrate may comprise a layer of glass.

In some embodiments, the substrate may comprise a flexible, transparent, or semi-transparent material such as a transparent or semi-transparent plastic material such as polyethylene terephthalate (PET, also denoted as poly(ethylene terephthalate)), poly(ether sulfones) (PES), polyethylene naphthalene (PEN), polyimide (PI), and/or the like.

In some embodiments, the solar-cell layer may be an inverted organic photovoltaic (OPV) structure, comprising a plurality of sublayers such as, named starting from the substrate, a sublayer of Indium Tin Oxide (ITO) deposited or otherwise coupled to the substrate and acting as an anode, a sublayer of Zinc Oxide (ZnO), a sublayer of poly(ethylenimine) and poly(ethylenimine) ethoxylated (i.e., PEIE), a sublayer of organic bulk heterojunctions (BHJs) (i.e. a blend of p-type and n-type conjugated polymers), a sublayer of Molybdenum trioxide ($MoO_3$), and a sublayer of silver (Ag) or Aluminum (Al) as the cathode.

In some embodiments, the energy-storage layer comprises one or more semiconductor capacitors.

In some embodiments, each semiconductor capacitor comprise a plurality of Gallium Arsenide (GaAs)/Aluminum Gallium Arsenide (AlGaAs) sublayers, such as n AlGaAs layers (n>0 is an integer) and (n+1) GaAs layers with each AlGaAs layer sandwiched between two neighboring GaAs layers.

In some embodiments, the converter layer comprises a multi-input electronic power converter having a solar-input converter, a battery-input converter, and an output converter.

In some embodiments, any of the solar-input converter, battery-input converter, and output converter may comprise coils winding about a ferromagnetic or ferrimagnetic core.

In some embodiments, any of the solar-input converter, battery-input converter, and output converter may have a structure of at least three layers including a core layer made of a ferrite material and sandwiched between two wiring layers. Each wiring layer comprises electrically conductive wirings on a base and the wirings of the two wiring layers are interconnected through vias or holes thereon to form the coils winding about the ferrite core.

According to one aspect of this disclosure, there is provided a hybrid power system comprising: a solar module having a plurality of solar cells, the solar module electrically coupled to a first circuitry having one or more first semiconductors for converting the output of the solar module to a first Alternating-Current (AC) current; an energy-storage module coupled to a second circuitry having one or more second semiconductors for converting the output of the energy-storage module to a second AC current; an output module coupled to a third circuitry having one or more third semiconductors for outputting an electrical power; a transformer coupling the first and second circuitries to the third circuitry; and a control module for optimizing the output electrical power by adjusting signals applied to gate terminals of the first, second, and third semiconductors based on at least an output voltage of the solar module, an output voltage of the energy-storage module, an output current of the first circuitry, an output current of the second circuitry, an input current of the third circuitry, and an output voltage of the output electrical power.

According to one aspect of this disclosure, there is provided a power circuitry comprising: a first input circuit for coupling to a photovoltaic (PV) source; a second input circuit for coupling to an energy-storage source; a third circuit coupled to the first and second input circuits for processing and outputting electrical energy received from at least one of the first and second circuits; and a control circuit coupled to the first, second, and third circuits for optimizing the output of the third circuit by controlling power flow therebetween based on output voltages of the PV and energy-storage sources, outputs of the first and second input circuits coupling to the third circuits, and an output voltage of the third circuit.

In some embodiments, the third circuit is coupled to the first and second input circuits via a transformer with the first and second input circuits on an input side of the transformer and the third circuit on an output side of the transformer.

In some embodiments, each of the first, second, and third circuits comprises one or more semiconductors for power conversion.

In some embodiments, the control circuit is configured for optimizing the output of the third circuit by adjusting gate signals applied to gate terminals of the semiconductors of the first, second, and third circuits based on the output voltages of the PV and energy-storage sources, the outputs of the first and second input circuits coupling to the third circuits, and the output voltage of the third circuit.

In some embodiments, the outputs of the first and second input circuits are output currents of the first and second input circuits; and the power circuitry further comprises one or more current sensors for sensing the output currents of the first and second input circuits.

In some embodiments, the control circuit is configured for optimizing the output of the third circuit further based on at least one of output currents of the PV and energy-storage sources, and an input current of the third circuit.

In some embodiments, the output of the third circuit is a direct-current (DC) output; the power circuitry further comprises a DC-to-AC inverter circuit coupled to the third circuit for converting the DC output of the third circuit to an alternate-current (AC) output; and the control circuit is configured for optimizing the output of the DC-to-AC inverter circuit based on the output voltages of the PV and energy-storage sources, the output currents of the first and second input circuits coupling to the third circuits, the output voltage of the third circuit, an output voltage of the DC-to-AC inverter circuit, and an output current of the DC-to-AC inverter circuit.

In some embodiments, the outputs of the first and second input circuits are output voltages of the first and second input circuits; and the power circuitry further comprises one or more current estimators for estimating the output currents of the first and second input circuits based on the output voltages of the PV source, the energy-storage source, and the third circuit, and the gate signals of the semiconductors of the first, second, and third circuits.

In some embodiments, the one or more semiconductors of at least one of the first, second, and third circuits are gallium nitride (GaN) gates; and the power circuitry further comprises a GaN gate-driver circuit for preventing the GaN gates from shoot-through, the GaN gate-driver circuit comprising a level-shifter circuit.

In some embodiments, the level-shifter circuit comprises a Zener diode and a capacitor coupled in parallel and connected to a resistor in series.

In some embodiments, the third circuit comprises a parallel inductor on the output side of the transformer for compensating for parasitic capacitances.

According to one aspect of this disclosure, there is provided an energy apparatus comprising: a transparent or semi-transparent substrate; a solar-cell layer coupled to the substrate, the solar-cell layer comprising a plurality of solar cells for receiving light through the substrate and converting energy of the received light to a first electrical energy; an energy-storage layer coupled to the solar-cell layer, the energy-storage layer comprising one or more energy-storage units for storing a second electrical energy; and a converter layer coupled to the solar-cell layer and the energy-storage layer for receiving and processing electrical energy therefrom and outputting the processed energy via an output; the converter layer comprises the above-described power circuitry and using the solar-cell and energy-storage layers as the PV and energy-storage sources, respectively.

According to one aspect of this disclosure, there is provided a thermoelectric recycling structure comprising: a heat-conductive first component for engaging a heat source for receiving heat generated therefrom; a second component spaced from the first component; and a heat-nonconductive and electrons-and-holes-transportive thermoelectric layer sandwiched between the first and second components for receiving the heat from the first component and converting the received heat to electrical power.

In some embodiments, the thermoelectric recycling structure further comprises: a light-harvesting layer coupled to the first component one an opposite side of the thermoelectric layer for engaging the first component with the heat source therethrough, the light-harvesting layer comprising: a metasurface for harvesting light; and a nano-wire layer coupled to the metasurface for converting the harvested lighted to converted heat and transferring the converted heat to the thermoelectric layer.

In some embodiments, the thermoelectric layer comprises one or more thermoelectric components made of one or more two-dimensional (2D) materials.

In some embodiments, the one or more 2D materials comprises 2D perovskite.

In some embodiments, the one or more thermoelectric components comprise a continuous thermoelectric sheet made of the one or more 2D materials.

In some embodiments, the thermoelectric layer comprises a plurality of the thermoelectric components separated from each other.

In some embodiments, the thermoelectric layer comprises a plurality of electrically conductive nano-channels having one or more subwavelength dimensions thereof.

In some embodiments, the thermoelectric layer has a thickness of about 10 nanometers (nm).

According to one aspect of this disclosure, there is provided an energy apparatus comprising: a transparent or semi-transparent substrate; a solar-cell layer coupled to the substrate, the solar-cell layer comprising a plurality of solar cells for receiving light through the substrate and converting energy of the received light to a first electrical energy; an energy-storage layer coupled to the solar-cell layer, the energy-storage layer comprising one or more energy-storage units for storing a second electrical energy; a converter layer coupled to the solar-cell layer and the energy-storage layer for receiving and processing electrical energy therefrom and outputting the processed energy via an output; and at least one of the thermoelectric recycling structure according to claims 13 to 20, coupled to at least one of the solar-cell layer and the converter layer for receiving the heat generated therefrom.

According to one aspect of this disclosure, there is provided a supercapacitor comprising: one or more capacitor layers; and a first and a second electrical terminals; each capacitor layer comprises: a pair of electrically conductive thin-film sublayers sandwiching electrically insulating membrane sublayer, a conductive medium between the each of the thin-film sublayers and the membrane sublayer, and a first and a second conductor sublayers sandwiching the pair of thin-film sublayers and the membrane sublayer, the first conductor sublayer coupled to the first electrical terminal and the second conductor sublayer coupled to the second electrical terminal.

In some embodiments, the thin-film sublayers comprise at least one of activated carbon, graphene, and graphite.

In some embodiments, the conductive medium comprises at least one of ionic liquid, conductive ink, and current collector.

In some embodiments, the conductive medium is coated onto the membrane sublayer.

In some embodiments, the ionic liquid comprises 1-Ethyl-3-methylimidazolium tetrafluoroborate (EMIMBF4).

In some embodiments, the conductive thin-film sublayers, the membrane sublayer, and the first and second conductor sublayers are flexible.

In some embodiments, the conductive thin-film sublayers and the first and second conductor sublayers are coated to the membrane sublayer using at least one of slot-die coating, spray coating printing, and doctor blade.

According to one aspect of this disclosure, there is provided an energy apparatus comprising: a transparent or semi-transparent substrate; a solar-cell layer coupled to the substrate, the solar-cell layer comprising a plurality of solar cells for receiving light through the substrate and converting energy of the received light to a first electrical energy; an energy-storage layer coupled to the solar-cell layer, the energy-storage layer comprising one or more energy-storage units for storing a second electrical energy; a converter layer coupled to the solar-cell layer and the energy-storage layer for receiving and processing electrical energy therefrom and outputting the processed energy via an output; the energy-storage layer comprises one or more above-described supercapacitors.

BRIEF DESCRIPTION OF THE DRAWINGS

The embodiments of the present disclosure will now be described with reference to the following figures in which identical reference numerals in different figures indicate identical elements, and in which.

DETAILED DESCRIPTION

Solar-Energy Harvesting System Overview

Figure 1:
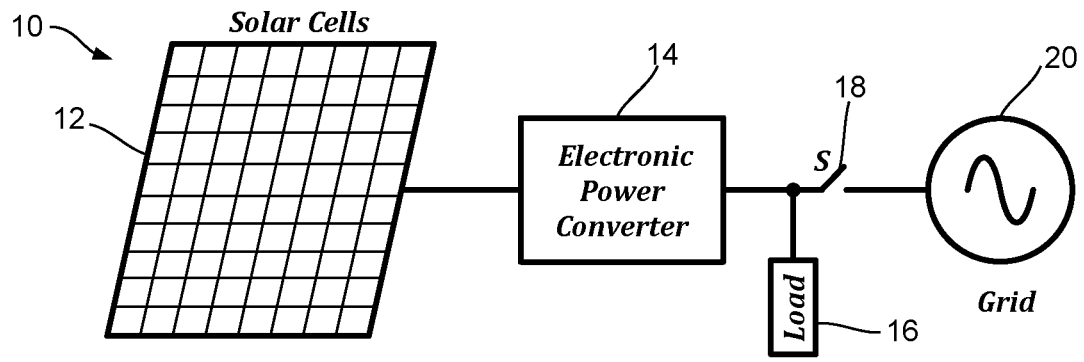
FIG. 1 is a schematic diagram showing a prior-art solar-energy harvesting system connecting to a load and/or an Alternating-Current (AC) utility grid, the solar-energy harvesting system having a solar panel for harvesting solar energy.
Figure 2:
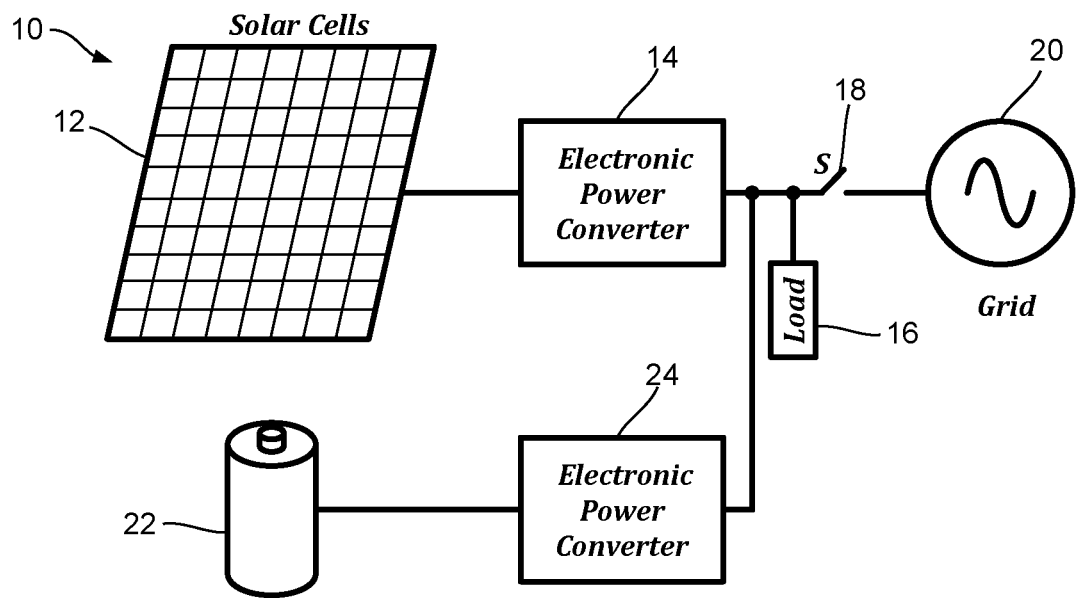
FIG. 2 is a schematic diagram showing a prior-art solar-energy harvesting system connecting to a load and/or connecting to an AC utility grid, the solar-energy harvesting system having a solar panel and an energy storage.
Figure 3:
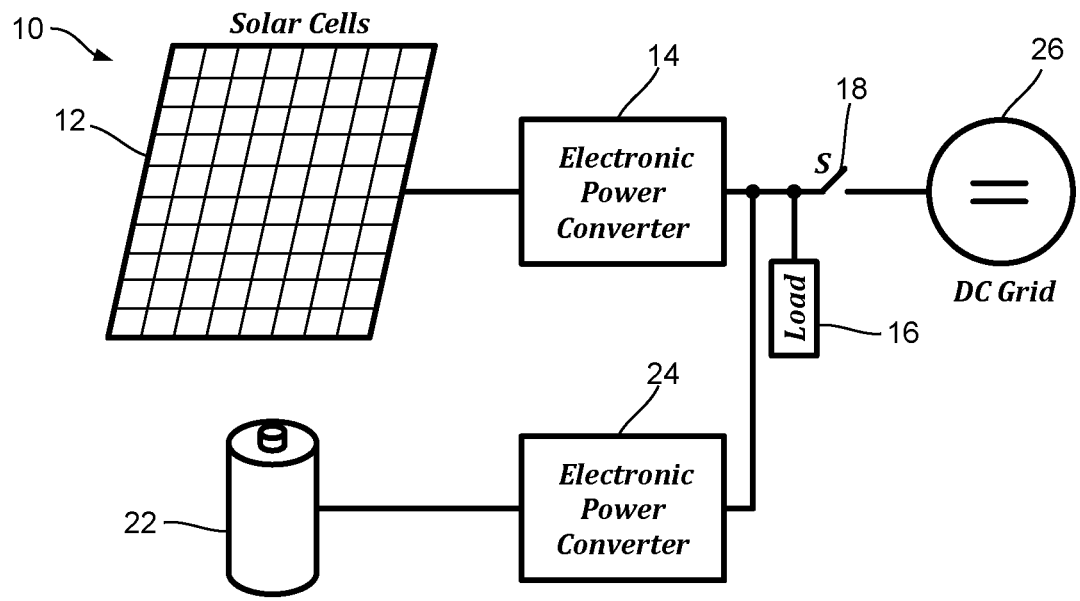
FIG. 3 is a schematic diagram showing a prior-art solar-energy harvesting system connecting to a load and/or a Direct-Current (DC) utility grid, the solar-energy harvesting system having a solar panel and an energy storage.
Figure 4:
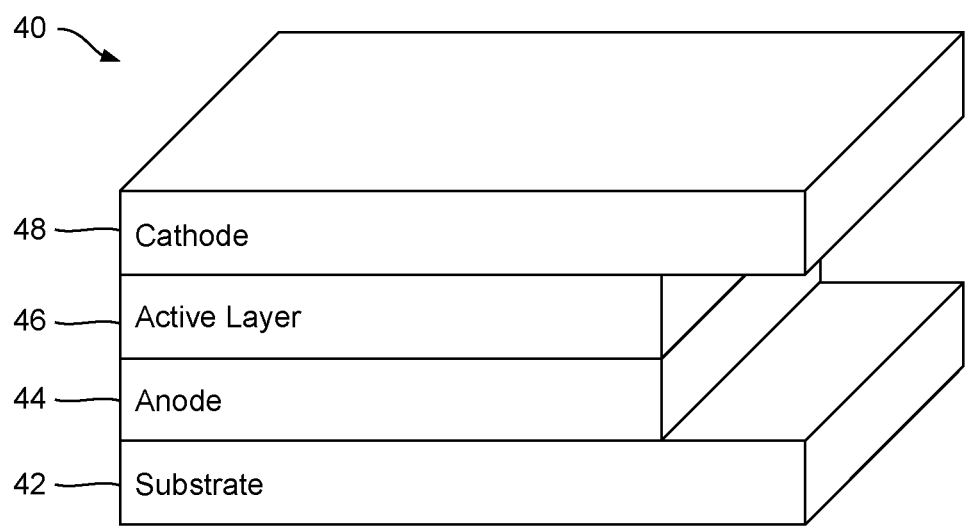
FIG. 4 is a schematic diagram showing a prior-art photovoltaic device having a metallic cathode layer.
Figure 5:
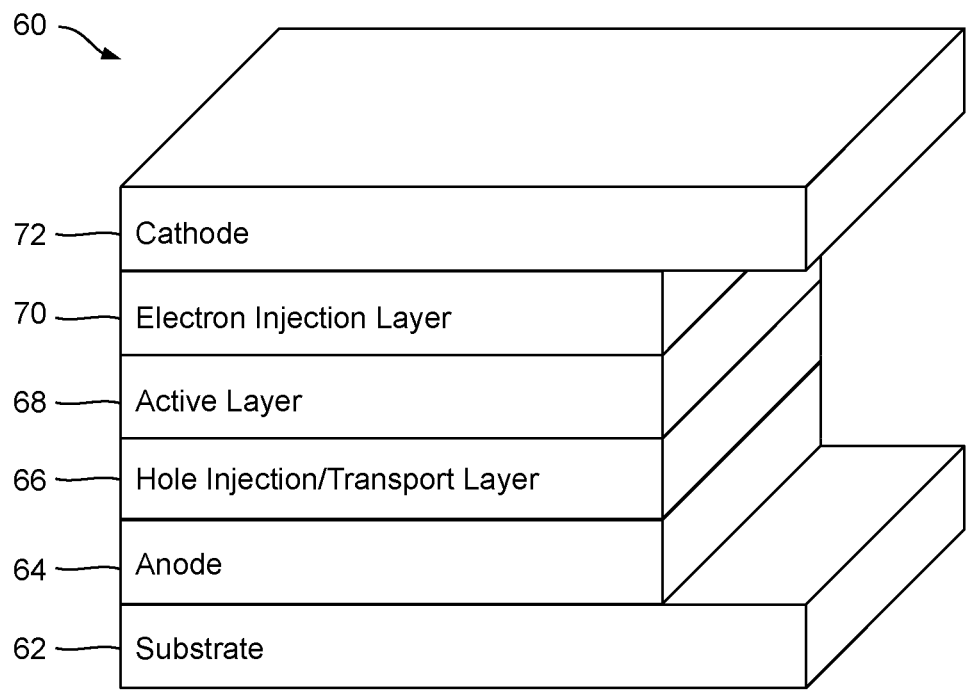
FIG. 5 is a schematic diagram showing a prior-art solar cell or light emitting device (LED) having a metallic cathode layer.
Figure 6:
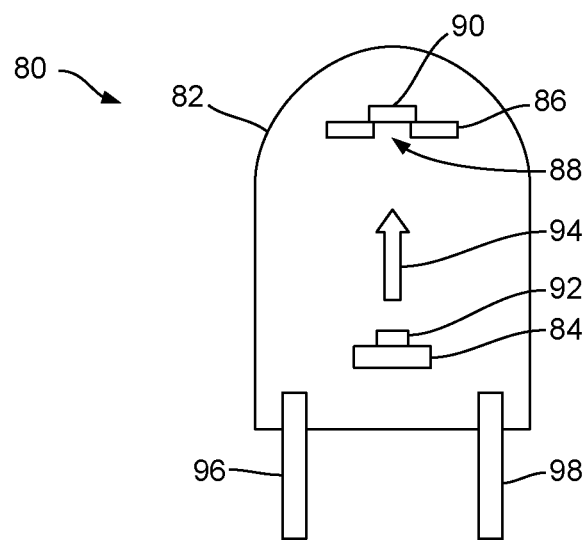
FIG. 6 is a schematic diagram showing a prior-art thermal-evaporation device for small-scale fabrication of electronic devices.
Figure 7:
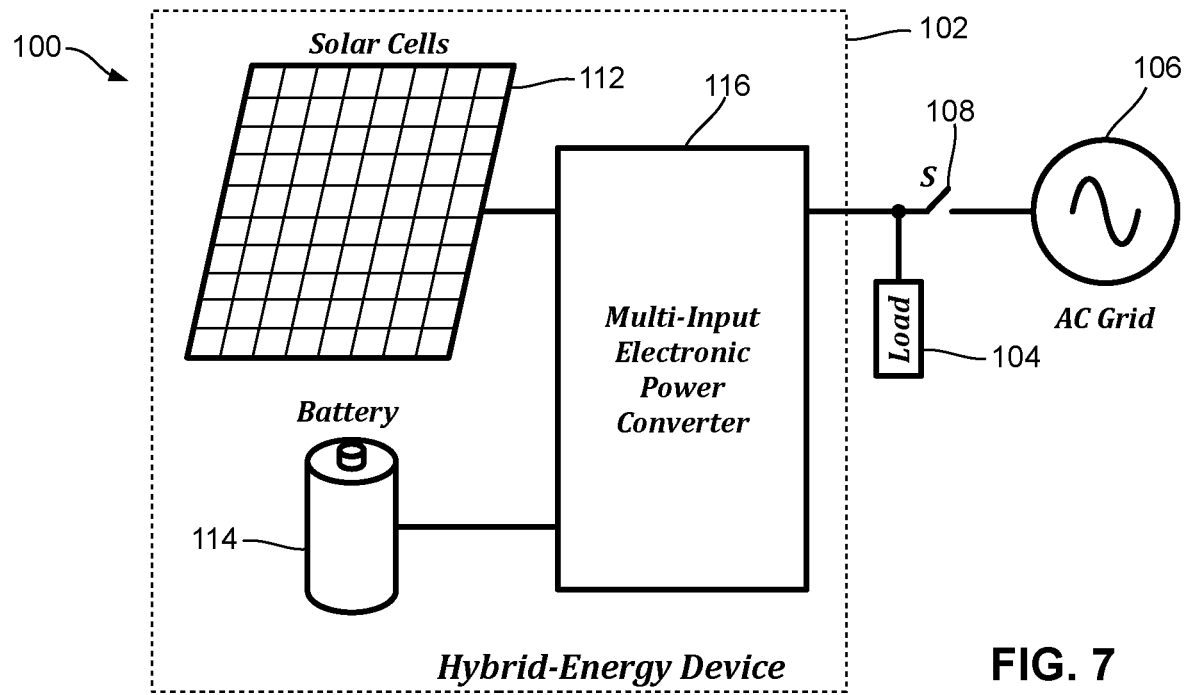
FIG. 7 shows a solar-energy harvesting system having a hybrid-energy device and connecting to a load and/or an AC utility grid, according to some embodiments of this disclosure.

Turning now to FIG. 7, a solar-energy harvesting system according to some embodiments of this disclosure is shown and is generally identified using reference numeral 100. As shown, the solar-energy harvesting system 100 comprises a hybrid-energy device 102 for powering a load 104.

The hybrid-energy device 102 is also connected to an Alternating-Current (AC) utility grid 106 through a switch 108. Therefore, when the switch 108 is closed, the hybrid-energy device 102 may output power to the AC utility grid 106 for powering various devices (not shown) electrically connected thereto or for using the AC utility grid 106 to power the load 104 when the output of the hybrid-energy device 102 is insufficient.

The hybrid-energy device 102 in these embodiments comprises a solar panel 112 such as a photovoltaic (PV) panel having a plurality of solar cells for harvesting solar energy and acting as a first energy source and comprises an energy storage 114 as a second energy source. The solar panel 112 and the energy storage 114 output electrical power to a multi-input electronic-power converter 116. The multi-input electronic-power converter 116 converts the received electrical power to a suitable form (e.g., having suitable voltage, current, frequency, and/or the like) for powering the load 104 and/or outputting to the AC utility grid 106, and uses the output of the solar panel 112 to charge the energy storage 114. Moreover, the multi-input electronic-power converter 116 controls the power flow between different components.

Figure 8:
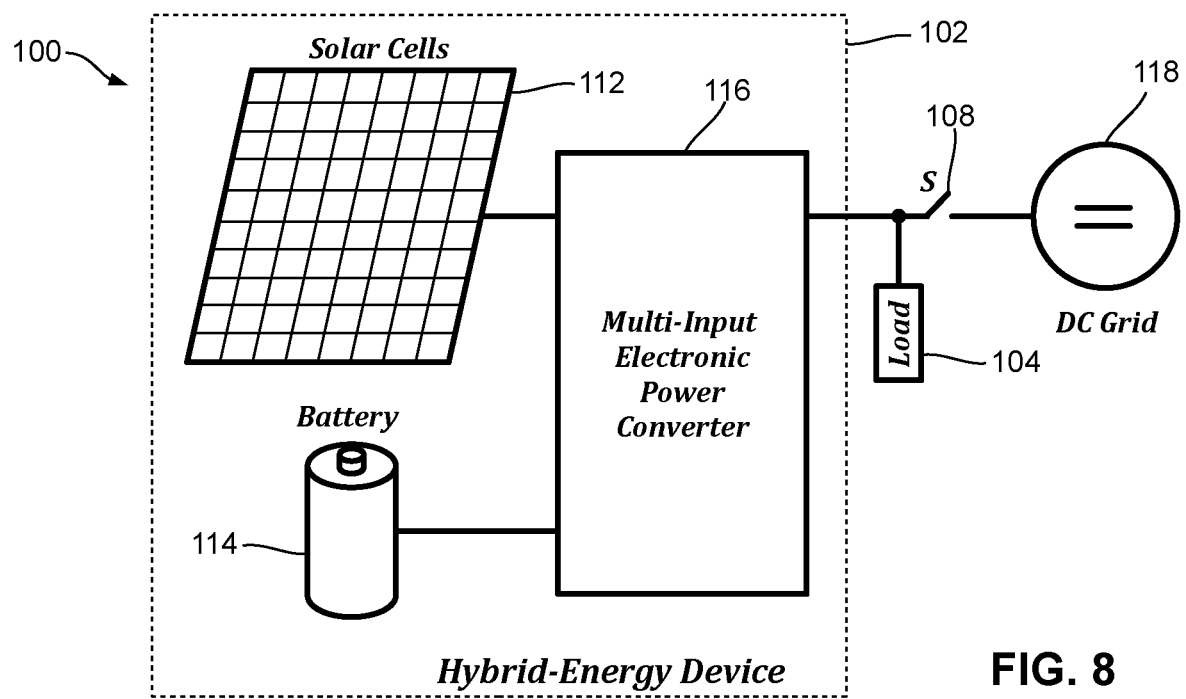
FIG. 8 shows a solar-energy harvesting system having a hybrid-energy device and connecting to a load and/or a DC utility grid, according to some embodiments of this disclosure.

FIG. 8 shows a solar-energy harvesting system 100 according to some embodiments of this disclosure. The solar-energy harvesting system 100 in these embodiments is similar to that shown in FIG. 7 except that the hybrid-energy device 102 is connected to a Direct-Current (DC) utility grid 118. The multi-input electronic-power converter 116 also controls the power flow between different components.

In the embodiments shown in FIGS. 7 and 8, the hybrid-energy device 102 including the solar cells 112, energy storage 114, and multi-input electronic-power converter 116, is an integrated device printed, deposited, or otherwise coupled to a substrate and may have different implementations in different embodiments.

Figure 9A:
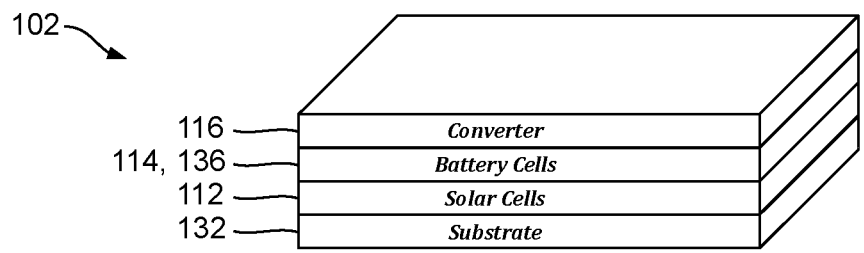
FIG. 9A is a schematic diagram showing the physical structure of the hybrid-energy device of the solar-energy harvesting system shown in FIGS. 7 and 8, according to some embodiments of this disclosure, wherein the hybrid-energy device comprises a layer of battery cells as the energy storage.
Figure 9B:
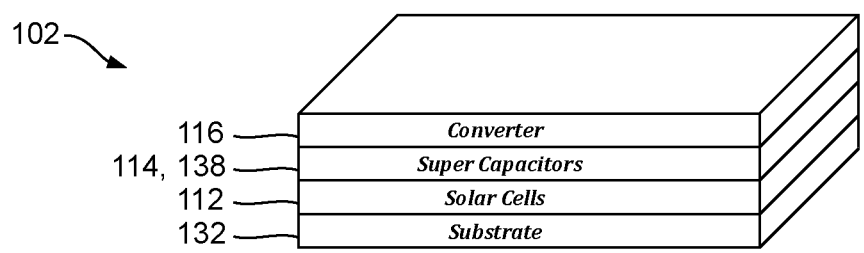
FIG. 9B is a schematic diagram showing the physical structure of the hybrid-energy device of the solar-energy harvesting system shown in FIGS. 7 and 8, according to some embodiments of this disclosure, wherein the hybrid-energy device comprises a layer of supercapacitors as the energy storage.

FIGS. 9A and 9B are schematic diagrams showing the physical structures of the hybrid-energy device 102 with various energy storages 114 in different embodiments.

In the embodiments shown in FIG. 9A, the hybrid-energy device 102 comprises a substrate 132 made of one or more suitable transparent or semi-transparent materials such as glass, transparent or semi-transparent plastic, transparent or semi-transparent polymer, and/or the like. A layer of solar cells 134 are printed, deposited, or otherwise coupled to the substrate 132. Thus, the transparent substrate 132 allows the solar cells 112 to expose to ambient or incident light and provides support and protection to the solar-cell layer 112 and other layers thereabove.

In these embodiments, the energy storage 114 comprises a layer of battery cells 136 printed, deposited, or otherwise coupled to the layer of solar cells 112. A layer of circuitry of the multi-input electronic-power converter 116 coupled to the layer of battery cells 136. The layers of solar cells 112, battery cells 136, and multi-input electronic-power converter 116 are electrically connected (not shown) in accordance with FIG. 7 or 8.

The hybrid-energy device 102 in the embodiments shown in FIG. 9B is similar to that shown in FIG. 9A except that in these embodiments, the energy storage 114 comprise one or more capacitors 138 or supercapacitors (i.e., capacitors with large capacitances).

Figure 10:
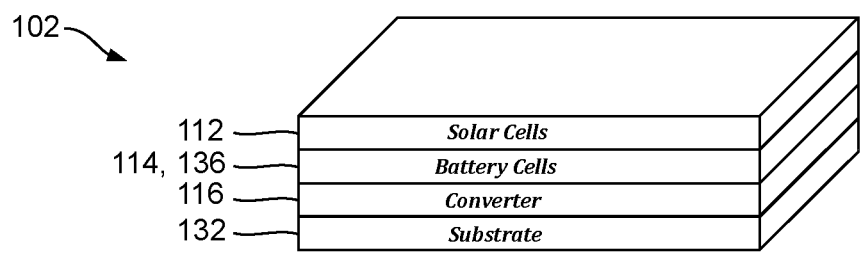
FIG. 10 is a schematic diagram showing the physical structure of the hybrid-energy device of the solar-energy harvesting system shown in FIGS. 7 and 8, according to some embodiments of this disclosure.

In the embodiments shown in FIGS. 9A and 9B, the solar cells 112 is coated onto the substrate 132 followed by the energy-storage layer 114 (being the battery cells 136 or supercapacitors 138) and the converter layer 116. In some embodiments as shown in FIG. 10, the order of the layers may be the substrate 132, the converter 116, the energy-storage layer 114 (being the battery cells 136 in the example shown in FIG. 10), and the solar-cell layer 112.

In these embodiments, the substrate 132 may comprise a flexible substance such as PET. A layer of UV-curable epoxy may be applied on top of the substrate 132 for protection.

Figure 11A:
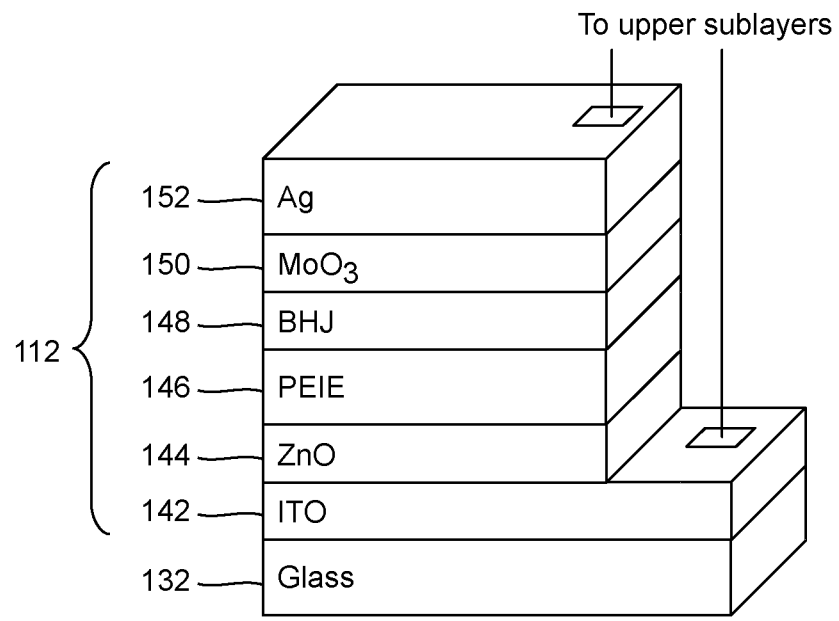
FIG. 11A is a schematic diagram showing the solar-cell layer and a substrate of the hybrid-energy device shown in FIGS. 9A and 9B, according to some embodiments of this disclosure, wherein the substrate is made of glass.

FIG. 11A is a schematic diagram showing the solar-cell layer 112 on a substrate 132 made of glass. As shown, the solar-cell layer 112 comprises a plurality of sublayers such as, naming from the substrate 132, an anode sublayer 142 made of suitable material such as Indium Tin Oxide (ITO) deposited or otherwise coupled onto the substrate 132, a sublayer of Zinc Oxide (ZnO) 144, a sublayer of poly (ethylenimine) and poly(ethylenimine) ethoxylated (i.e., PEIE) 146, a sublayer of organic solar-cells 148 such as a sublayer of polymer solar-cells such as a sublayer of bulk heterojunctions (BHJs), a sublayer of Molybdenum trioxide ($MoO_3$) 150, and a cathode sublayer 152 made of suitable material such as silver (Ag) or Aluminum (Al). The anode 142 and the cathode 152 are electrically connected to upper layers such as the energy-storage layer 114 (i.e., the battery-cell layer 136 or the supercapacitor layer 138) and/or the integrated-converter layer 116.

Figure 11B:
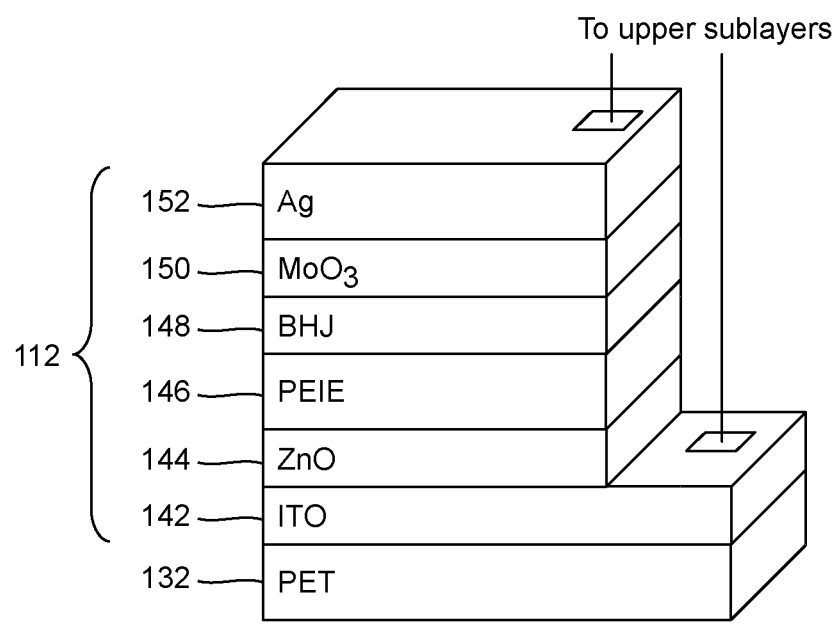
FIG. 11B is a schematic diagram showing the solar-cell layer and a substrate of the hybrid-energy device shown in FIGS. 9A and 9B, according to some embodiments of this disclosure, wherein the substrate is made of transparent or semi-transparent plastic.

FIG. 11B is a schematic diagram showing the solar-cell layer 112 on a substrate 132 made of a flexible, transparent or semi-transparent material such as a transparent or semi-transparent plastic material such as polyethylene terephthalate (PET, also denoted as poly(ethylene terephthalate)), poly(ether sulfones) (PES), polyethylene naphthalene (PEN), polyimide (PI), and/or the like. The solar-cell layer 112 is the same as that shown in FIG. 11A.

The glass substrate leads to solar cells of rigid structures, whereas the plastic substrate results in a flexible solar-cell structure. Those skilled in the art will appreciate that the plastic substrate provide many advantages such as:

1) ease of use in large-scale fabrication techniques such as roll-to-roll coating techniques for making solar cells and stencil-printing techniques for making batteries; and 2) flexible solar-cells allowing simplified fabrication process of all layers thereof.

In some embodiments, the solar-cell layer 112, energy-storage layer 114 (i.e., battery layer 136 or capacitor layer 138), and the integrated-converter layer 116 may be printed in large scale.

Figure 12:
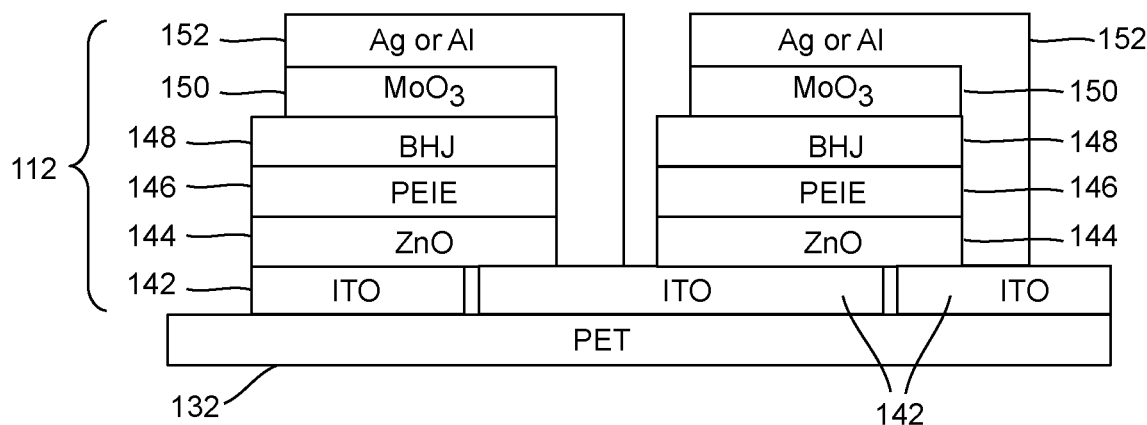
FIG. 12 is a schematic diagram showing a plurality of sublayers of the solar-cell layer shown in FIG. 11B printed in large scale on the substrate to form a plurality of solar cells.

FIG. 12 is a schematic diagram showing the above-described sublayers 142 to 152 of the solar-cell layer 112 printed in large scale on a substrate 132 to form a plurality of solar cells. First, an anode (ITO) sublayer 142 is printed onto the PET substrate 132 as a plurality of ITO blocks in a matrix form. Then, a plurality of ZnO sublayers 144 are printed on top of the ITO sublayer with each ZnO block 144 coupled to a plurality of ITO blocks 142 in neighboring rows thereby forming a parallel connection structure. Then, the PEIE, BHJ, and $MoO_3$, sublayers 146, 148, and 150 are sequentially printed as a plurality blocks on top of each other. Each set of PEIE, BHJ, and $MoO_3$ sublayers 146, 148, and 150 form a solar cell (without counting in the anode and cathode sublayers) printed on the anode sublayer 142.

The cathode (Ag or Al) sublayer 152 is finally printed onto the layers stack as a plurality of blocks with each cathode block extending to the anode layer 142 of the neighboring solar cell such that they are connected in series.

Although in above embodiments, the solar-cell layer 112 comprises a ZnO sublayer 144 and a PEIE sublayer 146, in some alternative embodiments, the solar-cell layer 112 may comprise only one of a ZnO sublayer 144 and a PEIE sublayer 146. However, the performance of the solar-cell layer 112 in these embodiments may be decreased.

Figure 13:
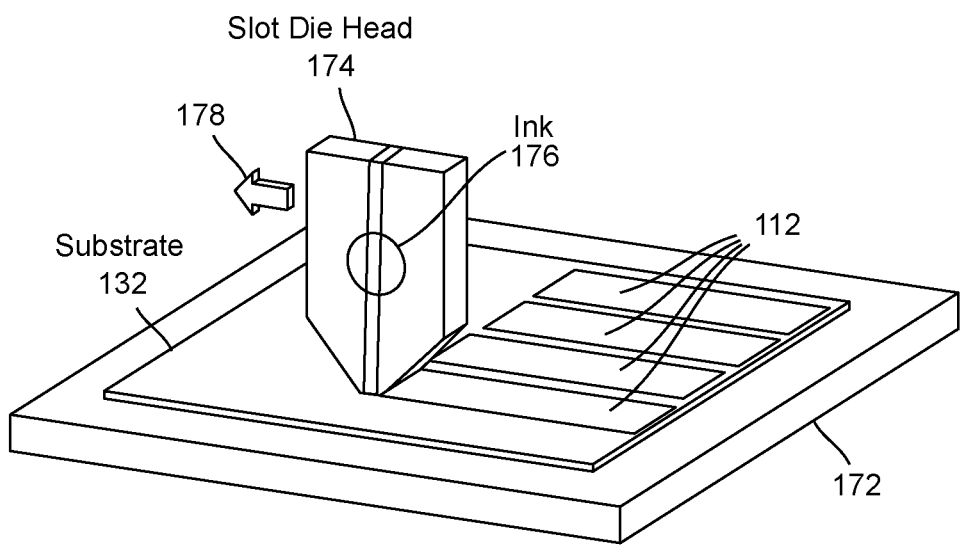
FIG. 13 is a conceptual diagram showing the printing of the solar-cell layer and the energy-storage layer of the hybrid-energy device shown in FIGS. 9A and 9B onto a substrate.

FIG. 13 is a conceptual diagram showing the printing of some sublayers such as the ZnO, PEIE, and BHJ sublayers 144, 146, and 148 of the solar-cell layers 112 onto the substrate 132. In these embodiments, the $MoO_3$ and Ag sublayers 150 and 152 are deposited by using a thermal evaporator.

As shown in FIG. 13, the substrate 132 is arranged on a flat surface of a platform 172. A printing device (not shown) with a slot-die head 174 is used for printing the sublayers/layers. The slot-die head 174 comprises an ink cartridge 176 filled with respective "ink" and moves (indicated by the arrow 178) on the substrate 132 (or a printed layer) to deposit the material from the ink cartridge 176 thereto to form solar cells 112 or energy storage cells (not shown). The solar cells 112 are first printed onto the substrate 132 and the energy-storage layer 114 (i.e., battery cells 136 or supercapacitors 138) are printed onto the solar-cell layer 112. Then, the multi-input electronic-power converter 116 (in the form of a printed circuit board) is coupled to the energy-storage layer 114.

Herein, the "ink" refers to sublayer/layer material in a suitable form such as a solution, a gel, or powder that is used as a precursor for the fabrication of sublayers/layers. For example, an ink of ZnO dissolved in butanol may be deposited by slot-die coating for forming the ZnO sublayer 144 of the solar-cell layer 112. During the slot-die fabrication of each sublayer, heat treatment is usually used for evaporating the solvent to solidify the fabricated sublayer.

Figure 14:
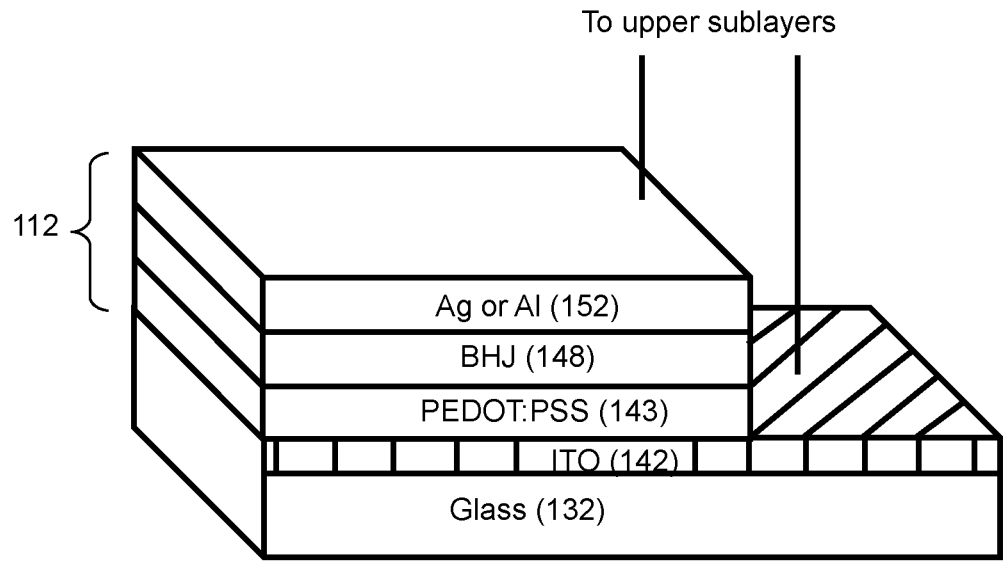
FIGS. 14 to 17 show a solar-cell layer according to various embodiments of this disclosure.

As shown in FIG. 14, in some embodiments, the solar-cell layer 112 may be a conventional OPV structure, comprising a plurality of sublayers such as, named from the substrate 132, a sublayer of ITO anode 142, a sublayer of poly(3,4-ethylenedioxythiophene) polystyrene sulfonate (PEDOT:PSS) 143, a sublayer of BHJs as the active layer 148, and Al or Ag as the cathode 152. More organic or inorganic charge transporting layers may also be inserted in this configuration for efficient exciton confinement, which would lead to improved performance.

Figure 15:
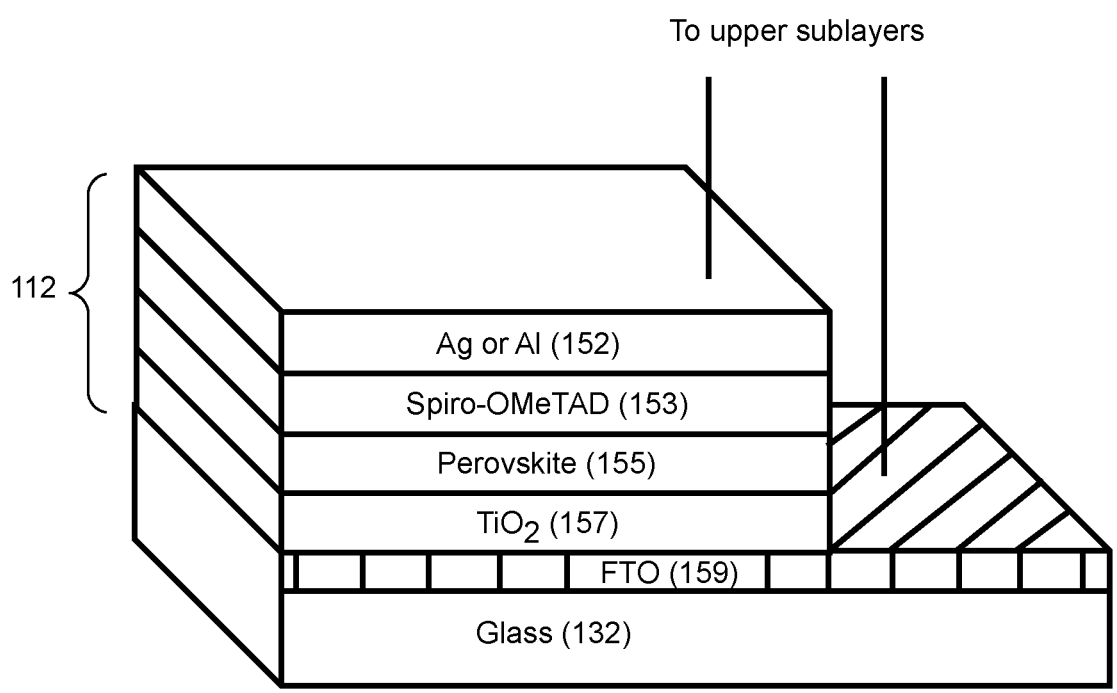

In some embodiments as shown in FIG. 15, the solar-cell layer 112 may comprise a plurality of sublayers such as, named from the substrate 132, a fluorine-doped tin Oxide (FTO) sublayer 159, an electron-transporting titanium dioxide ($TiO_2$) sublayer 157 deposited directly on the FTO-coated substrate 132, a pure 2D, a pure 3D, or a mixed 2D-3D hybrid inorganic-organic perovskite sublayer 155, a sublayer 153 of 2,2',7,7'-Tetrakis-(N,N-di-4-methoxyphenylamino)-9,9'-spirobifluorene (Spiro-OMeTAD) or any other suitable hole-transporting material which may be deposited on top of the perovskite sublayer 155, and an Ag or Al deposition forming a cathode sublayer 152.

The use of FTO has an advantage of better energy-level alignment between the work-function of FTO 159 and the conduction band of $TiO_2$.

Figure 16:
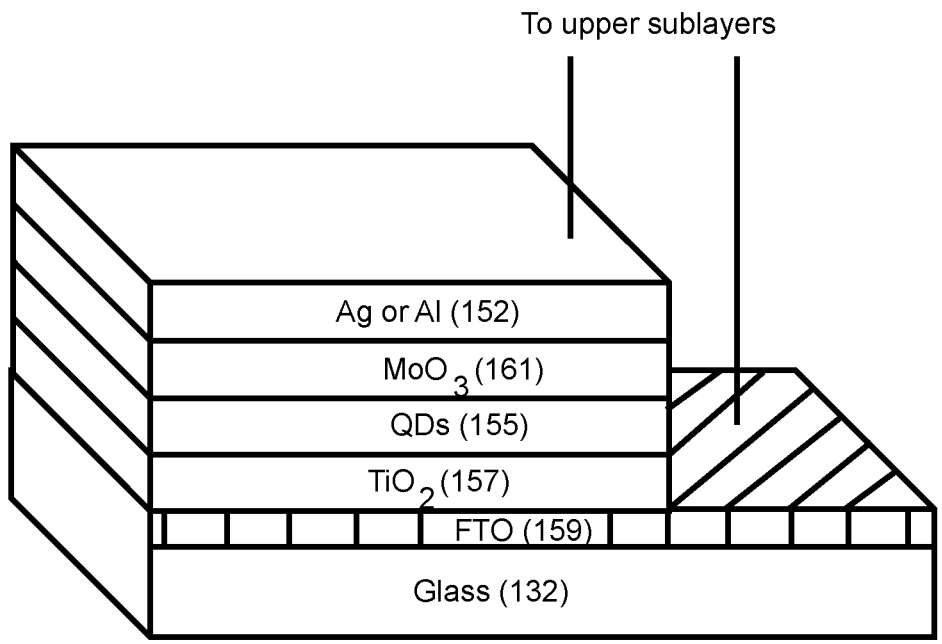

In some embodiments as shown in FIG. 16, the solar-cell layer 112 may comprise a plurality of sublayers such as, named from the substrate 132, a FTO sublayer 159, a $TiO_2$ sublayer 157, an inorganic quantum-dot (QD) layer 155, a thin $MoO_3$ sublayer 161, followed by Al, Ag, or gold (Au) electrode 152.

In these embodiments, both ITO and FTO can be used. Depending on the conduction band energy level of the QDs 155, both metal oxides (i.e., ITO and FTO) may provide a low energy barrier for efficient charge extraction from the solar cell. Either ZnO or $TiO_2$ is then deposited onto the ITO or FTO-coated substrate 132. The active layer 155 is then coated on the electron-transporting metal oxide. After that, the fabrication process is completed with depositing a thin $MoO_3$ sublayer 161 followed by Al, Ag, or gold (Au) electrode.

Figure 17:
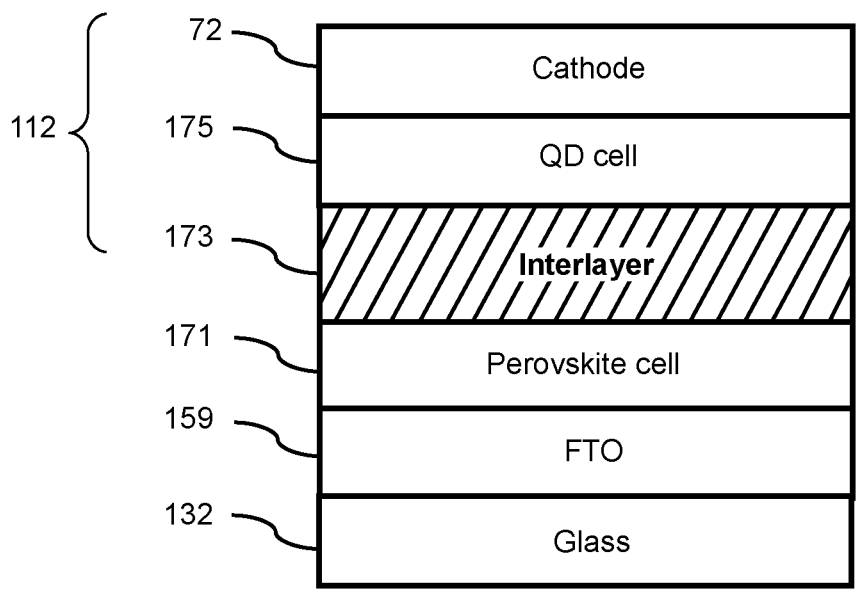

In some embodiments as shown in FIG. 17, the solar-cell layer 112 may be a tandem structure comprising a perovskite sublayer 171 coupled to a QD solar-cells layer 175 in series with an interlayer 173 sandwiched therebetween. The interlayer 173 may be any suitable organic or inorganic material. In such a configuration, one of the cells is first fabricated without depositing the top metallic electrode. The other cell is then directly fabricated on top followed by the deposition of the top electrode. Provided by effective photon harvesting capabilities of both QD and perovskite material, efficient and stable tandem solar-cells can be realized, which may then be integrated with the other components of the solar-energy harvesting system 100.

Figure 18:
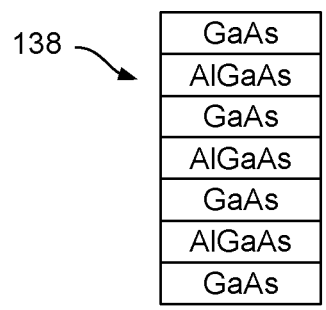
FIG. 18 shows the structure of the supercapacitor shown in FIG. 9B.

In the embodiments shown in FIG. 9B, supercapacitors 138 are used as the energy-storage layer 114. FIG. 18 shows the structure of the supercapacitor 138. As shown, the energy-storage layer 114 or supercapacitor layer 138 comprises a plurality of Gallium Arsenide (GaAs)/Aluminum Gallium Arsenide (AlGaAs) sublayers, such as n AlGaAs layers (n>0 is an integer) and (n+1) GaAs layers with each AlGaAs layer sandwiched between two neighboring GaAs layers, thereby forming a plurality of semiconductor capacitors.

Each GaAs or AlGaAs sublayer may be deposited by using suitable techniques such as DC sputtering, radio-frequency (RF) sputtering, thermal evaporation, and/or the like.

Figure 19A:
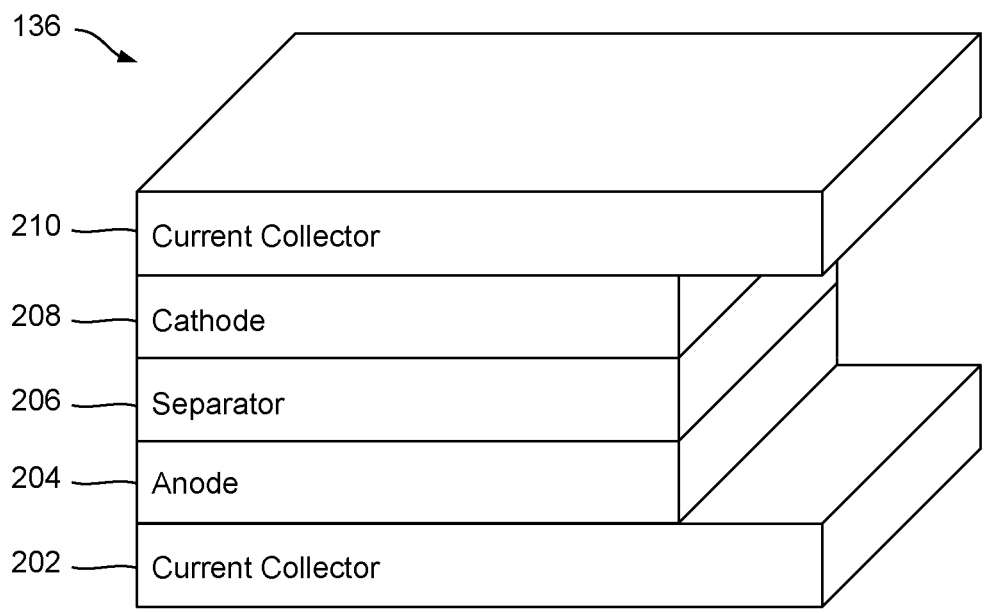
FIG. 19A is a schematic diagram showing the structure of a battery cell of the energy-storage layer of the hybrid-energy device shown in FIG. 9A.

FIG. 19A is a schematic diagram showing the structure of a battery cell 136 of the energy-storage layer 114 in the embodiments shown in FIG. 9A. As shown, the battery cell 136 comprises a plurality of sublayers including a pair of current-collector sublayers 202 and 210 coupled to an anode sublayer 204 and a cathode sublayer 208, respectively, and a separator sublayer 206 sandwiched between the anode and cathode sublayers 204 and 208.

The electrical current flows through the current-collector sublayers 202 and 210 coupled to the anode and cathode sublayer sublayers 204 and 208. The anode sublayer 204 is the negative or reducing electrode that releases electrons to the external circuit and oxidizes during and electrochemical reaction. The cathode sublayer 208 is the positive or oxidizing electrode that acquires electrons from the external circuit and is reduced during the electrochemical reaction.

The separator sublayer 206 is the medium that prevents short-circuit current between the cathode 208 and anode 204 of the battery cell 136 and also provides the ion-transport mechanism therebetween. In various embodiments, the separator sublayer 206 may comprise solid-state electrolyte and/or other suitable materials. Compared to the liquid-form electrolytes which comprise solvents dissolving salts, acids, or alkalis for ionic conduction and are usually flammable, solid-state electrolyte is safer and the resulting battery assembly may be more compact as fewer safety-monitoring and/or safety-prevention components and/or subsystems are needed. Batteries using solid-state electrolyte also provides improved energy and power densities.

Figure 19B:
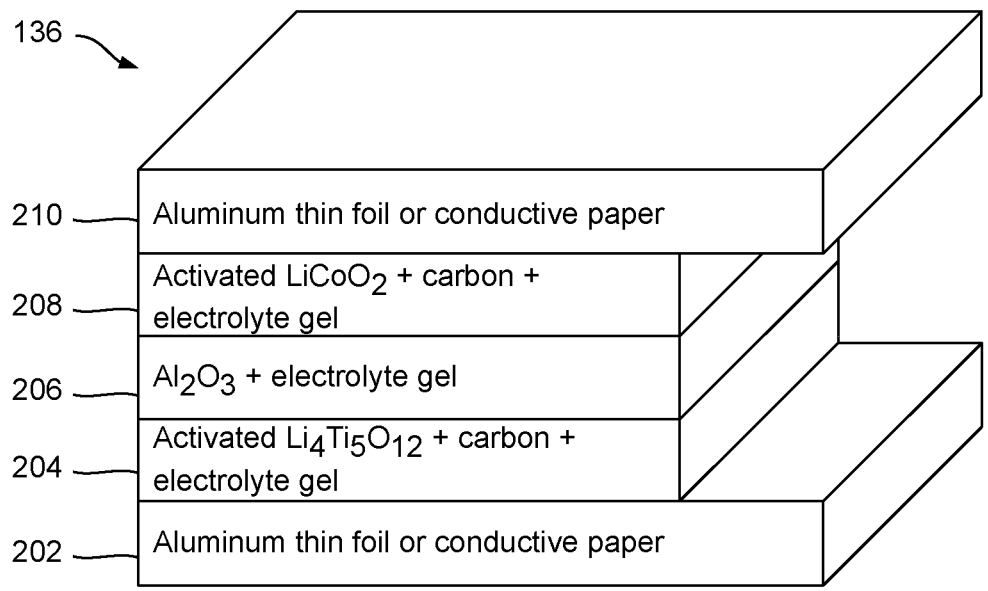
FIG. 19B is a schematic diagram showing the structure of the battery cell shown in FIG. 9A in the form of a Li-ion battery cell.

FIG. 19B is a schematic diagram showing the structure of the battery cell 136 in the form of a Li-ion battery cell. In this embodiment, each of the current-collector sublayers 202 and 210 is a thin layer of Aluminum foil or conductive paper. The anode sublayer 204 is activated $Li_4Ti_5O_{12}$ (i.e., LTO) with carbon (comprising single-walled carbon nanotubes (SWCNT) and carbon powder; described in more detail below) and an electrolyte gel which comprises a semi-interpenetrating polymer network (SIPN or semi-IPN) skeleton and Li salt (such as Lithium tetrafluoroborate ($LiBF_4$)) dissolved in Sebaconitrile. The separator sublayer 206 is formed by solid-state electrolyte which in this embodiment is $Al_2O_3$ and the above-described electrolyte gel. The cathode sublayer 208 is activated $LiCoO_2$ (i.e., Lithium Cobalt Oxide or LCO) with carbon (comprising SWCNT and carbon powder; described in more detail below) and the electrolyte gel.

The Semi-IPN skeleton is an Ultraviolet (UV) curable polymer composed of ethoxylated trimethylolpropane triacrylate (i.e., ETPTA) incorporating 1.0 weight percent (wt %) 2-hydroxy-2-methylpropiophenone (HMPP) as a photo-initiator and poly(vinylidene fluoride-co-hexafluoropropylene) (i.e., PVdF-HFP) with hexafluoropropylene (HFP) content of 6 mole percent (mol %) and ETPTA/PVdF-HFP at a ratio of 75/25 weight-by-weight (w/w). The semi-IPN skeleton acts as binder for other materials in electrodes and electrolyte.

In order to increase the conductivity of LCO and LTO, the electrode-active LCO or LTO powder (e.g., nanoparticles) is coated with SWCNT. Specifically, the LCO or LTO powder is added into a SWCNT-suspension solution (LCO/SWCNT at a ratio of 99.75/0.25 w/w, LTO/SWCNT at a ratio of 99.35/0.65 w/w) and mixed. The mixed solution is then filtered to obtain solids which are rinsed and dried to obtain the SWCNT-coated LCO (i.e., activated LCO) or SWCNT-coated LTO (i.e., activated LTO).

An electrode paste for making the cathode sublayer 208 is then formed by mixing the SWCNT-coated LCO nanoparticles with carbon black (i.e., carbon powder) and semi-IPN skeleton (at a ratio of 55/6/39 w/w/w). An electrode paste for making the anode sublayer 204 is then formed by mixing the SWCNT-coated LTO nanoparticles with carbon black (i.e., carbon powder) and semi-IPN skeleton (at a ratio of 30/7/63 w/w/w). Herein, carbon black is used to increase the conductivity of electrodes.

The solid-state-electrolyte separator sublayer 206 comprises 1 Molar (mol per liter; M) $LiBF_4$ in Sebaconitrile (SBN) and semi-IPN skeleton at a ratio of 85/15 w/w, the aggregation of which is then mixed with $Al_2O_3$ (about 300 Molar) at a ratio of 60/40 w/w. $Al_2O_3$ is used as a spacer to prevent any short-circuit of electrodes.

The battery cell 136 shown in FIG. 19B has many advantages such as being safe and flexible compared to the conventional Li-ion batteries that use liquid electrolyte. On the other hand, battery cell 136 shown in FIG. 19B also has the disadvantages of complex manufacturing (requiring multiple printing-stages) and low anode capacity, and may not be suitable for large-scale fabrication.

Figure 19C:
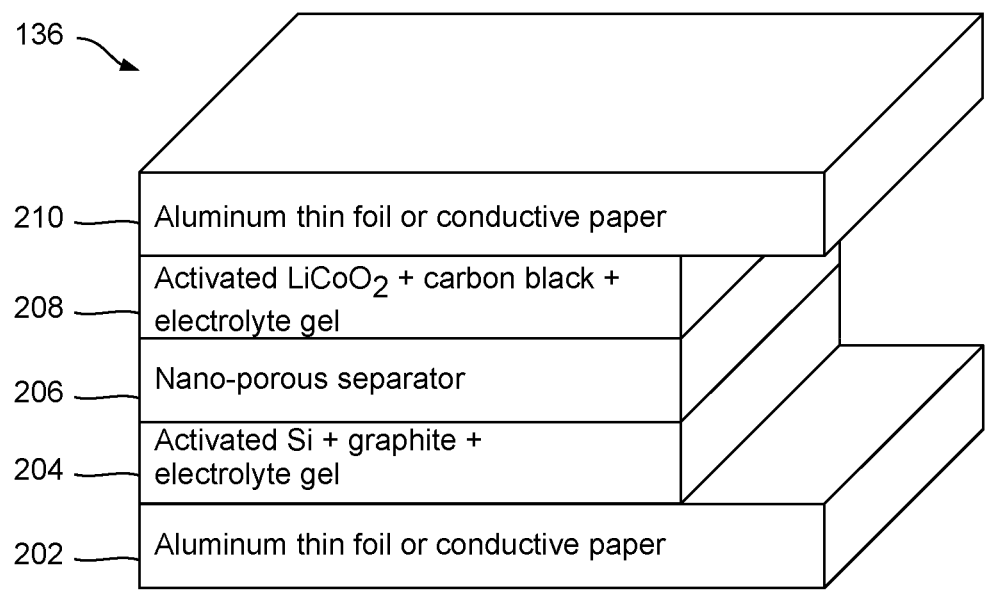
FIG. 19C is a schematic diagram showing the structure of the battery cell shown in FIG. 9A in the form of a Li-ion battery cell, according to some embodiments of this disclosure.

FIG. 19C is a schematic diagram showing the structure of the battery cell 136 in the form of a Li-ion battery cell, according to some embodiments of this disclosure. In this embodiment, each of the current-collector sublayers 202 and 210 is a thin layer of Aluminum foil or conductive paper. The anode sublayer 204 is activated Si comprising SWCNT with graphite and the above-described electrolyte gel. The separator layer 206 is a polyethylene or paper-based nano-porous material. The cathode sublayer 208 is activated LCO with carbon (comprising SWCNT and carbon powder) and the electrolyte gel.

Compared to the battery cell 136 shown in FIG. 19B that uses LTO, the use of graphite and Si in these embodiments improves the capacity of battery cell 136. Compared to using the Aluminum foil as the current-collector sublayers 202 and 210, using conductive paper may reduce the weight of the battery cell 136 and reduce the possible chemical reactions of the anode 204 and cathode 208 with the current collectors 202 and 210. Moreover, the usage of paper-based or Polypropylene-based (PP) separator makes the fabrication process inexpensive and facile, and thus the battery cell 136 in these embodiments is cost-effective for large-scale fabrications.

The Semi-IPN skeleton is a UV-curable polymer composed of ETPTA incorporating 1.0 wt % HMPP as a photo-initiator. The semi-IPN skeleton acts as a binder for other materials in electrodes and electrolyte.

In order to increase the conductivity of LCO and Si, the electrode-active LCO or Si powder (e.g., nanoparticles) is coated with SWCNT. Specifically, the LCO or Si powder is added into a SWCNT-suspension solution (LCO/SWCNT at a ratio of 99.75/0.25 w/w, Si/SWCNT at a ratio of 99.00/1.00 w/w) and mixed. The mixed solution is then filtered to obtain solids which are rinsed and dried to obtain the SWCNT-coated LCO (i.e., activated LCO) or SWCNT-coated Si (i.e., activated Si).

An electrode paste for making the cathode sublayer 208 is then formed by mixing the SWCNT-coated LCO nanoparticles with carbon black (i.e., carbon powder) and electrolyte gel (at a ratio of 55/6/39 w/w/w). An electrode paste for making the anode sublayer 204 is then formed by mixing the SWCNT-coated Si nanoparticles with graphite and electrolyte gel (at a ratio of 5/45/50 w/w/w). Herein, carbon black is used to increase the conductivity of electrodes.

The Nano-porous separator sublayer 206 comprises a nano-porous membrane such as a paper membrane, a PP or Polyethylene (PE) based membrane, or the like.

Figure 20:
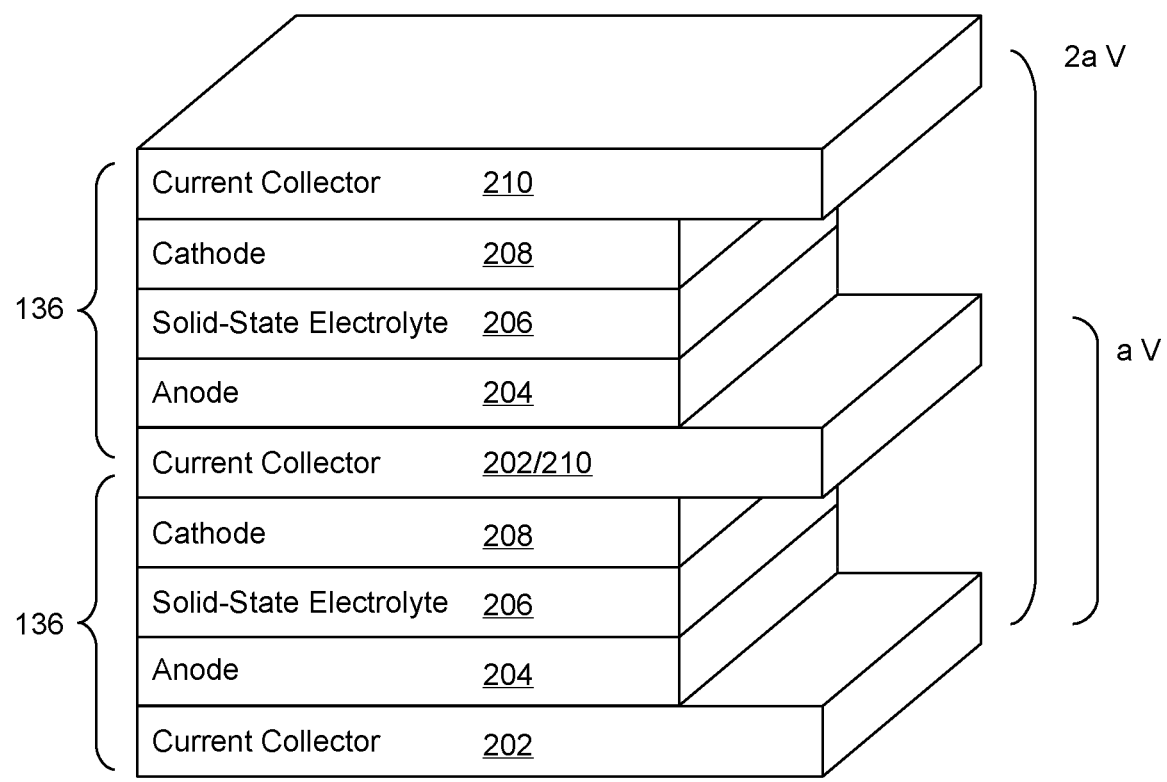
FIG. 20 is a schematic diagram showing two battery cells printed on top of each other in series and sharing a common current-collector sublayer therebetween.

FIG. 20 is a schematic diagram showing two battery cells 136 printed on top of each other in series and sharing a common current-collector sublayer (denoted 202/210) therebetween. Each battery cell 136 has an output voltage of a volts (V), and the combined voltage of the two battery cells 136 is 2a V.

Figure 21:
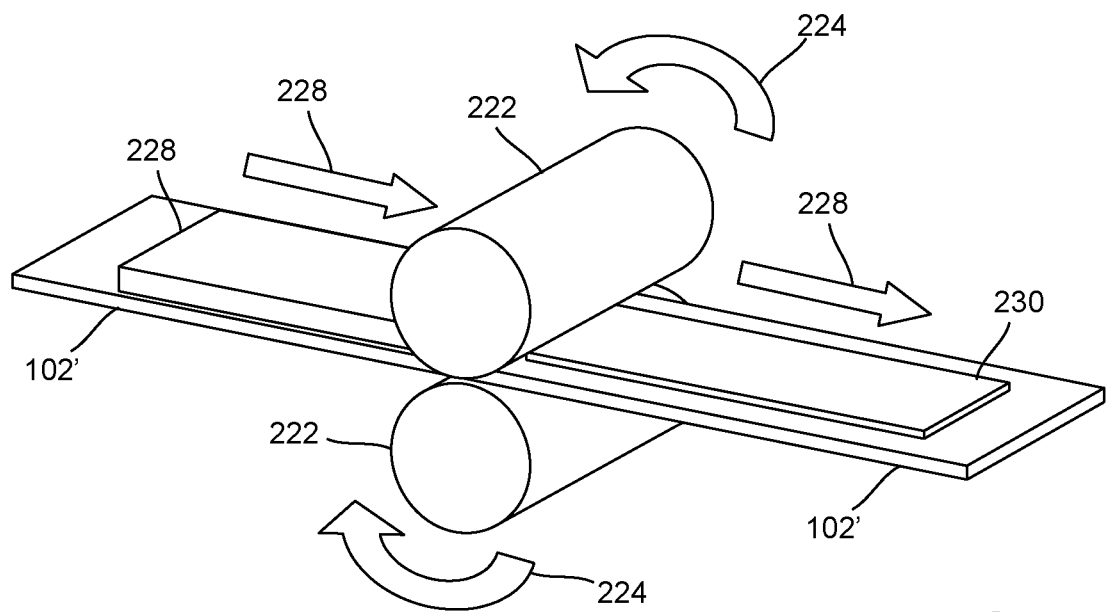
FIG. 21 shows the stencil printing technology for making battery cells by using a cold manual laminator as a stencil printer device.

FIG. 21 shows the stencil printing technology for making battery cells 136 by using a cold manual laminator as a stencil printer device. In particular, a pair of rollers 222 are rotating as indicated by the arrows 224 to apply pressure to the hybrid-energy device to be manufactured (denoted as 102'; having the substrate 132 and the solar-cell layer 112 printed thereon) which is fed to the rollers 222 as indicated by the arrows 228. The feeding hybrid-energy device 102' is prepared with copper masks (not shown) overlaid thereon and a gel or paste having the above-described material of respective one of the sublayers 204 to 208 is applied to the masked hybrid-energy device 102'. After passing through the rollers 222, a thin layer 230 of the gel (with a thickness of about 100 μm) is thus printed or coated onto the masked hybrid-energy device 102'.

Figure 22:
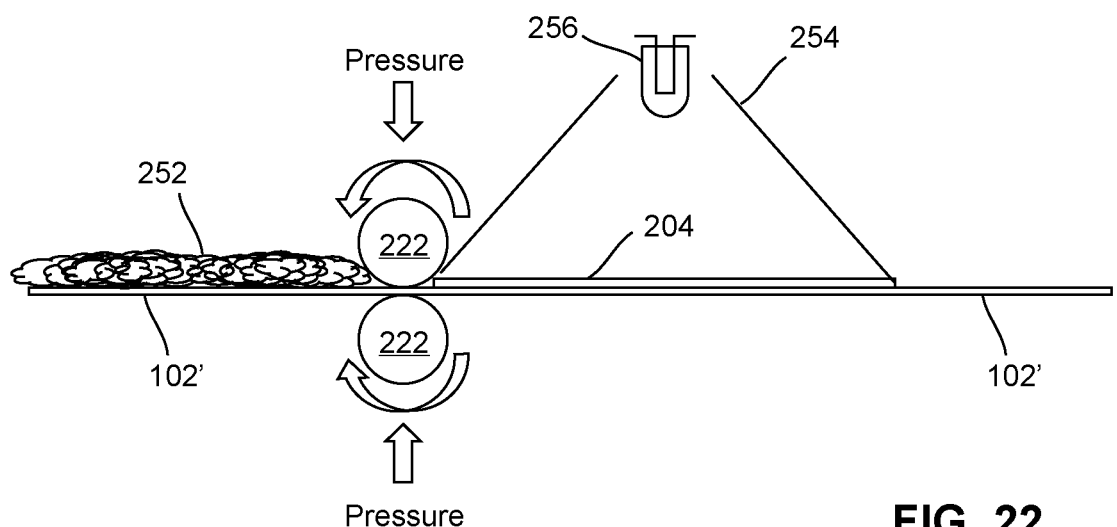
FIG. 22 shows the fabrication process of the anode sublayer on top of the current-collector sublayer using the stencil printing technique shown in FIG. 21 without any processing solvents.

FIG. 22 shows the fabrication process of the anode sublayer 204 on top of the Aluminum or conductive-paper current-collector sublayer 202 using the above-described stencil printing technique without any processing solvents. As shown, a LTO anode paste 252 is applied to the feeding hybrid-energy device 102' having the Aluminum or conductive-paper current-collector sublayer 202 (not shown), the rotating rollers 222 apply a pressure onto the anode paste 252 passing therethrough to form a thin LTO film 204 which is then exposed to UV irradiation 254 from a Hg UV-lamp 256 with an irradiation peak intensity of approximately 2000 $mW \cdot cm^{-2}$ for 30 seconds to solidify and form the printed LTO anode sublayer 204.

Then, the hybrid-energy device 102' may be masked and applied with an electrolyte paste and fed through the rollers 222 in a similar stencil-printing and UV-curing process as described above to print the solid-state-electrolyte separator sublayer 206 on the anode sublayer 204. The cathode sublayer 208 may be then fabricated by printing a cathode paste onto the solid-state-electrolyte separator sublayer 206 of the hybrid-energy device 102' and cured by UV irradiation. After the Al current-collector sublayer 210 is placed on top of the printed cathode sublayer 208, a seamlessly integrated all-solid-state battery-cell layer 136 is obtained which may be a mono full cell, i.e., the entire batter-cell layer 136 comprising a single battery cell.

The above-described process may be repeated to print another battery-cell layer 136 on top, giving rise to printed bipolar battery-cells 136.

In some embodiments, the above-described printing device with the slot-die head 174 shown in FIG. 13 may be used for printing the sublayers of battery cells 136. In these embodiments, a specific head 174 may be used for printing all the sublayers of solid-state battery cells 136 using slot-die coating. However, stencil printing (see FIG. 21) is much easier to use with high-viscosity inks. Moreover, it is not necessary to coat thin (i.e., nm scale) layers (nm scale) to fabricate the batteries disclosed herein. The sublayers of battery cells 136 may have relatively large thickness in ranges of micrometers that may be easily achieved by using stencil printing.

Figure 23:
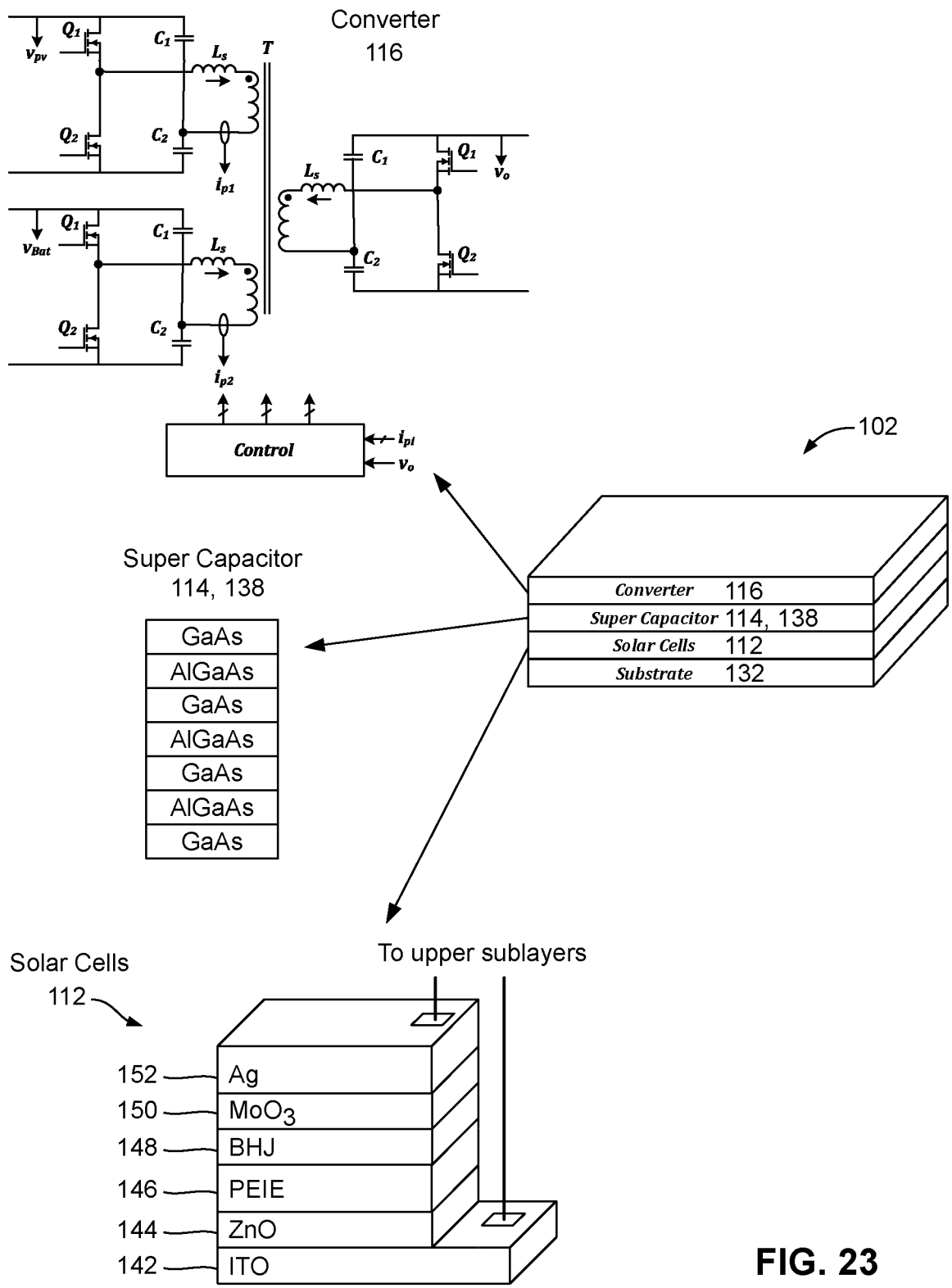
FIG. 23 is a schematic diagram showing the details of the hybrid-energy device shown in FIGS. 9A and 9B.

FIG. 23 shows the details of the hybrid-energy device 102. In this example, the energy-storage layer 114 is a supercapacitor layer comprising a plurality of GaAs/AlGaAs sublayers 138 forming a plurality of semiconductor capacitors as described above.

Integrated Electronic-Power Converter

Figure 24A:
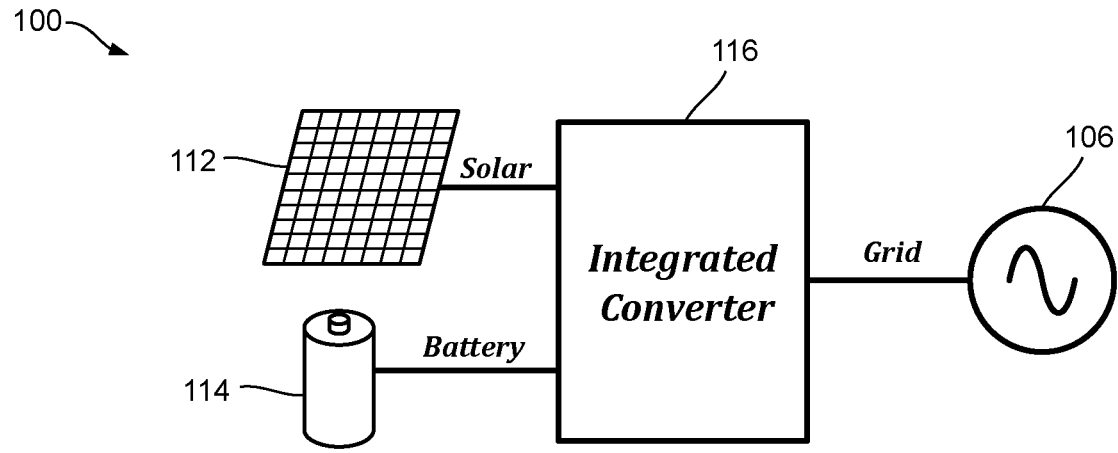
FIGS. 24A and 24B are block diagrams of a solar-energy harvesting system having an integrated electronic-power converter for AC and DC applications.
Figure 24B:
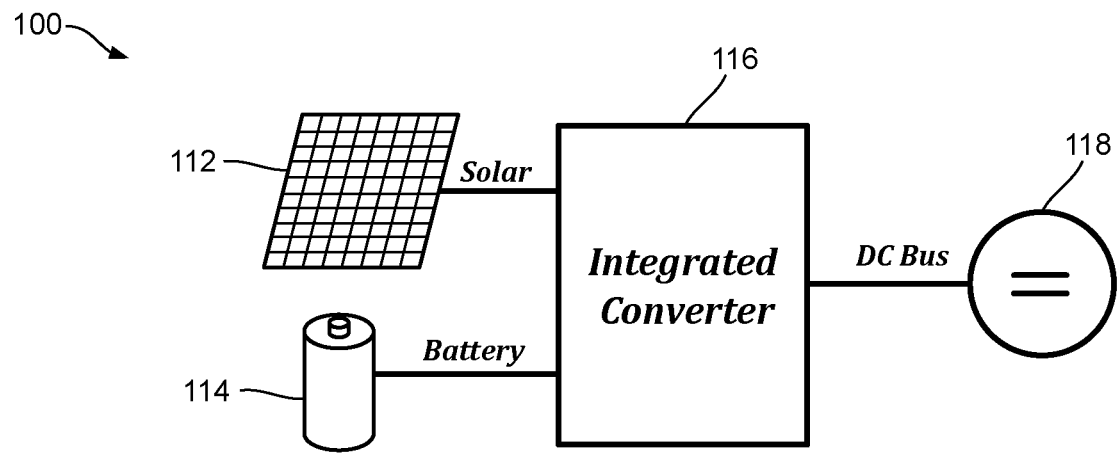

In some embodiments, the multi-input electronic-power converter 116 may be an integrated electronic-power converter that may be printed, deposited, or otherwise integrated to the layer of battery cells 136 (see FIGS. 9A and 9B). The block diagram of the integrated electronic-power converter is shown in FIGS. 24A and 24B show the solar-energy harvesting system 100 having an integrated electronic-power converter 116 for AC and DC applications, respectively.

Figure 25A:
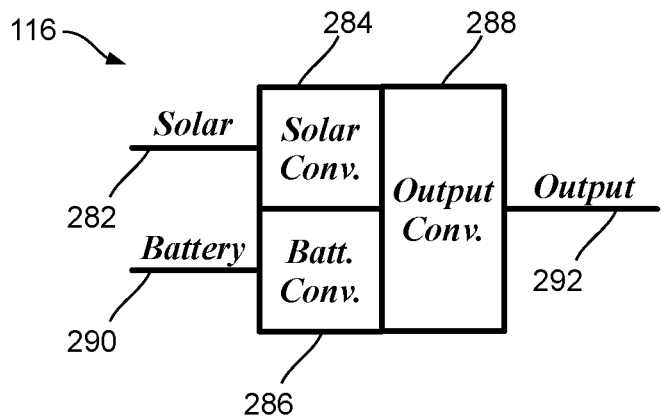
FIG. 25A is a schematic diagram showing the functional structure of the integrated electronic-power converter shown in FIGS. 24A and 24B, wherein the integrated electronic-power converter comprises a solar-input converter, a battery-input converter, and an output converter.

FIG. 25A is a block diagram of the integrated electronic-power converter 116. As shown, the integrated electronic-power converter 116 comprises a solar-input converter 284 receiving the output of the solar-cell layer 112 at a solar input 282 and converting the solar input 282 to a first intermediate form (voltage, current, frequency, and/or the like) for outputting to an output converter 288. The integrated electronic-power converter 116 also comprises a battery-input converter 286 receiving the output of the energy-storage layer 114 at a battery input 290 and converting the battery input 290 to a second intermediate form (voltage, current, frequency, and/or the like) for outputting to the output converter 288. The output converter 288 receives and combines the electrical outputs from the solar-input converter 284 and the battery-input converter 286 and converts the combined electrical energy into a suitable form (voltage, current, frequency, and/or the like) for outputting (292) to the load and/or utility grid (not shown).

Figure 25B:
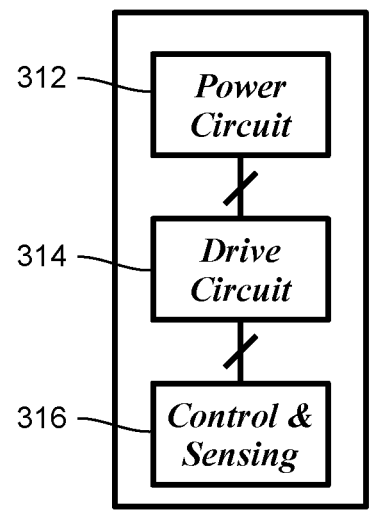
FIG. 25B is a schematic diagram showing the functional structure of the solar-input converter, the battery-input converter, and the output converter shown in FIG. 25A.

In these embodiments, the solar-input converter 284, the battery-input converter 286, and the output converter 288 are high-frequency (HF) circuitries and have a similar functional structure as shown in FIG. 25B. As can be seen, each of the converters 284, 286, and 288 comprises a power circuit 312 for receiving electricity input which is coupled to a drive circuit 314 for outputting electricity. A control and sensing module 316 is coupled to the drive circuit 314 for controlling the electricity output and for balancing between the solar input 282 and the battery input 290.

Figure 25C:
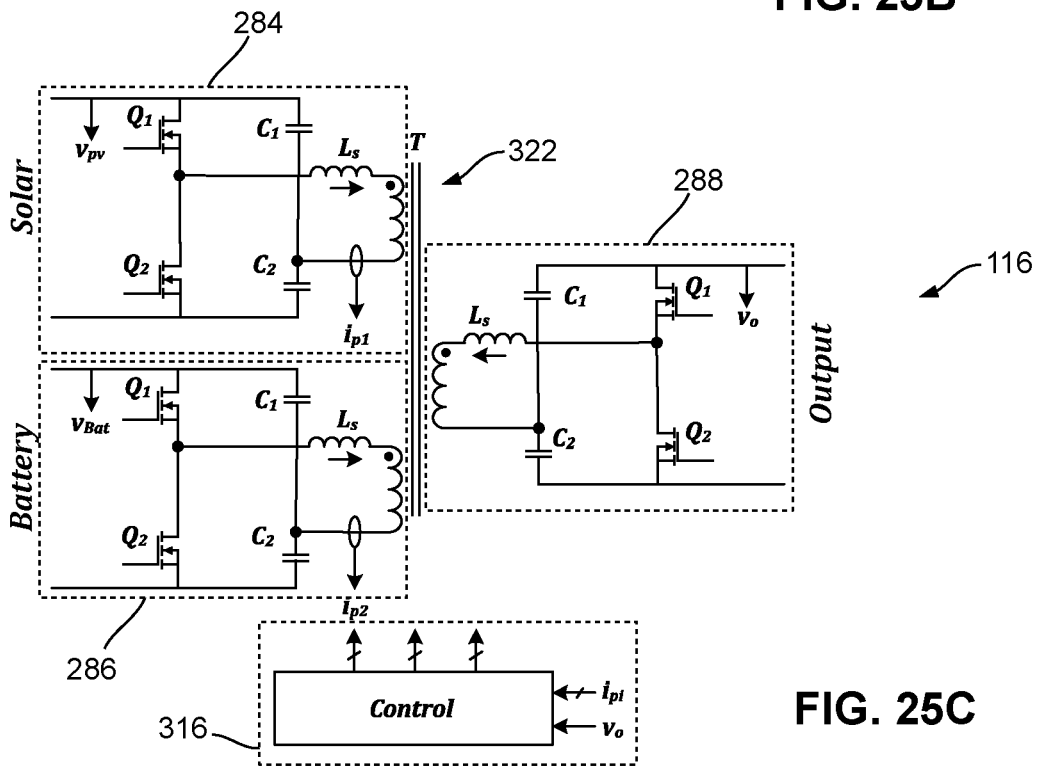
FIG. 25C is a circuit diagram of the integrated electronic-power converter shown in FIGS. 24A and 24B.

FIG. 25C is a circuit diagram of the integrated electronic-power converter 116. As shown, the solar-input converter 284, the battery-input converter 286, and the output converter 288 are electrically coupled through a transformer 322 with a ferromagnetic or ferrimagnetic core. The control and sensing module 316 senses the output currents $i_{p1}$ and $i_{p2}$ (collectively denoted as $i_{pi}$ with i=1 or 2) of the solar-input converter 284 and the battery-input converter 286, respectively, and the output voltage $v_o$ of the output converter 288 and uses $i_{pi}$ and $v_o$ for adjusting the parameters of the solar-input converter 284, the battery-input converter 286, and the output converter 288 for optimizing the performance thereof.

Figure 26A:
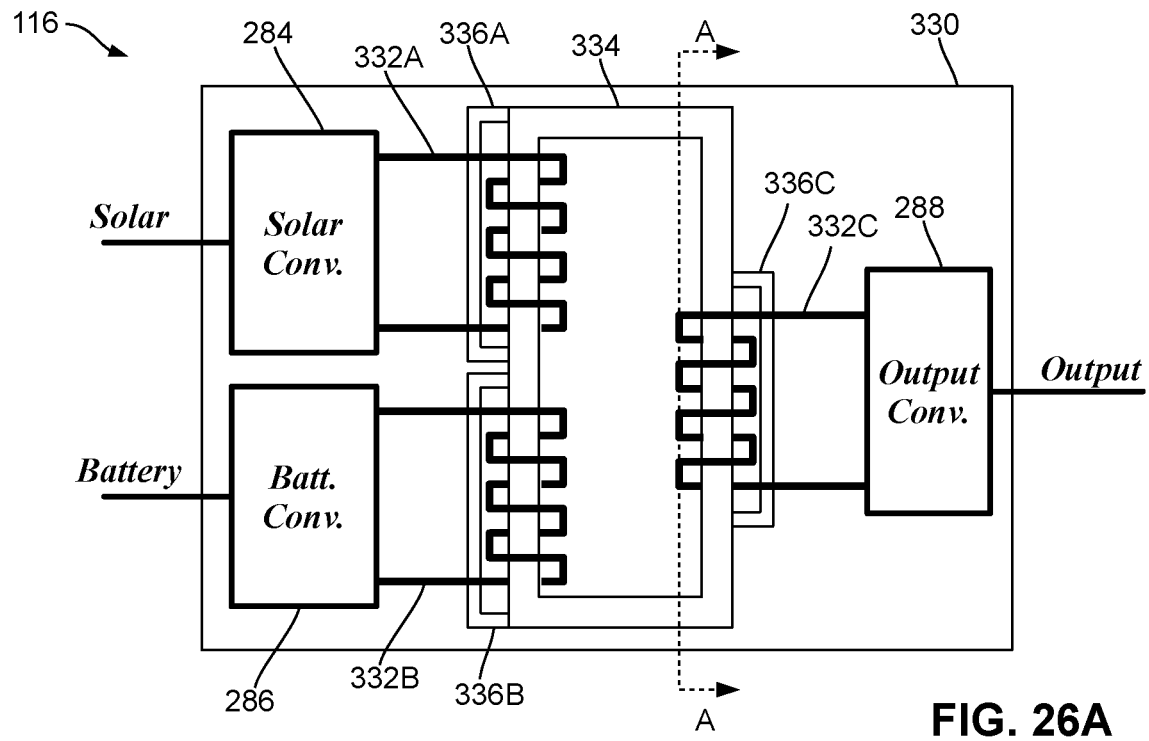
FIG. 26A is a schematic diagram showing a physical implementation of the integrated electronic-power converter shown in FIGS. 24A and 24B, according to some embodiments of this disclosure.
Figure 26B:
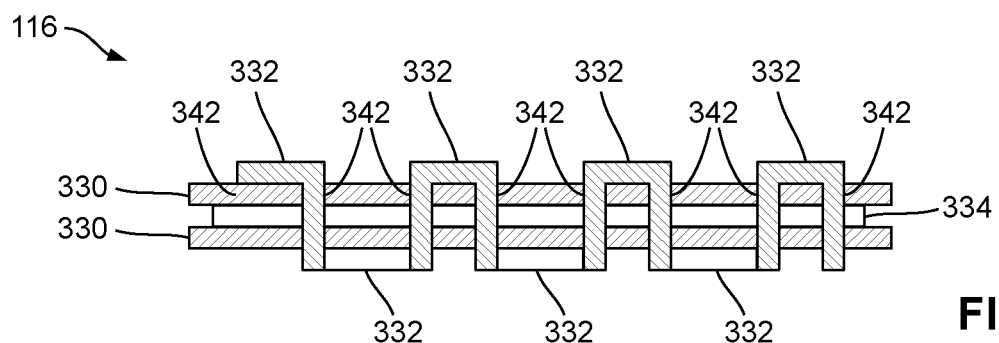
FIG. 26B is a cross-sectional view of the integrated electronic-power converter shown in FIG. 26A along the cross-sectional line A-A.
Figure 26C:
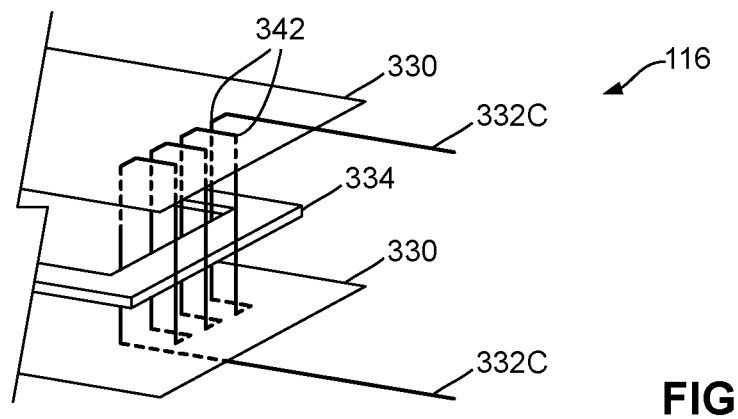
FIG. 26C is a schematic perspective view of a portion of the integrated electronic-power converter shown in FIG. 26A, according to some embodiments of this disclosure.

As shown in FIGS. 26A to 26C, the integrated electronic-power converter 116 in some embodiments may be formed by a printed circuitry on a plurality of flexible printed circuit boards (PCBs) 330.

In these embodiments, the integrated electronic-power converter 116 is implemented as an Integrated Circuit (IC) chip and comprises a core layer 334 made of a ferrite material thereby forming a ferrite core. The ferrite core 334 is sandwiched between two silicon-based wiring layers 330. FIG. 26C is a schematic perspective view of a portion of the integrated electronic-power converter 116. For ease of illustration, the structure of the integrated electronic-power converter 116 is shown with gaps between the ferrite core 334 and the wiring layers 330. However, those skilled in the art will appreciate that such gaps are for illustration purposes only and the actual integrated electronic-power converter 116 may not have any gap between the ferrite core 334 and the wiring layers 330. For example, the ferrite core 334 may be printed, deposited, or otherwise integrated to either one of the wiring layers 330.

The ferrite core 334 comprises three ferrite loops 336A, 336B, and 336C for acting as the cores of the inductors Ls of the solar-input, battery-input, and output converters 284, 286, and 288, respectively.

The conductive wirings 332 including 332A, 332B, and 332C are distributed on the wiring layers 330 and connect the solar-input, battery-input, and output converters 284, 286, and 288. As shown in FIGS. 26B and 26C, the conductive wirings 332 on the opposite wiring layers 330 are connected through vias 342 (conductive holes on the wiring layers 330) and winding about the ferrite core 334.

In some embodiments, the integrated electronic-power converter 116 is implemented as a circuit board having two wiring layers 220 made of flexible PCBs and a core layer 334 structured in a manner similar to that shown in FIGS. 26A to 26C and described above. The conductive wirings 332 including 332A, 332B, and 332C are made of etched conductive layers on the flexible PCBs 330. The conductive wirings 332 on the opposite flexible PCBs 330 are connected through vias 342 and winding about the ferrite core 334.

Circuits of the Hybrid-Energy Device

Figure 27:
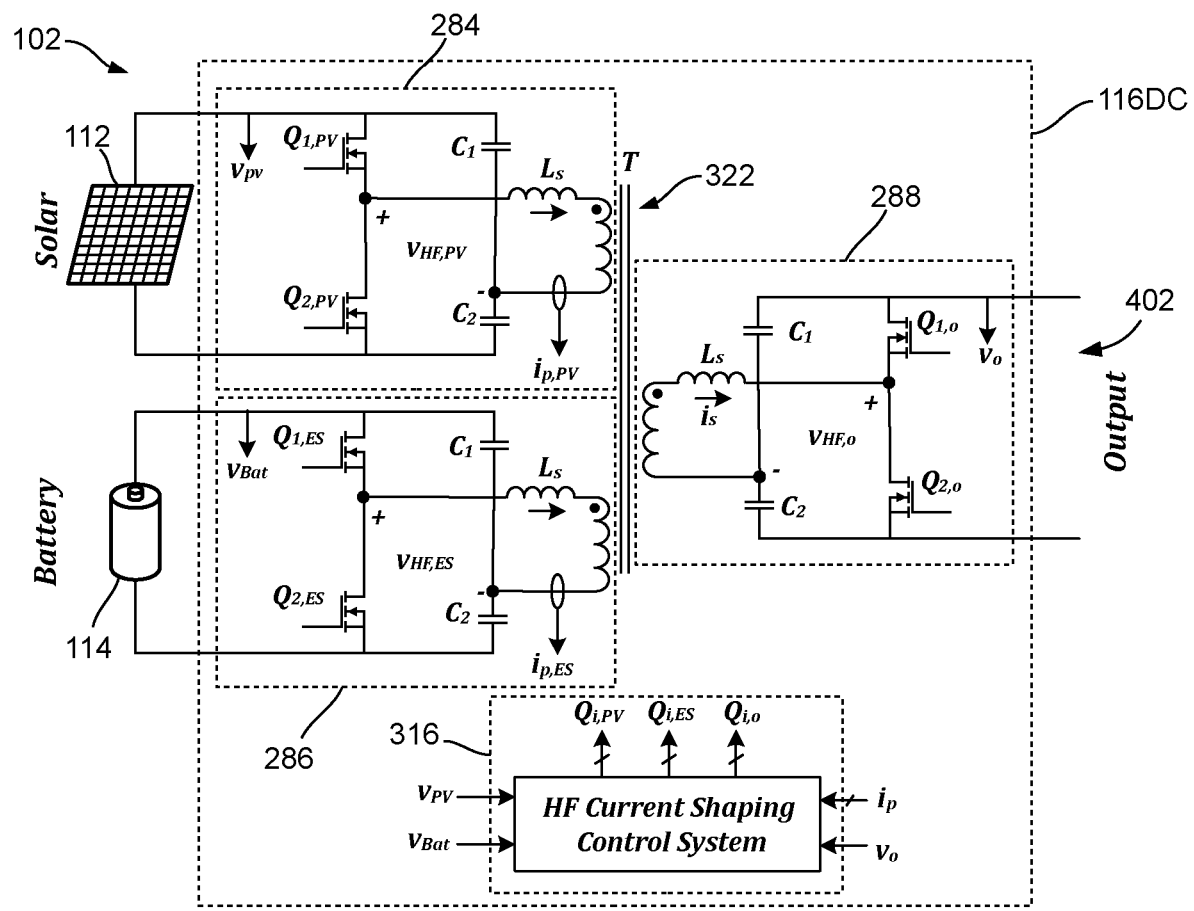
FIG. 27 is a circuit diagram showing a DC hybrid-energy device of the solar-energy harvesting system shown in FIGS. 7 and 8, according to some embodiments of this disclosure, the DC hybrid-energy device having an integrated DC power converter for powering DC-energy devices.

FIG. 27 is a circuit diagram showing a DC hybrid-energy device 102 having an integrated DC power converter 116DC for powering DC-energy devices (not shown; collectively denoted as "output devices") at it output 402, according to some embodiments of this disclosure. The DC power converter 116DC may be integrated into the hybrid-energy device 102 and electrically connect the solar cells 112 and the energy storage 114 to the respective output device.

In these embodiments, the integrated DC power converter 116DC comprises a plurality of HF circuitry modules including a solar-input converter 284, an energy-storage converter 286, and an output converter 288. The integrated DC power converter 116DC also comprises a current-shaping control module 316 for precise power-flow control between the solar cells 112, the energy storage 114, and the output 402, which shapes the HF currents going through the HF transformer 332 for achieving desired performance.

As shown in FIG. 27, each of the circuitry modules 284, 286, and 288 comprises a pair of power semiconductors such as a pair of metal-oxide-semiconductor field-effect transistors (MOSFETs) ($Q_{1,PV}$ and $Q_{2,PV}$ in the solar-input converter 284, $Q_{1,ES}$ and $Q_{2,ES}$ in the energy-storage converter 286, $Q_{1,o}$ and $Q_{2,o}$ in the output converter 288) together with a LC circuit (having two capacitors and an inductor in this example) for forming a switch circuit for electrically coupling through the transformer 322. The circuitry modules 284, 286, and 288 may be controlled by adjusting the signals applied to their power-semiconductor gate-terminals $Q_{1,PV}$, $Q_{2,PV}$, $Q_{1,ES}$, $Q_{2,ES}$, $Q_{1,o}$, and $Q_{2,o}$.

In the embodiments shown in FIG. 27, the current-shaping control module 316 senses a plurality of parameters including the output voltage $v_{pv}$ of the solar-cell layer 112, the output voltage of the energy-storage layer 114 $v_{Bat}$, the output currents $i_{p,PV}$, $i_{p,ES}$ of the solar-input converter 284 and the energy-storage converter 286, respectively (collectively denoted $i_p$) for coupling to the output converter 288 via the transformer 322, and the output voltage $v_o$ of the output converter 288. The current-shaping control module 316 optimizes the performance of the integrated DC power converter 116DC by controlling the signals applied to the power-semiconductor gate-terminals (collectively denoted $Q_{i,PV}$, $Q_{i,ES}$, and $Q_{i,o}$, with i=1 or 2).

In particular, based on the above-described sensed parameters, the current-shaping control module 316 controls the gate-terminal signals $Q_{i,PV}$, $Q_{i,ES}$, and $Q_{i,o}$ for adjusting various signal parameters such as the duty cycle $d_{PV}$ of the power semiconductors at the transformer PV-side 284, the duty cycle $d_{ES}$ of the transformer battery-side 286, the duty cycle $d_o$ of the power semiconductors at the transformer output-side 288, the phase-shift between the pules for the power semiconductors at the transformer PV-side 284 and the pulses for the power semiconductors at the output-side 288 (i.e., $\varphi_{PV}$), and the phase-shift between the pules for the power semiconductors at the transformer battery-side 286 and for the power semiconductors at the output-side 288 (i.e. $\varphi_{ES}$), and the switching frequency (i.e. $T_s$), to shape the HF currents of the three modules 284, 286, and 288.

Figure 28:
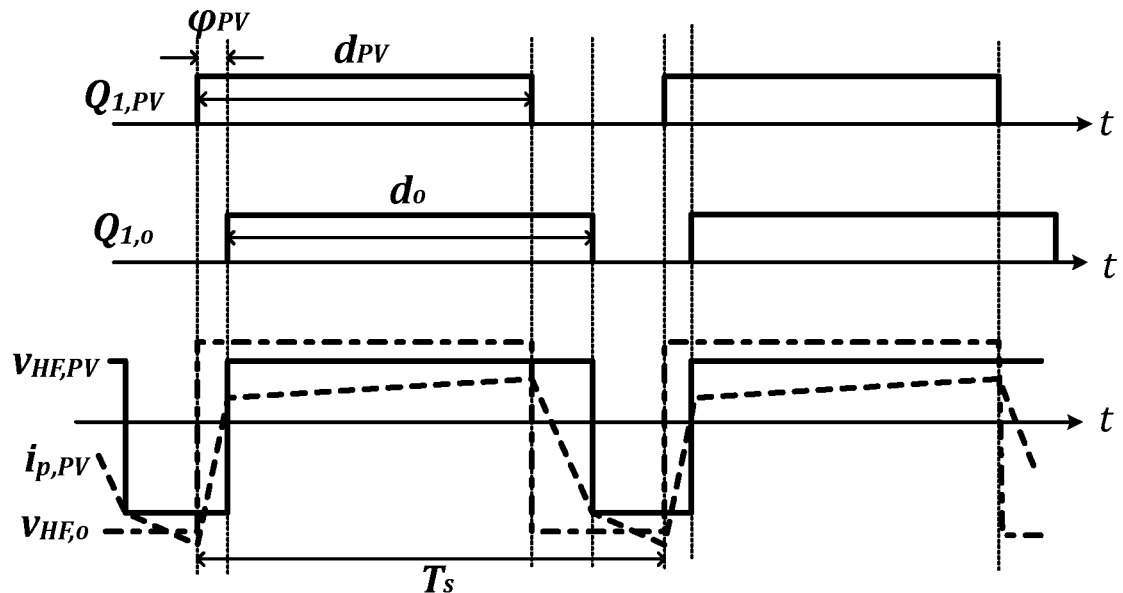
FIG. 28 shows the waveforms of some signals in the solar-cell module of the DC hybrid-energy device shown in FIG. 27.

FIG. 28 shows the HF waveforms of some signals in the solar-cell module 284.

Figure 29:
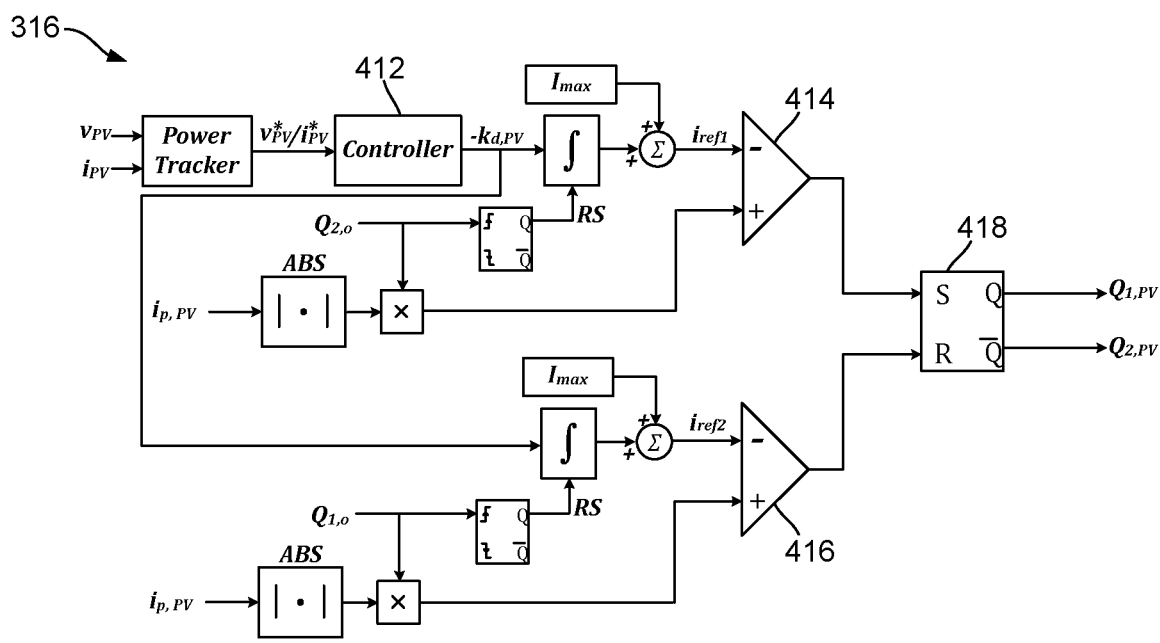
FIG. 29 is a block diagram of a current-shaping control module of the DC hybrid-energy device shown in FIG. 27, according to some embodiments of this disclosure.

FIG. 29 is a block diagram of the current-shaping control module 316 for controlling the solar-cell module 284 in some embodiments. According to this figure, the power output from the solar-cell module 284 is controlled using the phase-shift $\varphi_{PV}$ between the pulses of the transformer PV-side power semiconductors $Q_{i,PV}$ (i=1, 2) and those of the transformer output-side power semiconductors. In particular, the current-shaping control module 316 uses a constant, reference current-value $I_{max}$ as the maximum value for the instantaneous current of the transformer, and generates a pair of reference signals $v^*_{PV}$ and $i^*_{PV}$ for inputting to the controller 412 (herein, "*" represents reference signal) which outputs a signal $k_{d,PV}$. The current-shaping control module 316 also uses a pair of mono-stable multi-vibrator circuits for detecting the rising edge of the input signal $Q_{1,o}$ or $Q_{2,o}$ and outputting a pulse with a predefined duration. Similar control can be performed for the energy storage module 286.

Generally, the current-shaping control module 316 determines two signals $i_{ref1}$ and $i_{ref2}$ respectively at the input sides of the amplifiers 414 and 416 as $$i_{ref1}=I_{max}-k_{d,PV}\times t, \text{ when } Q_{2,o}=\text{'}1\text{'},$$

$$i_{ref2}=I_{max}-k_{d,PV}\times t, \text{ when } Q_{1,o}=\text{'}1\text{'}.$$

Where "×" represents multiplication.

The signals $i_{ref1}$ and $i_{ref2}$ are then subtracted from $Q_{2,o}\times |i_{p,PV}|$ and $Q_{1,o}\times |i_{p,PV}|$ ("|a|" representing the absolute value of a), respectively, at the amplifiers 414 and 416, and the outputs of the amplifiers 414 and 416 are used to trigger a S-R flip-flop 418 to generate the signals $Q_{1,PV}$ and $Q_{2,PV}$.

The current-shaping control module 316 for controlling the energy-storage module 286 may be similar to that shown in FIG. 29, except that the phase-shift may be positive and negative depending on the charging or discharging mode of operation.

Figure 30:
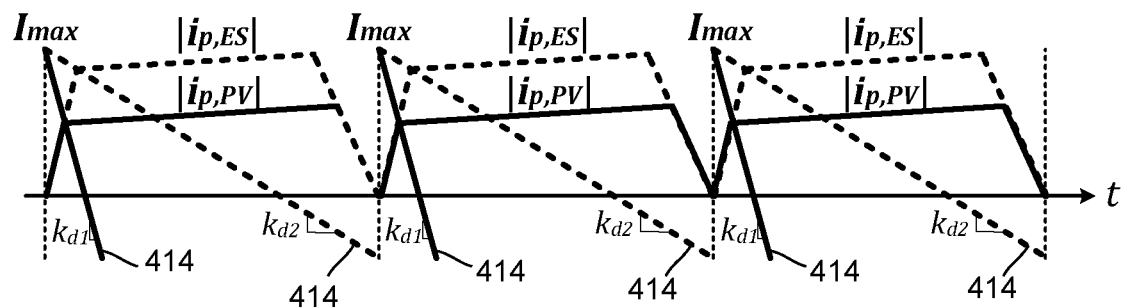
FIG. 30 shows the waveforms of the current-shaping control module of the DC hybrid-energy device shown in FIG. 27.

FIG. 30 shows the waveforms with regards to the current-shaping control module 316. The controller adjusts the droop slop $k_{di}$ (i=1, 2) of the signals $i_{ref1}$ and $i_{ref2}$ generated by the controller 412 for adjusting the phase-shift and controlling the power. Since the slopes of the transformer currents $i_{p,PV}$ or $i_{p,ES}$ may be positive or negative (depending on the input and output voltages), controlling the droop slop may effectively control the phase-shift regardless of the transformer current slop. The other control variables such as $d_{PV}$, $d_o$, and $T_s$ may be used to ensure soft-switching of the power semiconductors.

Figure 31:
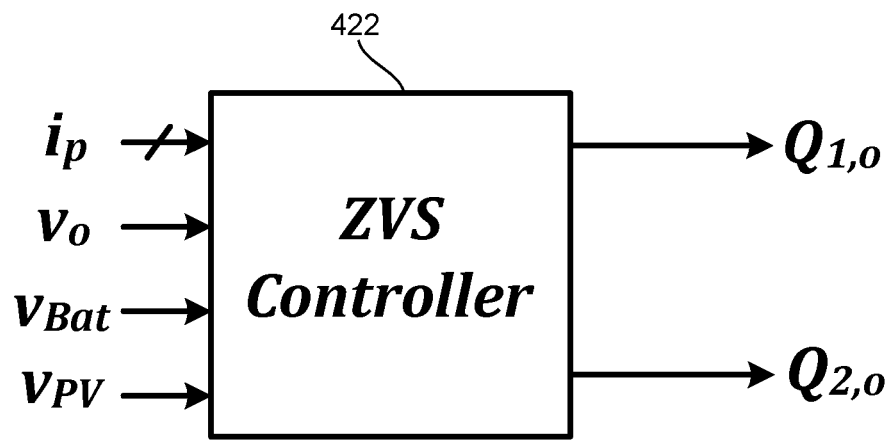
FIG. 31 is a block diagram showing the generation of the pulses of the transformer-secondary-side power semiconductors of the DC hybrid-energy device shown in FIG. 27, by using a Zero Voltage Switching (ZVS) controlling circuit for ensuring the current thereof to have correct polarities at the switching time-instants.

FIG. 31 is a block diagram showing the generation of the pulses of the transformer-secondary-side power semiconductors by using a Zero Voltage Switching (ZVS) controlling circuit 422 which ensures the HF current $i_p$ (which may be $i_{p,PV}$ or $i_{p,ES}$) to have correct polarities at the switching time-instants.

Figure 32:
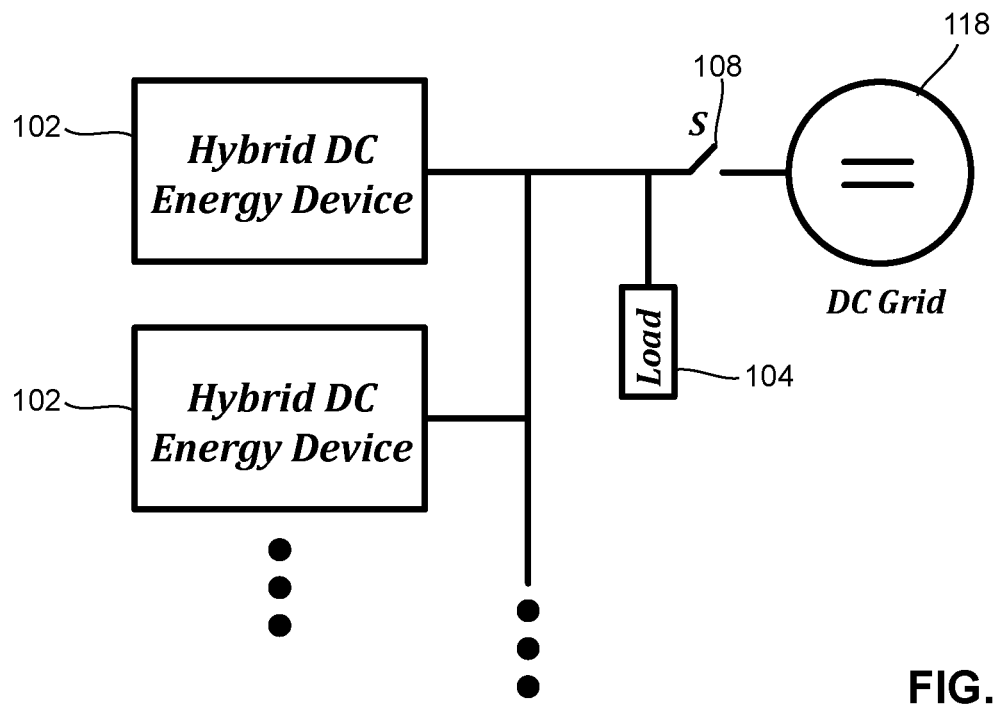
FIG. 32 is a block diagram showing a plurality of the DC hybrid-energy devices shown in FIG. 27 being connected in parallel for powering DC loads and/or a DC grid, according to some embodiments of this disclosure.

In some embodiments as shown in FIG. 32, a plurality of the DC hybrid-energy devices 102 (see FIG. 27) may be connected or otherwise combined in parallel for powering DC loads 104 and/or a DC grid 118.

Figure 33:
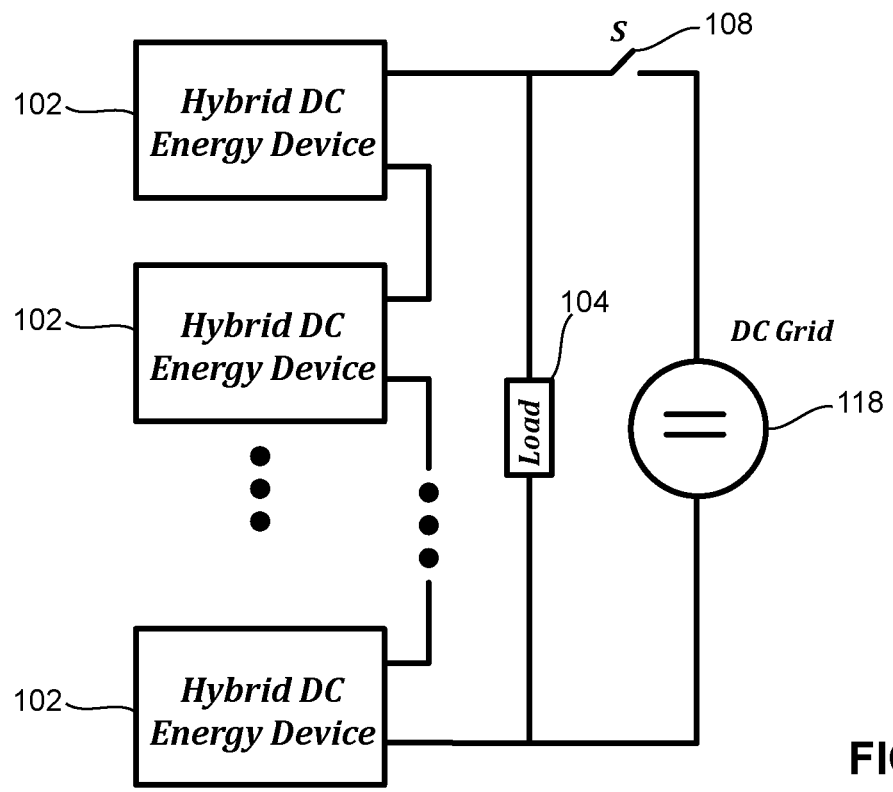
FIG. 33 is a block diagram showing a plurality of the DC hybrid-energy devices shown in FIG. 27 being connected in series for powering DC loads and/or a DC grid, according to some embodiments of this disclosure.

In some embodiments as shown in FIG. 33, a plurality of the DC hybrid-energy devices 102 described herein may be connected or otherwise combined in series for powering DC loads 104 and/or a DC grid 118. An advantage of these embodiments is that, while the voltage output of each hybrid-energy device 102 may be low, the combination of the plurality of the hybrid-energy devices 102 may provide a high-voltage output as needed.

Figure 34:
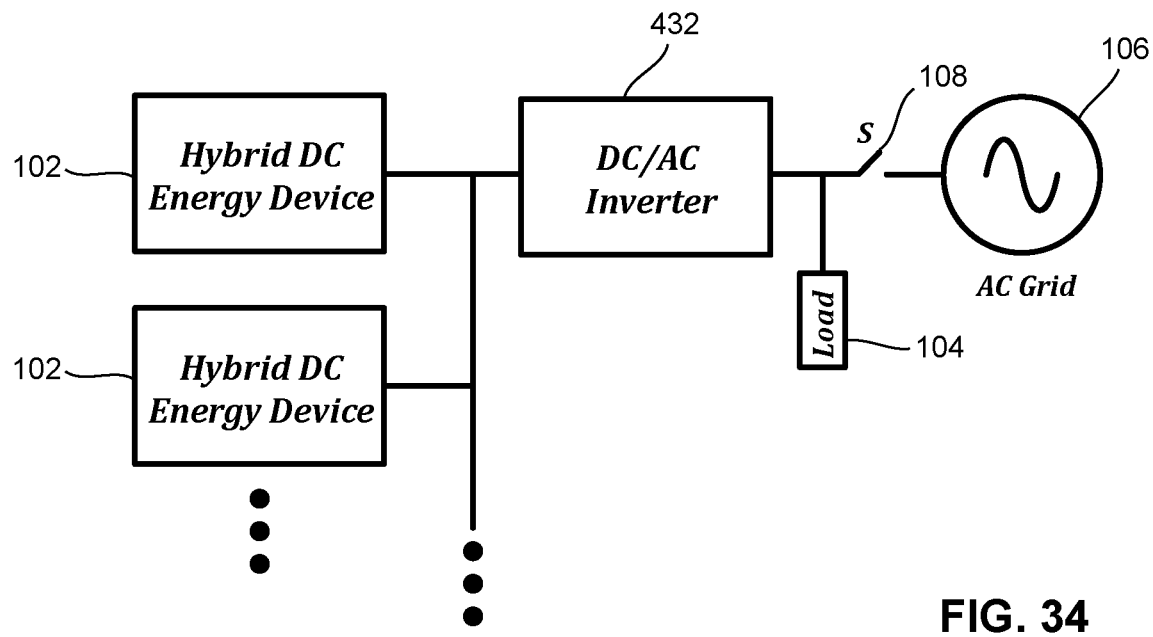
FIG. 34 is a block diagram showing a plurality of the DC hybrid-energy devices shown in FIG. 27 being connected in parallel for powering AC loads and/or a AC grid via a DC/AC inverter, according to some embodiments of this disclosure.
Figure 35:
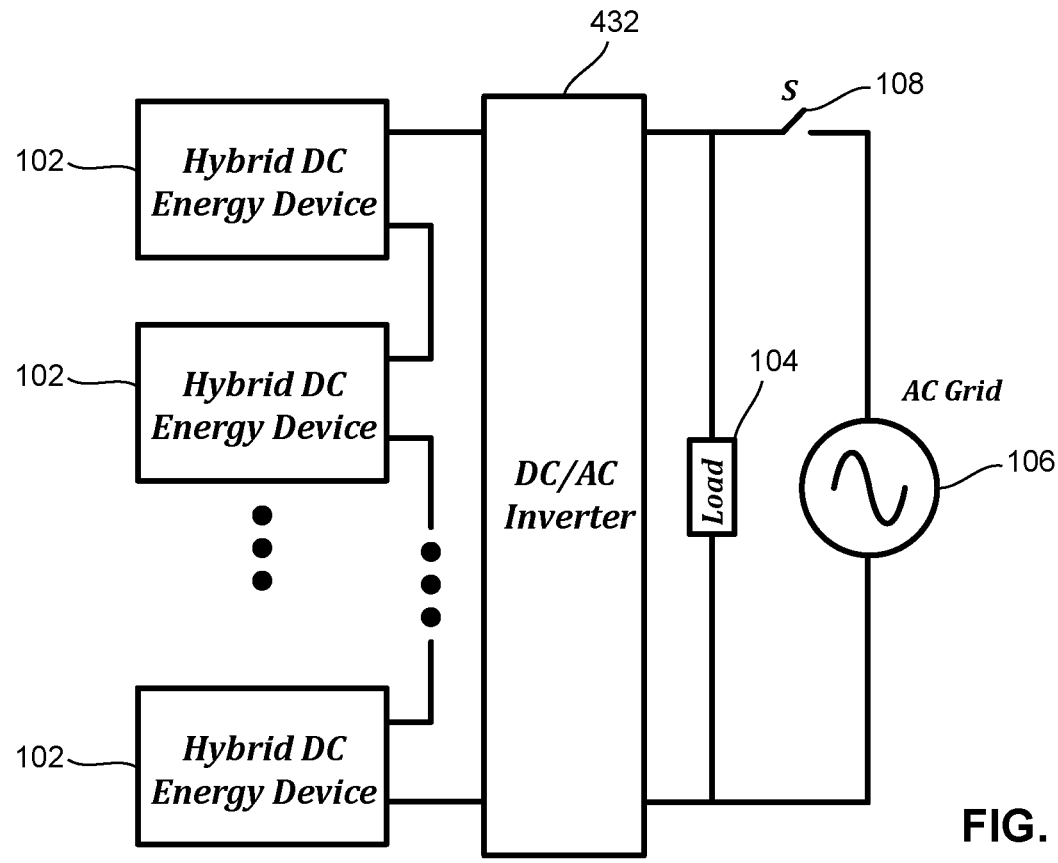
FIG. 35 is a block diagram showing a plurality of the DC hybrid-energy devices shown in FIG. 27 being connected in series for powering AC loads and/or a AC grid via a DC/AC inverter, according to some embodiments of this disclosure.

In some embodiments, the DC hybrid-energy devices 102 may be used for powering AC loads and/or grids with the use of a DC/AC invertor. For example, FIG. 34 shows a plurality of the DC hybrid-energy devices 102 connected in parallel for powering DC loads 104 and/or a DC grid 118 via a single-input DC/AC invertor 432. FIG. 31 shows a plurality of the DC hybrid-energy devices 102 connected in series for powering DC loads 104 and/or a DC grid 118 via a single-input DC/AC invertor 432.

Figure 36:
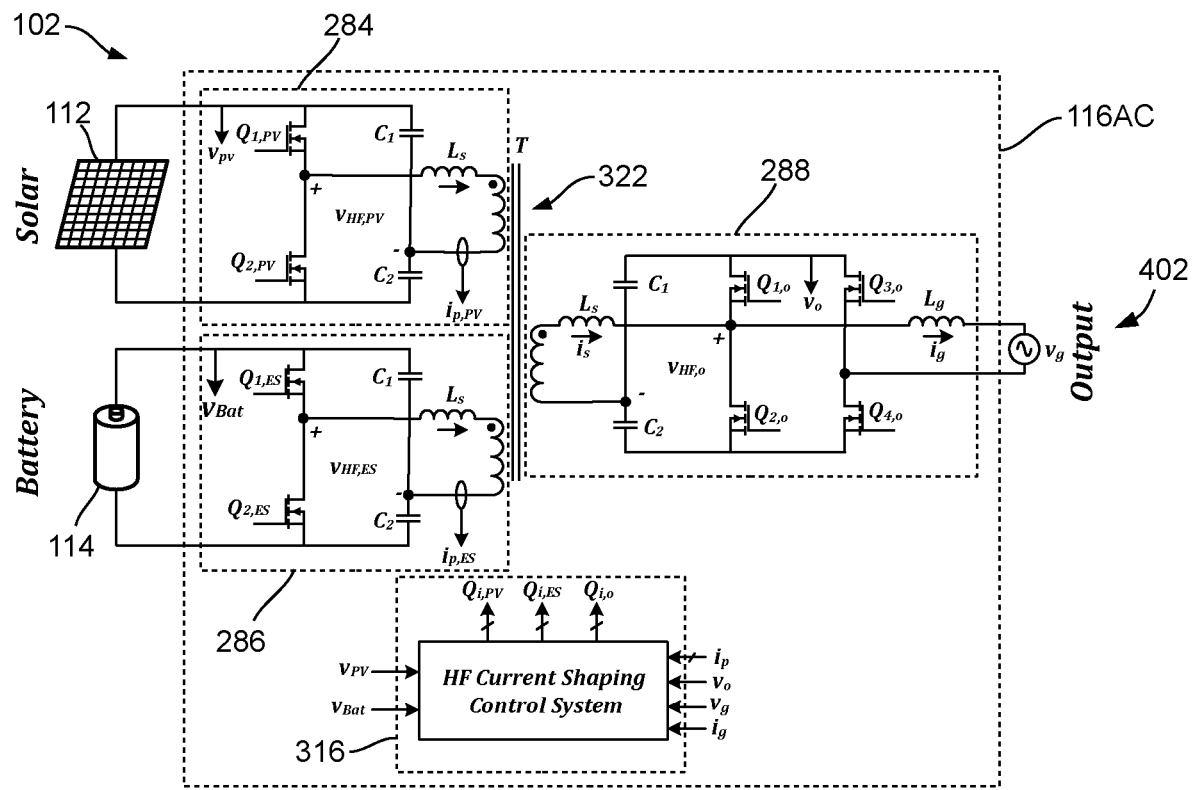
FIG. 36 is a circuit diagram showing an AC hybrid-energy device of the solar-energy harvesting system shown in FIGS. 7 and 8, according to some embodiments of this disclosure, the AC hybrid-energy device having an integrated AC power converter for powering AC-energy devices.

FIG. 36 is a circuit diagram showing an AC hybrid-energy device 102 having an integrated AC power converter 116AC for powering AC-energy devices (not shown; collectively denoted output devices) at it output 402, according to some embodiments of this disclosure. The AC power converter 116AC may be integrated into the hybrid-energy device 102 and electrically connect the solar cells 112 and the energy storage 114 to the respective output device.

As shown in FIG. 36, the integrated AC power converter 116AC is similar to the integrated DC power converter 116DC except that the output converter 288 of the integrated AC power converter 116AC further comprises a pair of power semiconductors $Q_{3,o}$ and $Q_{4,o}$ and an inductor $L_g$. Accordingly, the current-shaping control module 316 of the integrated AC power converter 116AC also senses the AC output voltage $v_g$ and the AC output current $i_g$ for optimization. Based on the sensed parameters, the current-shaping control module 316 also adjusts the signal applied to the gate terminals of the power semiconductors $Q_{3,o}$ and $Q_{4,o}$ (i.e., $Q_{i,o}$ with i=1, 2, 3, 4 in FIG. 36).

In these embodiments, the current-shaping control module 316 is similar to that of the integrated DC power converter 116DC. For example, the current-shaping control module 316 for controlling the solar-cell module 284 may have a structure similar to that shown in FIG. 29. The current-shaping control module 316 in these embodiments may also use a ZVS controlling circuit similar to that shown in FIG. 31 for generating the pulses of the transformer-secondary-side power semiconductors and ensuring the HF current $i_p$ to have correct polarities at the switching time-instants.

Figure 37:
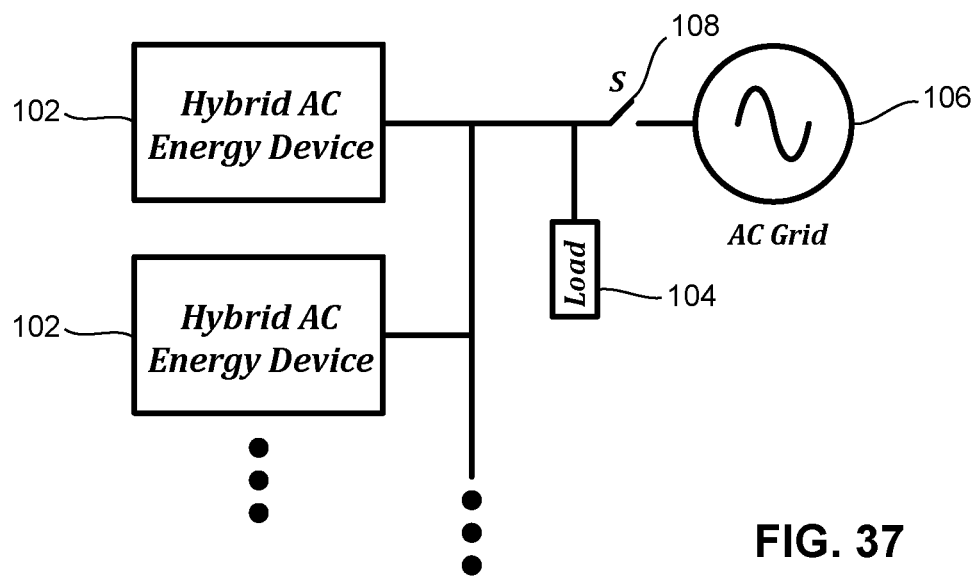
FIG. 37 is a block diagram showing a plurality of the AC hybrid-energy devices shown in FIG. 36 being connected in parallel for powering AC loads and/or an AC grid, according to some embodiments of this disclosure.

Those skilled in the art will appreciate that in some embodiments as shown in FIG. 37, a plurality of the AC hybrid-energy devices 102 shown in FIG. 36 may be connected or otherwise combined in parallel for powering AC loads 104 and/or an AC grid 106.

Exemplary Use of the Solar-Energy Harvesting System

The above-described solar-energy harvesting system 100 may also be in various electrical and electronic devices as a demountable part or as an integrated part thereof as needed.

Figure 38:
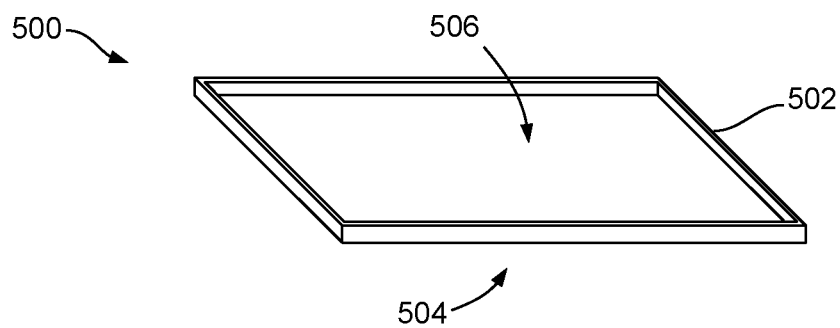
FIG. 38 is a schematic diagram showing a cellphone case with a hybrid-energy device integrated on a rear wall thereof, according to some embodiments of this disclosure.
Figure 39:
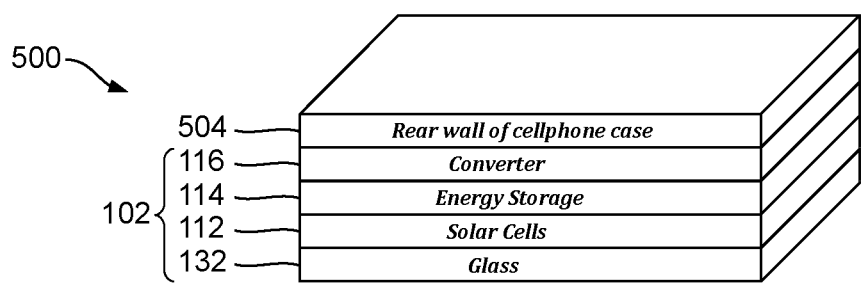
FIG. 39 is a schematic diagram showing the structure of the hybrid-energy device shown in FIG. 38.

For example, FIG. 38 shows a cellphone case 500 having a plurality of sidewalls 502 and a rear wall 504 thereby forming a recess 506 for receiving therein a cellphone (not shown) such as a smartphone. A hybrid-energy device 102 is integrated on the rear wall 502 thereof. As shown in FIG. 39, the hybrid-energy device 102 comprises, named from the rear wall 502 of the cellphone case 500, the electronic-power converter 116, the energy storage layer 114, the solar-cells layer 112, and a transparent substrate 132 such as a piece of transparent glass. The energy storage layer 114 is connected to the batteries in the cellphone via the electronic-power converter 116.

In some alternative embodiments, the hybrid-energy device 102 may not comprise the energy storage layer 114. Rather, the solar-cells layer 112 is connected to the batteries in the cellphone via the electronic-power converter 116.

In some alternative embodiments, the case 500 may be a case for other portable devices such as a tablet.

In some alternative embodiments, the hybrid-energy device 102 may be integrated to a rear wall of a cellphone or a tablet.

In some alternative embodiments, the hybrid-energy device 102 may be integrated to a rear wall of the display of a laptop computing device.

Figure 40:
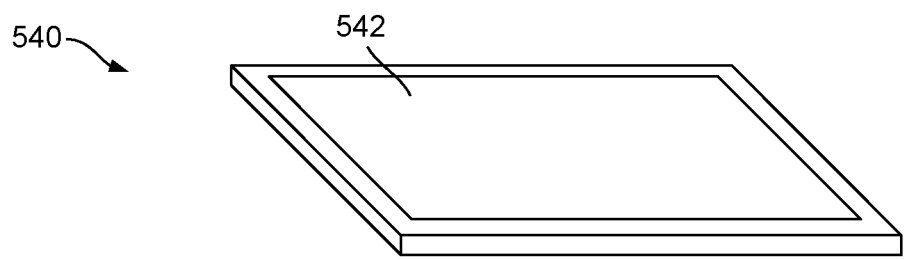
FIG. 40 is a schematic diagram showing a cellphone with a hybrid-energy device integrated in the screen thereof, according to some embodiments of this disclosure.

In some embodiments as shown in FIG. 40, the hybrid-energy device 102 may be integrated into the screen 542 of a cellphone 540.

Figure 41:
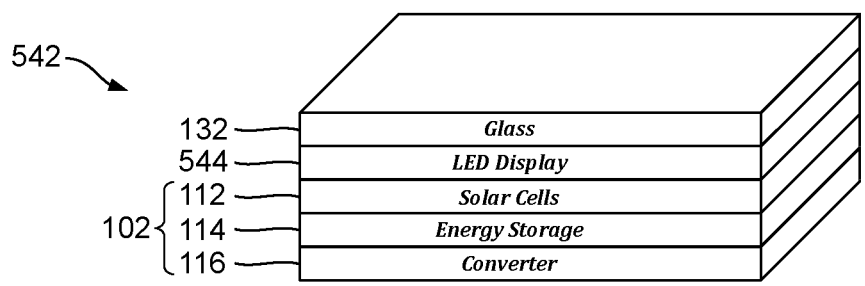
FIG. 41 is a schematic diagram showing the structure of the hybrid-energy device shown in FIG. 40.

As shown in FIG. 41, the screen 542 comprises, from the outermost layer to the innermost layer, a transparent substrate layer 132 such as glass with one or more sublayers for touch detection (e.g., capacitive touch detection), a display layer 544 having a plurality of LEDs for displaying images thereon, the solar-cells layer 112, the energy storage layer 114, and the electronic-power converter 116. The display layer 544 is a transparent layer such as a transparent OLED layer allowing light to pass through and reach the solar-cells layer 112 thereunder. The energy storage layer 114 is connected to the batteries in the cellphone via the electronic-power converter 116. Alternatively, the cellphone 540 may not comprise a separate set of batteries other than the energy storage layer 114.

In these embodiments, the cellphone 540 may not comprise the energy storage layer 114. Rather, the solar-cells layer 112 is connected to the batteries in the cellphone 540 via the electronic-power converter 116.

In various embodiments, the screen 542 may further comprise other necessary layers which may be located under the solar-cells layer 112 or, if the layers are transparent, located above the solar-cells layer 112.

In some alternative embodiments, the display layer 544 may be a liquid crystal display (LCD) layer. In these embodiments, backlight may be required to provide necessary illumination for displaying images. Moreover, the light-energy-conversion efficiency of the solar-cells layer 112 may be affected by the images displayed on the display layer 544. For example, the light-energy-conversion of the solar-cells layer 112 may be significantly reduced or even disabled when the display layer 544 displays a dark or a black image thereon.

In some alternative embodiments, the screen 542 may further comprise an optical-transformation layer between the transparent substrate 132 and the display layer 544. The optical-transformation layer comprises one or more meta-surfaces for adjusting one or more parameters such as the amplitude or intensity, phase, polarization, pattern, direction, and the like of the light emitted from the display layer 544. The detail of the optical-transformation layer is described in Applicant's copending U.S. provisional patent application Ser. No. 62/862,853, filed Jun. 18, 2019 and 62/961,317, filed Jan. 15, 2020, the content of each of which is incorporated herein by reference in its entirety.

Digital Current Estimation

In the embodiments shown in FIGS. 27 and 29, the current-shaping control module 316 is a HF current sensor and comprises necessary sensing circuits (or "sensors") for sensing a plurality of parameters. For example, the current-shaping control module 316 uses a HF current sensor for sensing the HF current $i_p$.

Current sensors are usually costly and may introduce noise and delay into the control module 316. The HF current sensor in the current-shaping control module 316 shown in FIGS. 27 and 29 increases the cost of the hybrid-energy apparatus, deteriorates its power density, and reduces the reliability of the control module 316.

Figure 42:
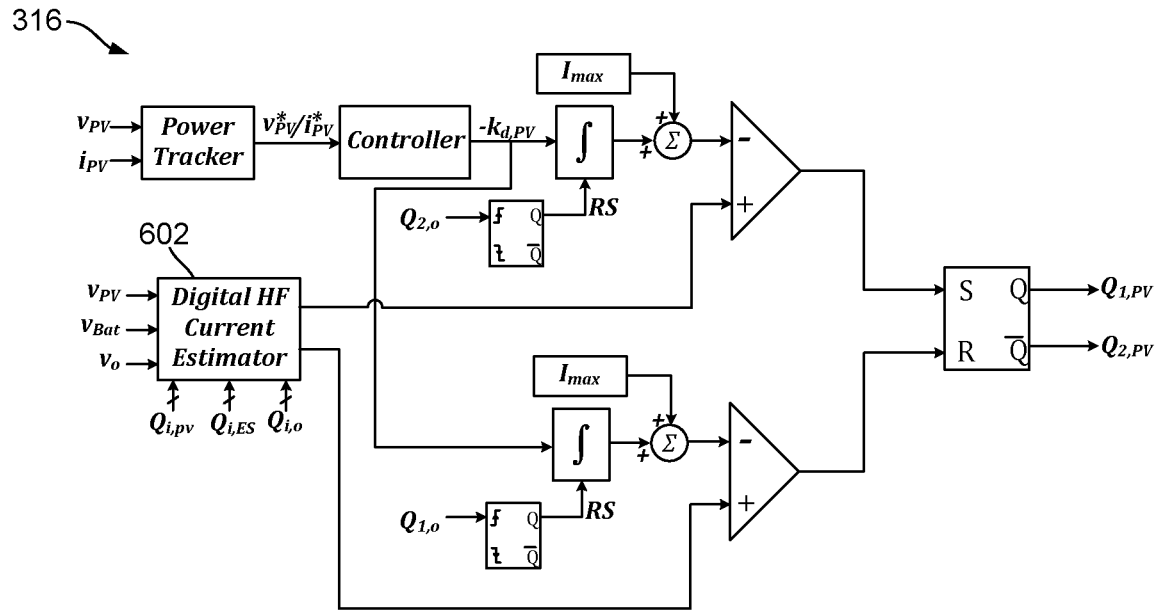
FIG. 42 is a block diagram of a current-shaping control module of the DC hybrid-energy device shown in FIG. 27, according to some embodiments of this disclosure, the current-shaping control module using a digital high-frequency (HF) current estimator 602 for estimating the HF current waveform.

FIG. 42 shows the current-shaping control module 316 in some embodiments. The current-shaping control module 316 in these embodiments similar to that shown in FIG. 27. However, the current-shaping control module 316 in these embodiments uses a digital HF current estimator 602 for estimating the HF current waveform and utilizing it as the feedback for the closed-loop control system shown in FIG. 27.

Specifically, the current-shaping control module 316 in these embodiments receives the input and output voltages ($v_o$, $v_{Bat}$, $v_{pv}$) as well as the gate pulse signals $Q_{i,PV}$, $Q_{i,ES}$, and $Q_{i,o}$ to estimate the HF current waveform, thereby avoiding using any current sensors.

Gallium Nitride (GaN) Gate-Driver Circuit

Prior-art GaN gate drivers may have reliability issues and may not be appropriate for industrial applications. One of the main reliability issues stems from the high reverse conduction voltage due to the reverse conduction mechanism of GaN devices. In some embodiments, GaN devices may be used as the power-semiconductors ($Q_{1,PV}$ and $Q_{2,PV}$, $Q_{1,ES}$ and $Q_{2,ES}$, and $Q_{1,o}$ and $Q_{2,o}$) in the circuitry modules 284, 286, and 288 of the power converter 116.

Figure 43:
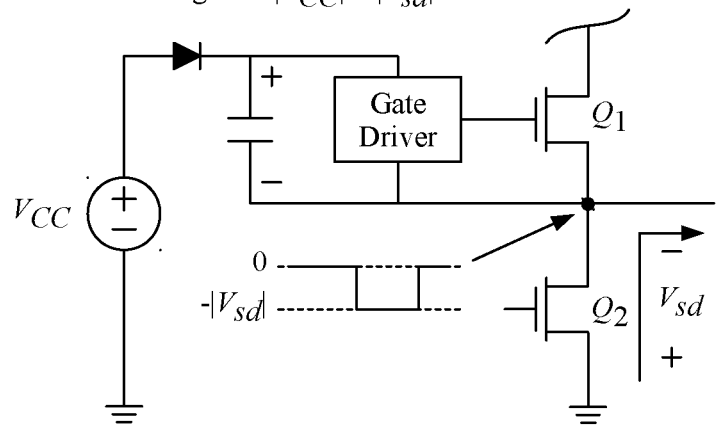
FIG. 43 is a circuit diagram showing a GaN gate-driver circuit with an overcharging issue.

In GaN gate-driver circuits, using boot-strap techniques in half-bridge structures may be challenging as it requires good regulation of gate bias (e.g., 5-6V bias with max rating of 7V). As shown in FIG. 43, during low-side free-wheeling, switch node negative voltage overcharges bootstrap capacitors and the high-side gate voltage of the GaN may exceed the maximum rating of 7V. As a result, post-regulation or voltage clamping may be required after bootstrap.

Figure 44:
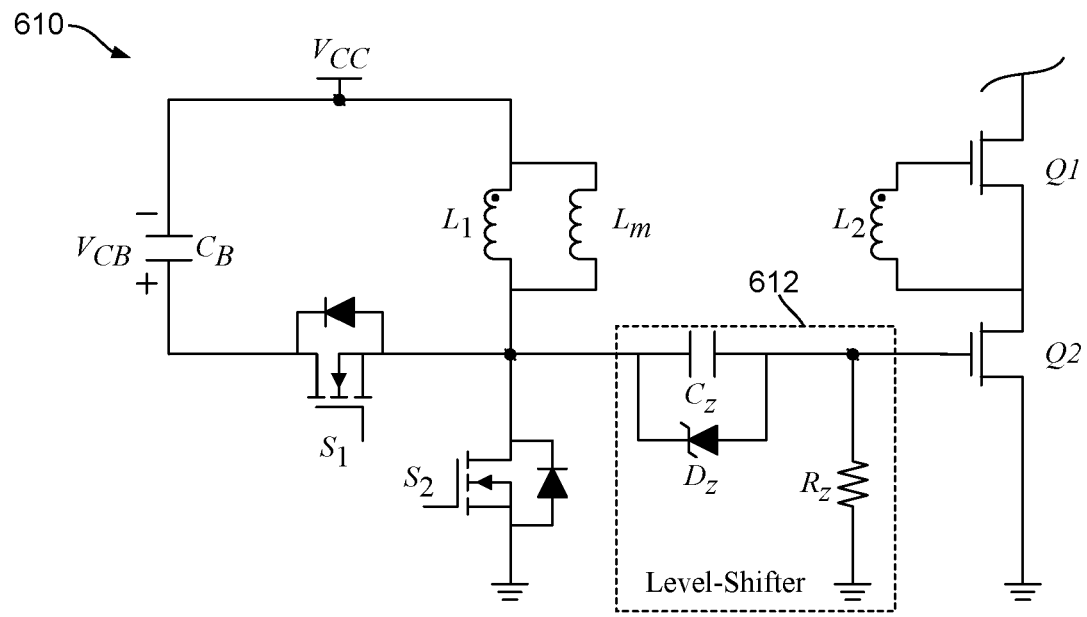
FIG. 44 is a circuit diagram showing a GaN gate-driver circuit, according to some embodiments of this disclosure.

FIG. 44 shows a GaN gate-driver circuit 610 with minimization of the reverse conduction time, used in the multi-input electronic-power converter 116. As shown, the GaN gate-driver circuit 610 comprises two GaN gates Q1 and Q2 to be charged or discharged. The GaN gate-driver circuit 610 uses two control switches $S_1$ and $S_2$, a pair of coupled-inductors $L_1$ and $L_2$, a clamp capacitor $C_B$, and a level-shifter 612 to avoid shoot-through. The level shifter 612 may be a voltage source. However, in these embodiments, the level shifter 612 is implemented using a Zener diode $D_z$ and a capacitor G coupled in parallel and connected to a resistor $R_z$ in series.

The GaN gate-driver circuit 610 has various advantages such as significant reduction of switching losses due to quick turn-on and turn-off of power switch at transition times, noise immunity, considerable gate drive loss reduction due to gate energy recovery, zero-voltage switching in the drive switches, low number of components, and simplicity of its control circuit. Compared to other current-source drivers (CSDs), the GaN gate-driver circuit 610 has a major advantage, which is that the voltage level of the GaN input capacitance rises to more than the gate drive power supply voltage. Parallel inductor may be added to the secondary side of the transformer to mitigate the effect of transformer parasitic capacitors.

The enhancement-mode GaN transistor has a property that the device has a failure mechanism if the maximum gate voltage for the device exceeds certain voltage level (e.g., 7V). This is also true for the depletion-mode GaN device. The enhancement-mode GaN devices require a gate voltage close to certain voltage level (e.g., 6V) to achieve optimal performance. The enhancement-mode GaN device, unlike its silicon counterpart, experiences device failure above certain voltage (e.g., 7V). When the gate-source voltage of the GaN increases, the drain-source resistance in the turn-on status may be lower and result in notable reduction in conduction loss. In some high-frequency applications, CSDs with capability to increase the gate-source voltage of the GaN device to more than the supply voltage are desirable. The existing gate drivers for GaN which is able to drive two GaN in one bridge leg cannot drive the gate with a higher voltage than the power supply. The unique feature of the GaN gate-driver circuit 610 is the boosting capability of gate-source voltage to lower $R_{ds}$(on) and, thus, the conduction losses.

Figure 45:
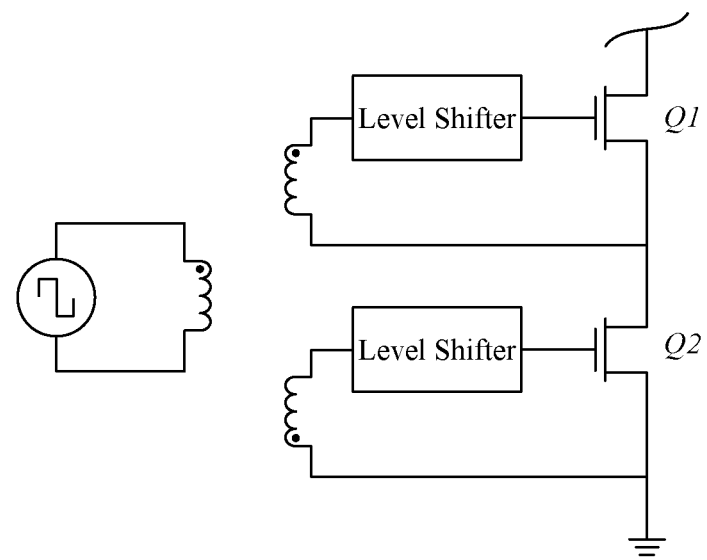
FIG. 45 is a circuit diagram showing level-shift circuit for avoiding a shoot-through problem.

With the GaN gate-driver circuit 610, the dead time and consequently reverse conduction loss are minimized. In fact, the reason of the reverse conduction loss is the dead time. In order to avoid the shoot-through, the dead time may be inserted between the gate-driver signals. As long as the crossover level of the gate-driver signals is equal to or less than the threshold voltage of the devices, the dead time may be eliminated and the shoot-through may also be avoided. Because the crossover level of the gate signals is always at half of $V_{CC}$, which is normally larger than the threshold voltage, the shoot through problem may incur. In the GaN gate-driver circuit 610, a level shifter circuit 612 may be inserted into the driver loop of either the top switch or the bottom switch. Based on the level-shift circuit 612, the crossover point may be adjusted to avoid the shoot-through problem as shown in FIG. 45. In addition, the negative voltage created by level-shifter bias ensures high reliability of the turn-off status to avoid the false turn-on due to the low threshold voltage. These benefits make the GaN gate-driver circuit 610 suitable for GaN devices in half-bridge structures.

Soft-Switching for HF Operations

Soft-switching is important for high frequency applications in order to significantly reduce the switching losses. For example, in some embodiments, the electronic-power converter 116 of the hybrid-energy device 102 may operate in megahertz (MHz) frequency-range. Thus, hard switching may result in excessive switching losses which degrades the performance and requires complicated thermal management.

Figure 46:
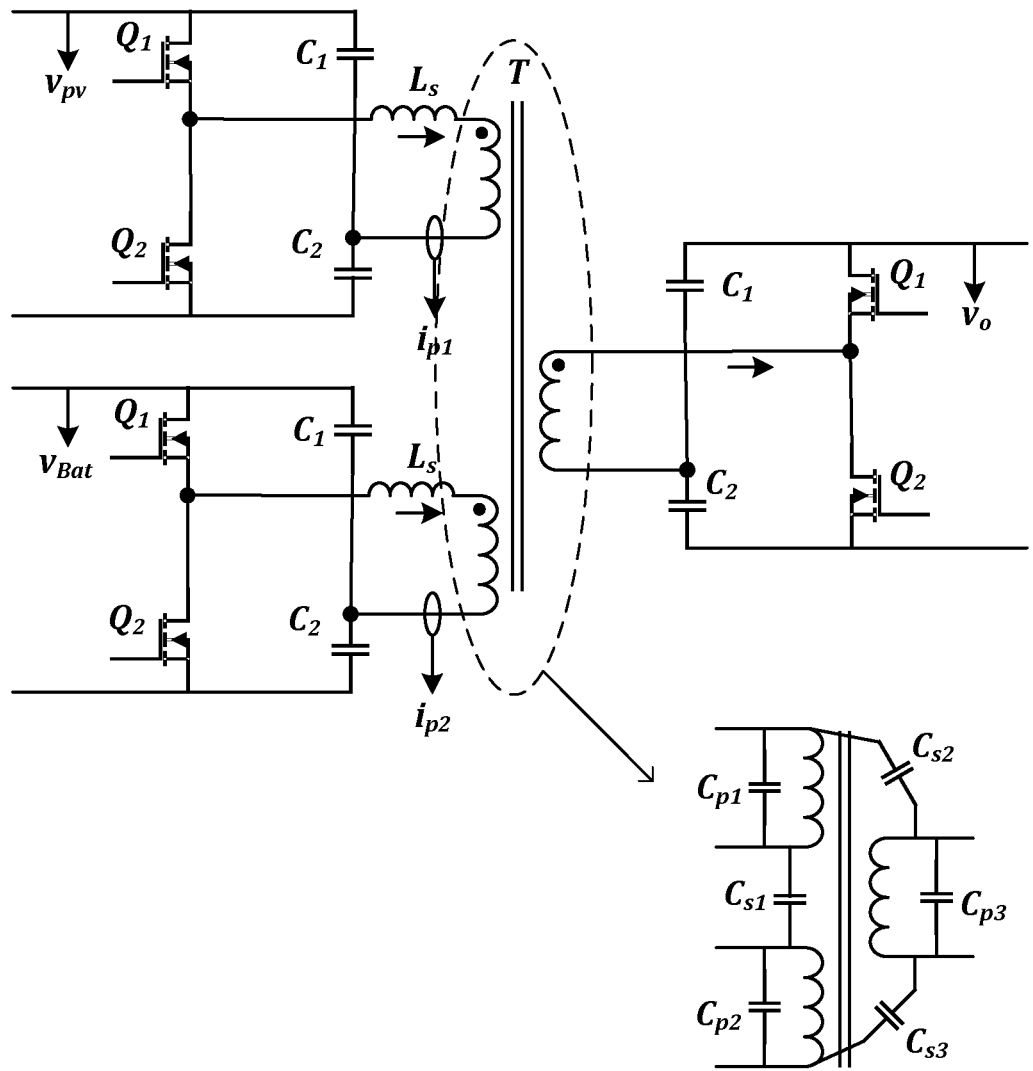
FIG. 46 is a circuit diagram showing an electrical-power converter with parasitic capacitances.

The power converter 116DC shown in FIG. 27 may provide zero-voltage switching (ZVS) and substantially decrease the switching losses. However, under certain conditions, ZVS may be lost thereby leading to poor performance. This issue stems from the fact that the high frequency transformer may have some parasitic capacitances. For example, FIG. 46 shows various parasitic capacitances $C_{p1}$ to $C_{p3}$ and $C_{s1}$ to $C_{s3}$ of the HF transformer T. These parasitic capacitances distort the ZVS operation under certain conditions.

Figure 47:
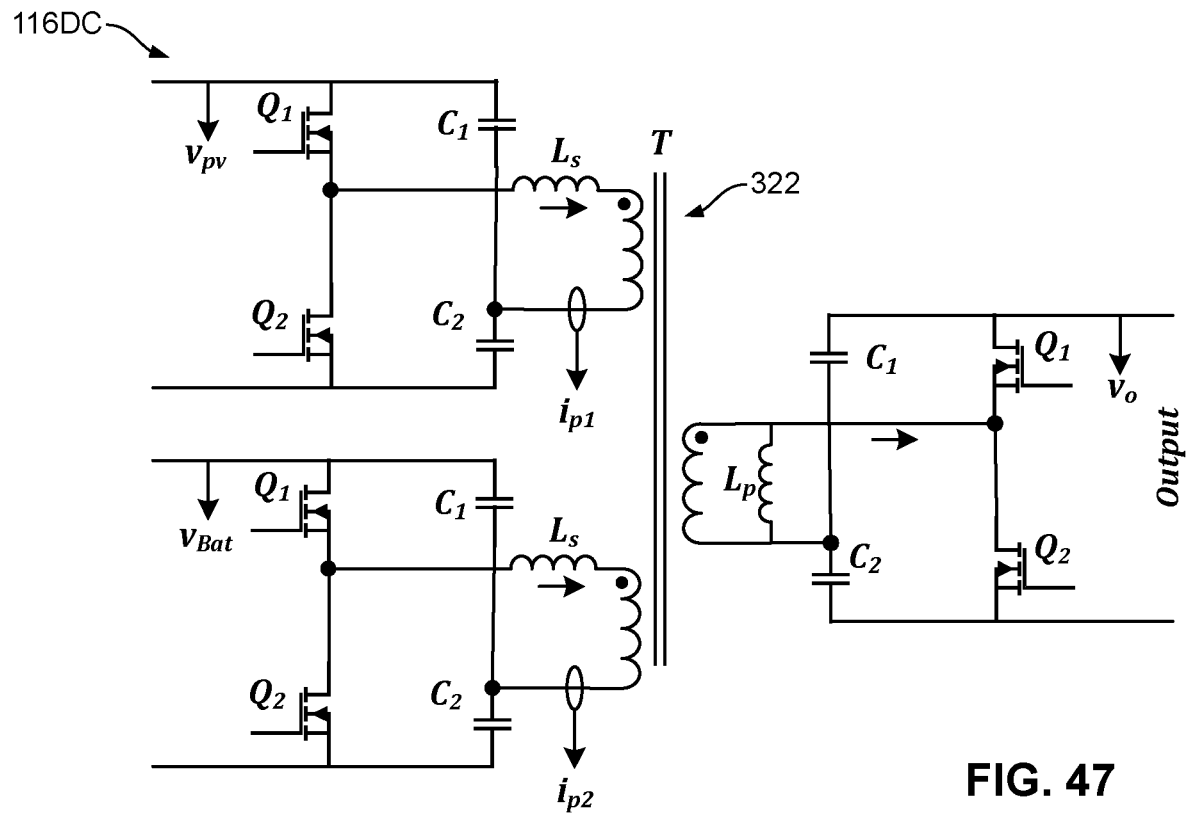
FIG. 47 is a circuit diagram showing a DC power converter with soft-switching and compensation for parasitic capacitances, according to some embodiments of this disclosure.

FIG. 47 is a circuit diagram of a DC power converter 116DC in some embodiments which may be used in the hybrid-energy device 102 shown in FIG. 27. The power converter 116 comprises a parallel inductor $L_p$ on the output side of the HF transformer 322 for effectively compensating for the above-described parasitic capacitances and providing soft-switching for the DC power converter 116DC. Those skilled in the art will appreciate that a similar design may be applied to the AC power converter 116AC shown in FIG. 36.

Thermoelectric Recycling:

Several components of the hybrid-energy device 102 may produce heat. For instance, solar panel 112 and power electronics (e.g., the electronic-power converter 116) are the main sources of heat in the hybrid-energy device 102.

In some embodiments, the produced heat may be recycled and converted into electricity by using a thermoelectric unit (also denoted a "thermoelectric generator" (TEG)).

Figure 48:
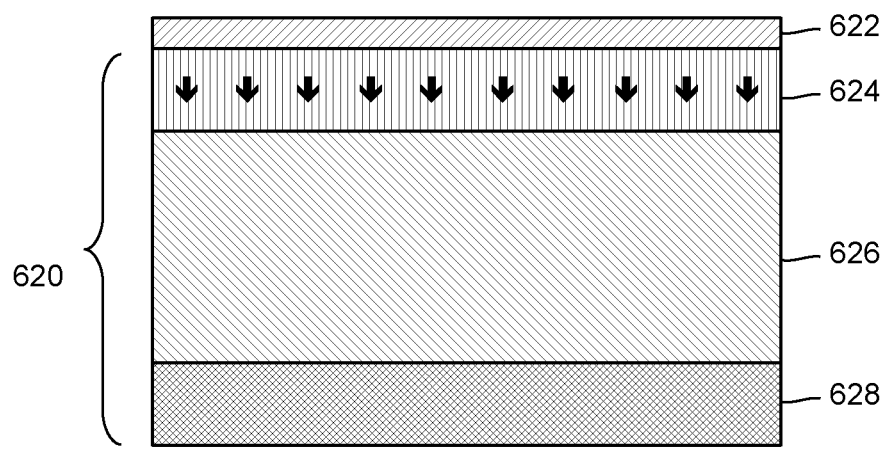
FIG. 48 is a schematic diagram showing a thermoelectric unit coupled to a heat source.

FIG. 48 is a schematic diagram showing a thermoelectric unit 620 coupled to a heat source 622 such as the solar panel 112 or electronic-power converter 116. The thermoelectric unit 620 comprises, naming from the heat source 622, a hot plate 624, a thermoelectric layer 626, and a cold plate 628.

The hot plate 624 is made of a suitable heat-conductive material such as a metal material for receiving heat generated by the heat source 622. In some embodiments, the hot plate 624 may be the substrate of the heat source 622. In some other embodiments, the hot plate 624 may be a separate plate coupled to the substrate of the heat source 622 using suitable means such as heat-conductive glue, screws, bolts, and/or the like. The cold plate 628 is made of a suitable material such as metal.

The thermoelectric layer 626 comprises a suitable thermoelectric material with low heat-conductivity (or substantially heat nonconductive or heat insulating) and high electron and hole mobility (i.e., electrons-and-holes-transportive), such as a two-dimensional (2D) perovskite or other suitable 2D materials for converting temperature gradient between the hot and cold plates 624 and 628 to electrical current. Here, the 2D material is a material that transports electrons and holes effectively but has a low heat transfer performance. In these embodiments, the 2D material may be any suitable 2D material type and may be different to the 2D perovskites used in the active layer of solar cells. A 3D material may transport both electricity and heat, and thus may not be preferable in these embodiments.

The hot plate 624, the thermoelectric layer 626, and the cold plate 628 have good electron conductivity. Moreover, the thermoelectric layer 626 has a low heat conductivity, and thus the hot plate 624, the thermoelectric layer 626, and the cold plate 628 form a structure for receiving heat from the heat source 622 and trapping the received heat close to the hot plate 624 for converting it to electricity.

Figures 49A, 49B:
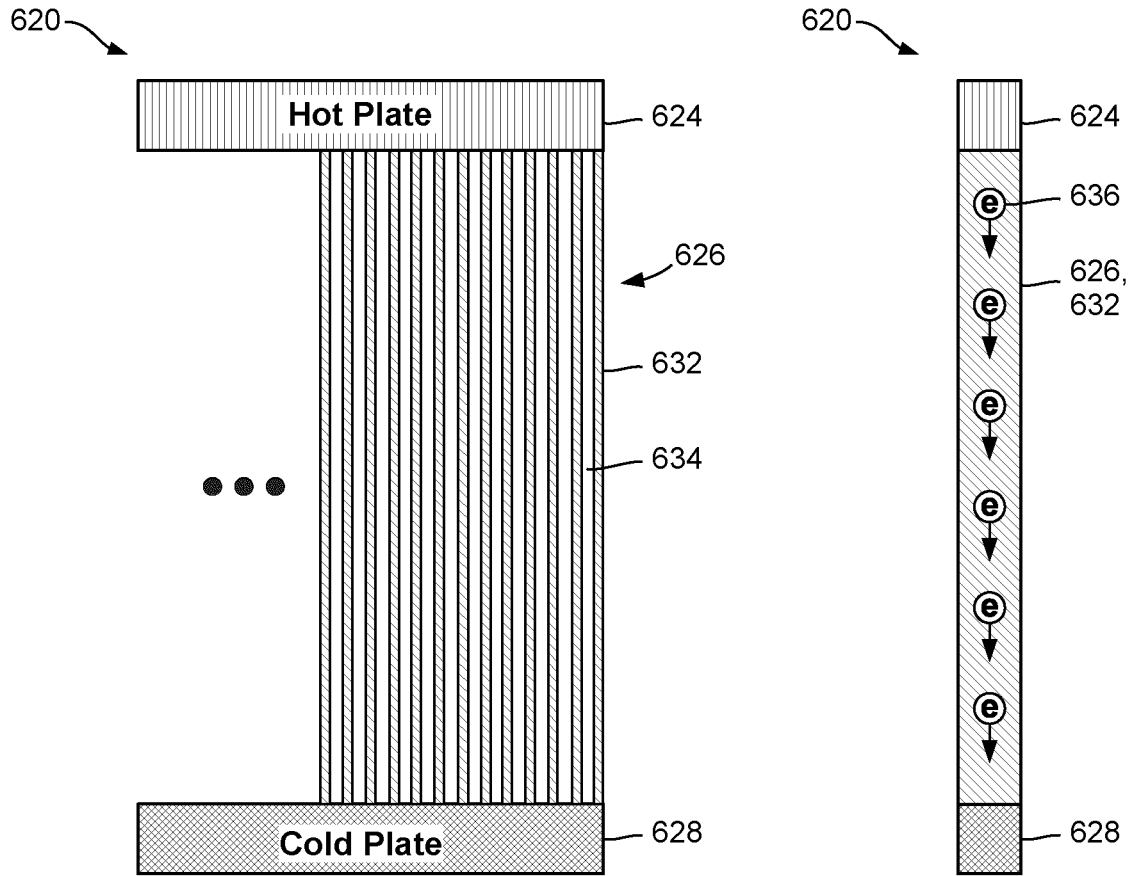
FIG. 49A is a schematic diagram showing the detail of the thermoelectric unit shown in FIG. 48.
FIG. 49B is a schematic diagram showing an enlarge portion of the thermoelectric unit shown in FIG. 48.

As shown in FIGS. 49A and 49B, the thermoelectric layer 626 in these embodiments comprises one or more 2D-material sublayers 632 such as 2D perovskite sublayers extending between the hot and cold plates 624 and 628. The one or more 2D-material sublayers 632 may be a continuous 2D-material sheet or a plurality of 2D-material sheet-segments or columns spaced from each other or separated by a plurality of spacers or fillers such as membranes 634. For example, the thermoelectric layer 626 in one embodiment may be made of a plurality of 2D perovskite sheets interleaved with a plurality of membrane sheets. In another embodiment, the thermoelectric layer 626 may be made by stacking a 2D perovskite sheet with a membrane sheet and rolling the stacked sheets to a cylinder to form the thermoelectric layer 626.

In operation, the hot plate 624 receives heat from the heat source 622 and forms a temperature gradient in the thermoelectric unit 620 which drives electrons 636 to move towards the cold plate 628 thereby generating an electrical current.

Thus, the thermoelectric unit 620 may provide useful redundancy for the solar-energy harvesting system 100 and may effectively recycle some of the thermal energy produced by the heat source 622.

In some embodiments, one of the solar panel 112 or electronic-power converter 116 is coupled to a thermoelectric unit 620.

In some embodiments, each of the solar panel 112 or electronic-power converter 116 is coupled to a thermoelectric unit 620.

Figure 50:
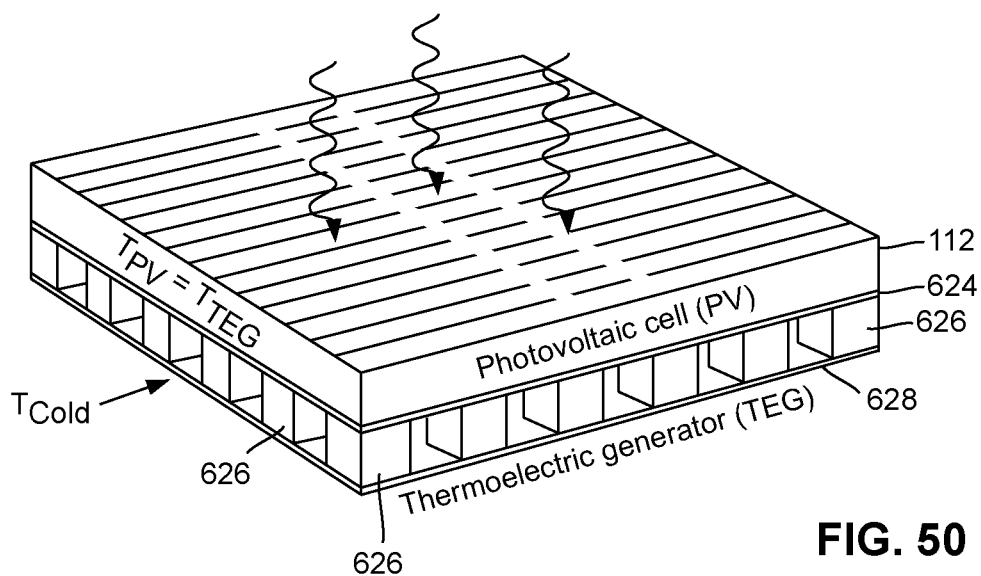
FIG. 50 is a schematic perspective view of an exemplary implementation of a photovoltaic (PV) panel integrated with a thermoelectric unit shown in FIG. 48.

FIG. 50 shows an exemplary implementation of a PV panel 112 integrated with or otherwise coupled to a thermoelectric unit or TEG 620. In this apparatus, wavelengths of solar radiation (typically in the range of 300 to 800 nm) are absorbed through the PV panel 112 and longer wavelengths are absorbed through the thermoelectric unit 620. By combining the PV panel 112 and the TEG 620, the power output thereof is greater than that of the PV panel 112 alone. Moreover, the TEG 620 also acts as a heatsink which reduces the working temperature of the PV panel 112 thereby leading to longer lifetime of the PV panel 112.

Figure 51A:
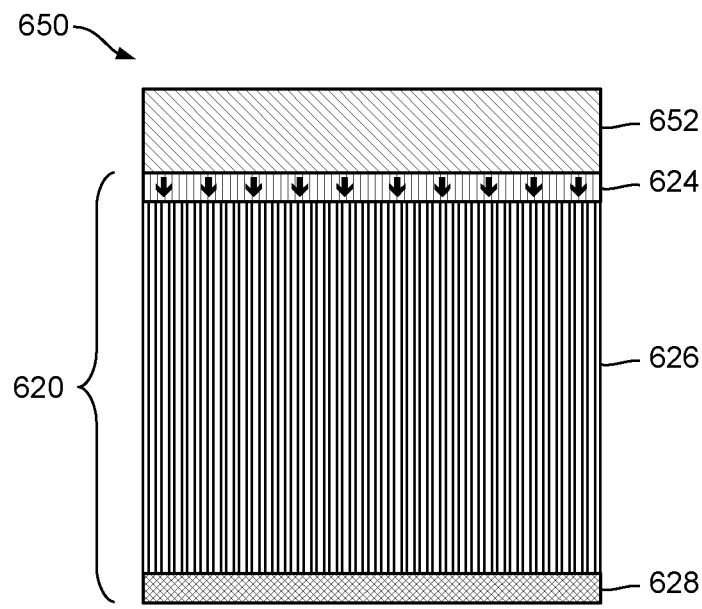
FIG. 51A is a schematic diagram showing a photovoltaic-thermoelectric unit, according to some embodiments of this disclosure.
Figure 51B:
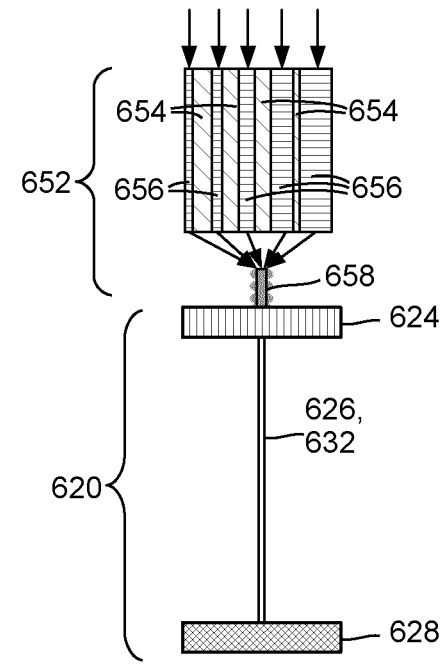
FIG. 51B is a schematic diagram showing an enlarge portion of the photovoltaic-thermoelectric unit shown in FIG. 51A.
Figure 51C:
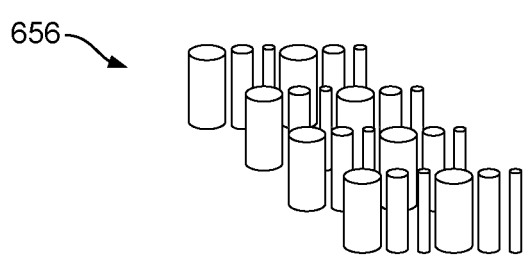
FIG. 51C is a schematic perspective view of a portion of a metasurface.

FIGS. 51A and 51B are schematic diagrams showing a photovoltaic-thermoelectric unit 650, according to some embodiments of this disclosure. As shown, the photovoltaic-thermoelectric unit 650 comprises a light-harvesting layer 652 and a TEG 620 coupled thereto. The TEG 620 is similar to that shown in FIGS. 48 to 50 and comprises, naming from the light-harvesting layer 652, a hot plate 624, a thermoelectric layer 626, and a cold plate 628.

The light-harvesting layer 652 comprises a first sublayer having a plurality of solar cells 654 mixed with a plurality of metasurfaces 656 (which are a plurality of nano-columns as shown in FIG. 47C), and a second sublayer having a plurality of nano-wires 658 coupled to the first sublayer.

As those skilled in the art will appreciate, solar cells 654 can only harvest energy in a specific frequency spectrum. In conventional solar panels, the unharvested optical energy is usually wasted as heat.

In these embodiments, the metasurfaces 656 are designed to utilize the energy of the light spectrum that is unusable by the solar cells 654 to further improve the solar-energy usage. Specifically, the metasurfaces 656 may be designed to conduct light with certain frequencies such as those unusable by the solar cells 654. This light conducted through the metasurfaces 656 are converted to heat by the nano-wires 658 and then converted into electricity by the TEG 620.

Figure 51D:
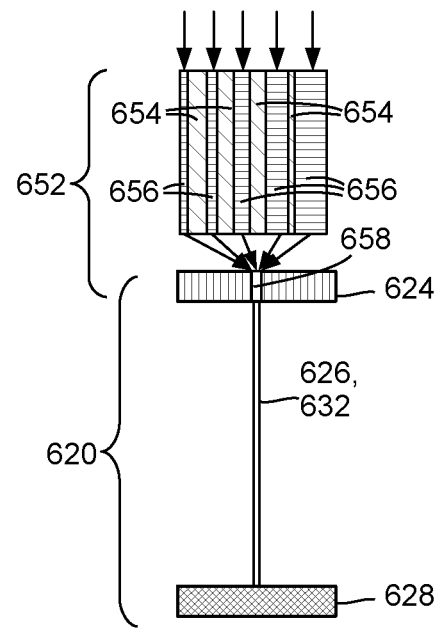
FIG. 51D is a schematic perspective view of a portion of a metasurface, according to some embodiments of this disclosure.

As shown in FIG. 51D, the nano-wires 658 may be embedded in the hot plate 624 and directly transfer the converted heat to the thermoelectric layer 626 for converting to electricity.

Figure 52:
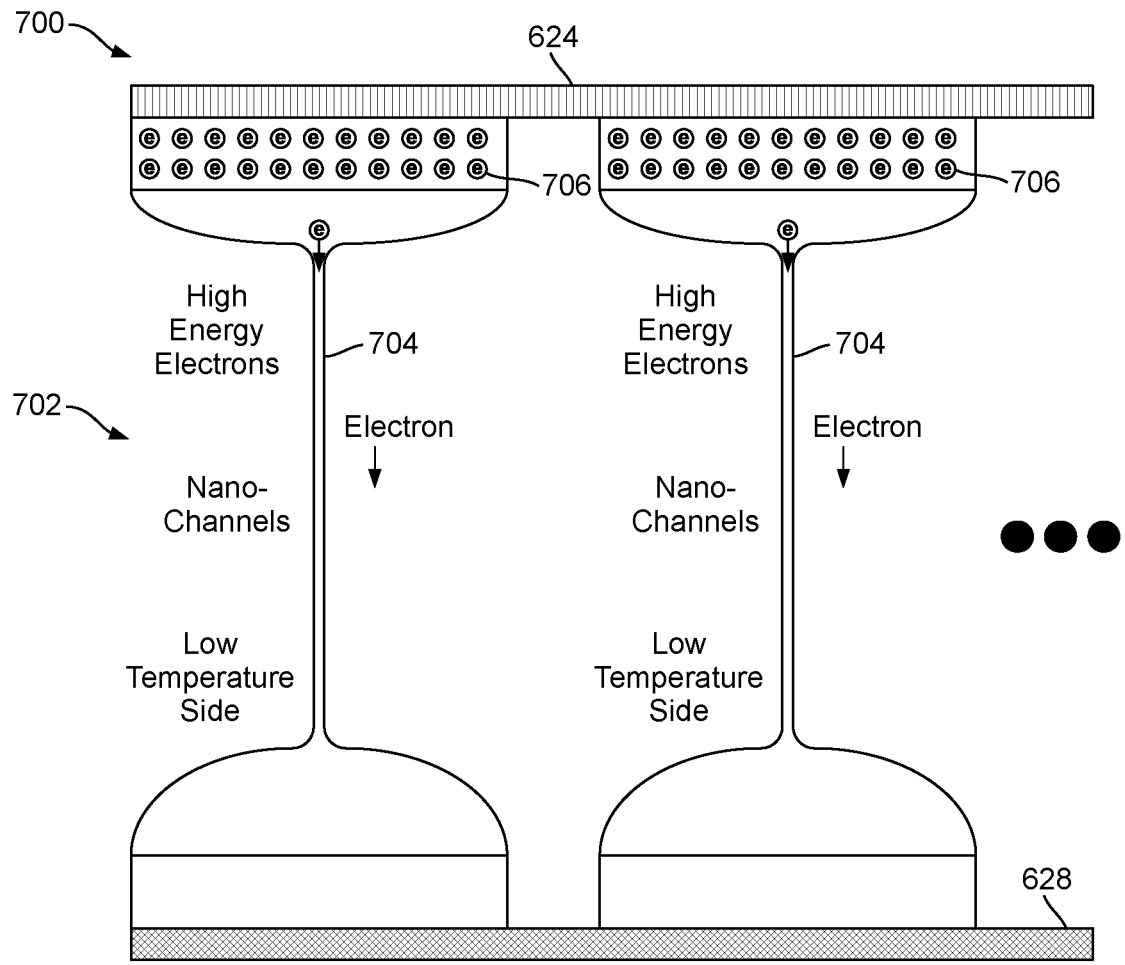
FIG. 52 is a schematic diagram showing a thermoelectric unit, according to some embodiments of this disclosure, the thermoelectric unit comprising a plurality of nano-channels in parallel.

FIG. 52 shows a thermoelectric unit or TEG 700 according to some embodiments of this disclosure. In these embodiments, the TEG 700 comprises a hot plate 624 and a cold plate 628 similar to those described above, and a nano-channel layer 702 sandwiched between the hot and cold plates 624 and 628. The nano-channel layer 702 comprises a plurality of nano-channels 704 in parallel. The nano-channels are made of suitable electrically conductive material such as carbon (e.g., graphene), gold, and/or the like, and have one or more subwavelength dimensions. For example, in some embodiments, the nano-channel layer 702 may have a subwavelength thickness (the dimension between the hot and cold plates 624 and 628) such as about 10 nm to allow quantum effect to be prominent for moving electrons (see FIG. 49B).

In these embodiments, the nano-channels 704 are used for trapping the heat in the hot-plate side and providing a channel for electrons 706 to flow therethrough. In other words, the nano-channel layer 702 is electrically conductive to allow electrons 706 flow, but on the other hand impedes the heat-transfer and maintains temperature gradient.

Figure 53:
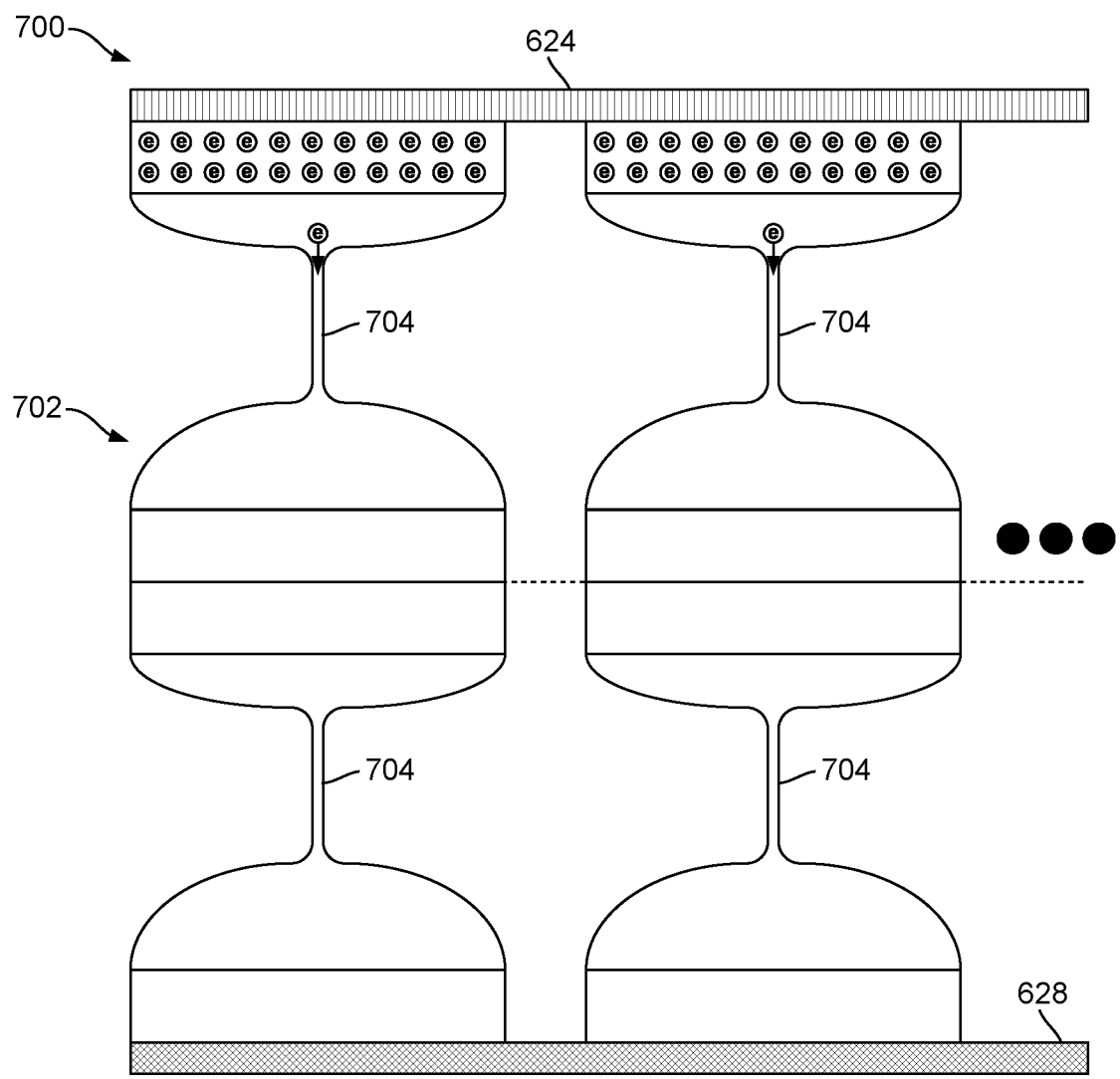
FIG. 53 is a schematic diagram showing a thermoelectric unit, according to some embodiments of this disclosure, the thermoelectric unit comprising a plurality of nano-channels in a mixture of parallel and series.

In some similar embodiments, the nano-channel layer 702 may comprise a plurality of nano-channels 704 arranged in series or in a mixture of parallel and series; see FIG. 53.

Supercapacitor Technology

Energy storage in the solar-energy harvesting system 100 is important as the solar light conditions in practice are usually unstable. Considering the intermittency of the solar energy, the energy storage unit may be an integral part of the hybrid-energy device 102.

Various methods may be used to store energy, among which batteries and supercapacitors are the most common solutions because of their superior performance. For example, in some embodiments, high-density Lithium-Ion (LI) batteries may be used for storing energy.

In some embodiments, such as in embodiments where PV panels 112 having large sizes are used, supercapacitors may be used for storing energy.

Supercapacitors are a relatively new class of energy storage systems that have fast power delivery and life-time of more than thousands of charge-discharge cycles at high current densities. Electrochemical double layer capacitors (EDLCs) store opposite charges at the interface of anode and cathode by physisorption which is a different mechanism compared to batteries (energy storage occurs by means of redox reactions). As a result, supercapacitors can offer faster ion-exchange kinetics and longer working cycles compared to batteries. Supercapacitors specifically appealing to be used in high power applications such as hybrid electrical vehicles and power station.

Figure 54A:
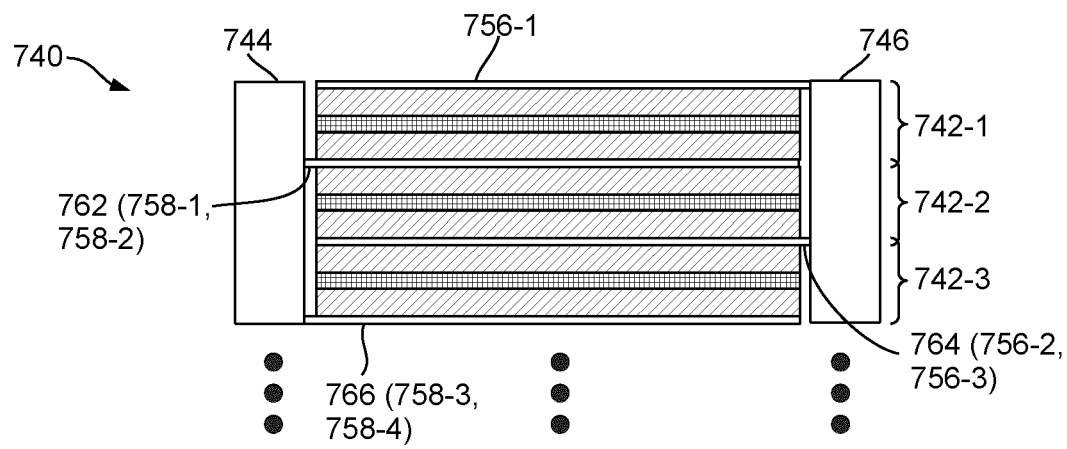
FIG. 54A is a schematic diagram showing the structure of a supercapacitor, according to some embodiments of this disclosure.
Figure 54B:
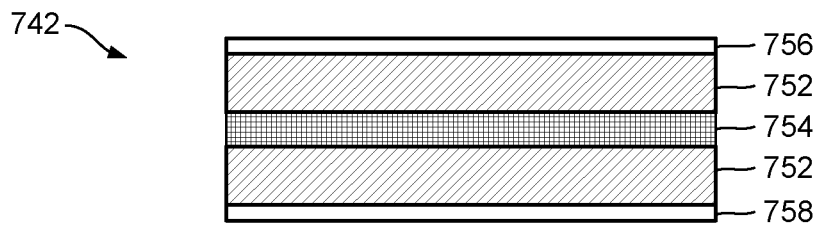
FIG. 54B is a schematic diagram showing a capacitor layer of the supercapacitor shown in FIG. 54A.

FIGS. 54A and 54B show the structure of a supercapacitor 740. As shown the supercapacitor 740 comprises a plurality of stacked capacitor layers 742 coupled to a pair of conductors or electrical terminals 744 and 746.

Each capacitor layer 742 comprises a pair of thin-film sublayers 752 sandwiching and separated by an electrically insulating membrane sublayer 754 therebetween, and a pair of conductor sublayers 756 and 758 sandwiching the thin-film sublayers 752 (and the membrane sublayer 754) therebetween. The thin-film sublayers 752 are made of electrically conductive thin-film materials such as a mixture of activated carbon, graphene, graphite, and/or the like. The membrane sublayer 754 is coated with ionic liquid material, or by soaking the membrane in the ionic liquid and removing the excess liquid by hanging the membrane for a few minutes.

Each of the conductor sublayers 756 and 758 is electrically connected to a respective terminal 744 or 746. For example, as shown in FIG. 54A, the conductor sublayer 756 is electrically connected to the terminal 744 and the conductor sublayer 758 is electrically connected to the terminal 746.

When a plurality of capacitor layers 742 are stacked together, neighboring capacitor layers 742 may share a conductor sublayer. For example, as shown in FIG. 54A, the neighboring capacitor layers 742-1 and 742-2 share a conductor sublayer 762 which is effectively the conductor sublayer 758-1 of the capacitor layer 742-1 and the conductor sublayer 758-2 of the capacitor layer 742-2. Similarly, the neighboring capacitor layers 742-2 and 742-3 share a conductor sublayer 764, and the neighboring capacitor layers 742-3 and 742-4 (not shown) share a conductor sublayer 766.

With this structure, the supercapacitor 740 may have a thin thickness with a large area. A plurality of supercapacitors 740 may be integrated to provide sufficient storage capacity required for the hybrid-energy device 102. The supercapacitor 740 has several major advantages.

For example, the use of thin-film materials facilitates the building of high energy-density supercapacitors 740.

The supercapacitor 740 has a fast dynamic behavior, i.e., charging and discharging of the supercapacitor 740 may be much faster than that of batteries. Such a fast dynamic behavior is important to the solar-energy harvesting system 100 due to the erratic nature of the solar energy.

Another advantage of the supercapacitor 740 is its lifetime. Unlike batteries, there is no electrochemical reactions in the supercapacitor 740. Thus, the lifespan of the supercapacitor 740 may be extended many years with minimal performance degradation.

Yet another advantage of the supercapacitor 740 is its wide temperature range which makes it ideal for outdoor applications.

In the following a symmetric supercapacitor and a fabrication process thereof are described. The supercapacitor may comprise one or more supercapacitor cells with each supercapacitor cell comprising a separator such as a membrane, electrolyte (i.e., ionic liquid), a cathode, an anode, and a pair of current collectors.

In some embodiments the membrane may be cellulose fiber. In some other embodiments, the membrane may be a polymer membrane with high density of pores and/or a suitable separator offered by Celgard LLC of Charlotte, N.C., United States.

The electrolyte ionic liquid may be 1-Ethyl-3-methylimidazolium tetrafluoroborate ($EMIMBF_4$) which is air and water stable thereby making it a good candidate for supercapacitors working at extreme hot or cold temperatures.

The cathode and anode may comprise thin films of conductive material coated on the surface of the separator.

In some embodiments, silver nanoparticles dissolved in xylene or other suitable solvents may be used for forming the current collector. In some other embodiments a thin foil of metal or graphene-based sheet may be used as the current collector. In still some other embodiments, a combination of coated silver ink and thin foil may be used for forming the current collector.

Each supercapacitor cell may be formed by a membrane coated with ionic liquid, conductive ink, and current collector. The conductive ink may comprise activated carbon, graphene, binder, and volatile solvent. In some embodiments, both cathode and anode can be fabricated using the same conductive ink and in other embodiments the components in the ink can be different for electrodes.

The supercapacitor cells may be fabricated using a suitable printing or coating technology such as a combination of slot-die coating, spray coating printing, and doctor blade. The ink used to print the cathode and anode comprises activated carbon, graphene, carbon nanotube, and binder dispersed in a volatile solvents such as acetone.

Figure 55:
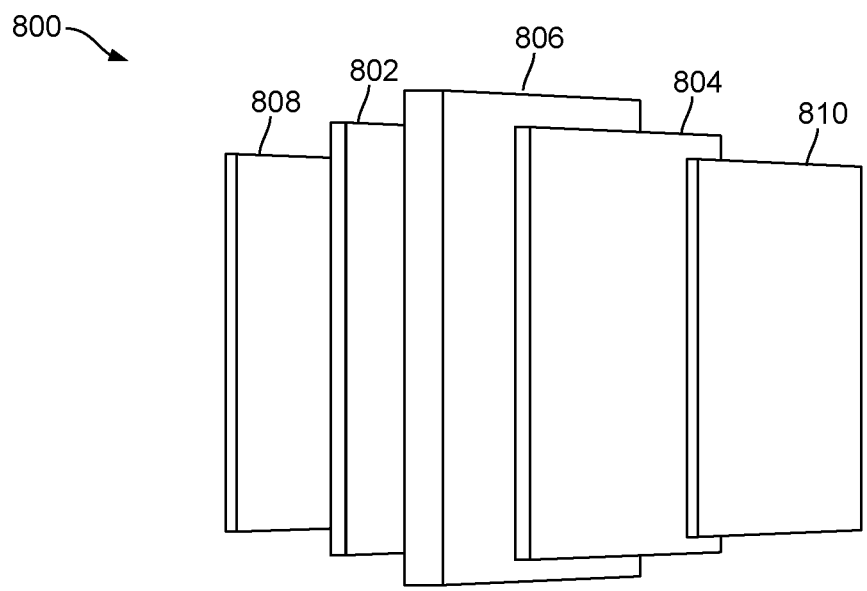
FIG. 55 is a schematic diagram showing the structure of a symmetric supercapacitor or a symmetric supercapacitor cell, according to some embodiments of this disclosure.

FIG. 55 shows the structure of a supercapacitor 800, according to some embodiments of this disclosure. The supercapacitor 800 in these embodiments is a symmetric supercapacitor having an anode 802 and a cathode 804 separated by a membrane 806, and a pair of current collectors 808 and 810 sandwiching the combination of the anode 802, membrane 806, and cathode 804 therebetween. The supercapacitor 800 also comprises ionic liquid (not shown) between the anode 802 and membrane 806, and between the cathode 804 and membrane 806.

In these embodiments, the anode 802, cathode 804, and the current collectors 808 and 810 are coated films coated with a suitable conductive material. The membrane 806 may be a cellulose or polymer with high rate of porosity. The ionic liquid may be $EMIMBF_4$ or similar electrolytes. The cathode and anode are made of similar material with sufficient electrical conductivity.

With this structure, the supercapacitor 800 is a flexible supercapacitor.

In some embodiments, the supercapacitor 800 may be formed by one or more supercapacitor cells 800' wherein each supercapacitor cell 800' has a structure as shown in FIG. 55.

Figure 56:
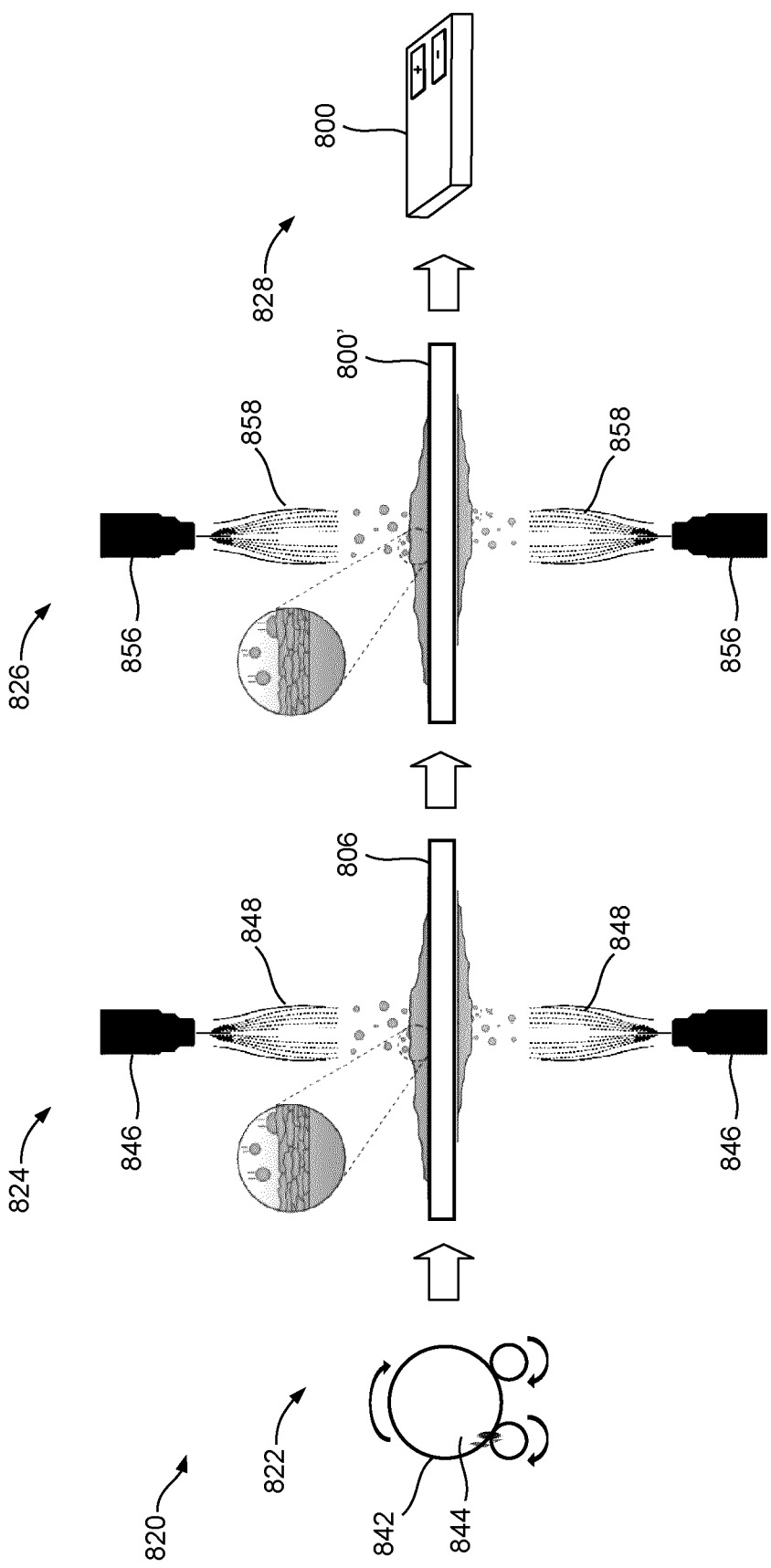
FIG. 56 is a schematic diagram showing a large-scale fabrication process of the supercapacitor or supercapacitor cells shown in FIG. 55 using a spray-coating technology, according to some embodiments of this disclosure.

FIG. 56 is a schematic diagram showing a fabrication process 820 of the supercapacitor cells 800' using a spray-coating technology. The fabrication process 820 is suitable for large-scale fabrication of supercapacitor cells 800'.

In various embodiments, the slot-die coater or doctor blade methods may be used as a printing tool. In some embodiments, in addition to the spray-coated current collector, a thin foil of metal or GRAFOIL® flexible graphite (GRAFOIL is a registered trademark of Neograf Solutions, LLC of Lakewood, Ohio, USA) may be used to reduce the resistivity of the cell. The thin foil of metal may be aluminum, nickel or other materials depending on the choice of ionic liquid and conductive ink compound. In some embodiments, PMMA may be used as an insulator and encapsulant.

In these embodiments, the ink compound has high concentration of activated carbon and graphene mixed with stabilizer and volatile solvents to facilitate the fabrication process 820. In some embodiments, the ink may be made of carbon nanotubes or carbon fiber mixed with activated carbon and graphene. In some embodiments supercapacitor cells 800' may be fabricated using different cathode and anode materials or different concentration of compounds in the ink.

As shown in FIG. 56, at the ink preparation stage 822, the conductive ink is processed using a ball mill 842 to crush down the material 844 therein such as activated carbon, graphene, binder, and suitable medium, to fine-size particles. All the powders and solvents are added in this step to the ball mill and let it mix for few hours. The processed ink is then filtered and transferred to the printing station (not shown).

At the coating stage 824, two spray coaters 846 are used to sequentially apply the solutions 848 of ionic liquid, conductive ink, and current collector onto the opposite sides of the membrane 806 with proper annealing procedure to remove the volatile solvents.

At the encapsulation stage 826, two spray coaters 856 are used to apply a thin layer of PMMA insulator 858 onto the supercapacitor cell 800' to prevent short-circuit of stacked supercapacitor cells. At the packaging stage 828, the supercapacitor cells 800' are transferred to a vacuum chamber for final encapsulation and packaging for making the supercapacitors 800.

Figure 57:
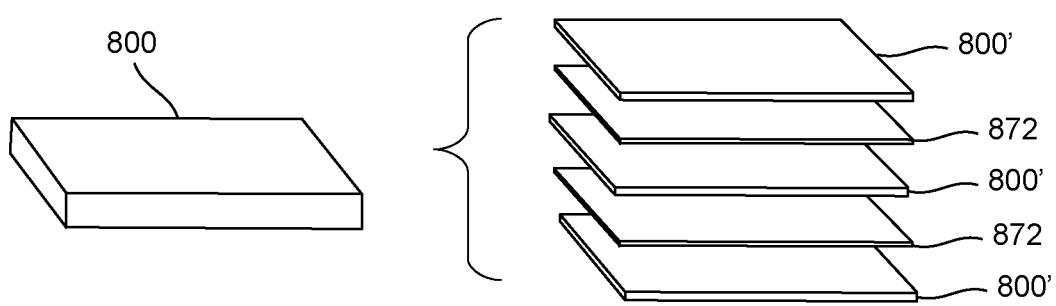
FIG. 57 is a schematic perspective view showing a supercapacitor formed by stacking a plurality of supercapacitor cells shown in FIG. 45 with suitable insulators.

FIG. 57 shows a supercapacitor 800 formed by stacking a plurality of supercapacitor cells 800' with suitable insulators 872 such as PMMA insulators sandwiched between each pair of neighboring supercapacitor cells 800' for electrical insulation. In these embodiments, the supercapacitor cells 800' may be stacked in series or in parallel. The PMMA insulators may be coated to the supercapacitor cells 800'.

With this structure, the supercapacitor 800 may have extended lifetime of each cell 800' as PMMA is a good encapsulation material which prevents air and moisture from entering the supercapacitor cells 800'.

Although embodiments have been described above with reference to the accompanying drawings, those of skill in the art will appreciate that variations and modifications may be made without departing from the scope thereof as defined by the appended claims.

What is claimed is:

1. A power circuitry comprising:
   a first input circuit for coupling to a photovoltaic (PV) source;
   a second input circuit for coupling to an energy-storage source;
   a third circuit coupled to the first and second input circuits for combining outputs of the first and second circuits and outputting electrical energy via a direct-current (DC) output thereof; and
   a control circuit coupled to the first, second, and third circuits for controlling the output of the third circuit by controlling parameters of the first, second, and third circuits based on output voltages of the PV and energy-storage sources, outputs of the first and second input circuits coupling to the third circuits, and an output voltage of the third circuit.

2. The power circuitry of claim 1 further comprising a transformer directly coupling the first, second, and third circuits with the first and second input circuits on an input side of the transformer and the third circuit on an output side of the transformer.

3. The power circuitry of claim 2, wherein the third circuit comprises a parallel inductor on the output side of the transformer for compensating for parasitic capacitances.

4. The power circuitry of claim 1, wherein each of the first, second, and third circuits comprises one or more semiconductors for power conversion.

5. The power circuitry of claim 4, wherein the control circuit is configured for controlling the output of the third circuit by adjusting gate signals applied to gate terminals of the semiconductors of the first, second, and third circuits based on the output voltages of the PV and energy-storage sources, the outputs of the first and second input circuits coupling to the third circuits, and the output voltage of the third circuit.

6. The power circuitry of claim 5, wherein the outputs of the first and second input circuits are output voltages of the first and second input circuits; and wherein the power circuitry further comprises one or more current estimators for estimating the output currents of the first and second input circuits based on the output voltages of the PV source, the energy-storage source, and the third circuit, and the gate signals of the semiconductors of the first, second, and third circuits.

7. The power circuitry of claim 4, wherein the one or more semiconductors of at least one of the first, second, and third circuits are gallium nitride (GaN) gates; and wherein the power circuitry further comprises a GaN gate-driver circuit for preventing the GaN gates from shoot-through, the GaN gate-driver circuit comprising a level-shifter circuit.

8. The power circuitry of claim 7, wherein the level-shifter circuit comprises a Zener diode and a capacitor coupled in parallel and connected to a resistor in series.

9. The power circuitry of claim 1, wherein the outputs of the first and second input circuits are output currents of the first and second input circuits; and wherein the power circuitry further comprises one or more current sensors for sensing the output currents of the first and second input circuits.

10. The power circuitry of claim 1, wherein the control circuit is configured for controlling the output of the third circuit further based on at least one of output currents of the PV and energy-storage sources, and an input current of the third circuit.

11. The power circuitry of claim 1, wherein the output of the third circuit is a direct-current (DC) output;
   wherein the power circuitry further comprises a DC-to-AC inverter circuit coupled to the third circuit for converting the DC output of the third circuit to an alternate-current (AC) output; and
   wherein the control circuit is configured for controlling the output of the DC-to-AC inverter circuit based on the output voltages of the PV and energy-storage sources, the output currents of the first and second input circuits coupling to the third circuits, the output voltage of the third circuit, an output voltage of the DC-to-AC inverter circuit, and an output current of the DC-to-AC inverter circuit.

12. An energy apparatus comprising:
   a transparent or semi-transparent substrate;
   a solar-cell layer coupled to the substrate, the solar-cell layer comprising a plurality of solar cells for receiving light through the substrate and converting energy of the received light to a first electrical energy;
   an energy-storage layer coupled to the solar-cell layer, the energy-storage layer comprising one or more energy-storage units for storing a second electrical energy; and
   a converter layer coupled to the solar-cell layer and the energy-storage layer for combining outputs of the solar-cell layer and the energy-storage layer and outputting electrical energy;
   wherein the converter layer comprises the power circuitry according to any one of claims 1 to 3 and using the solar-cell and energy-storage layers as the PV and energy-storage sources, respectively.

* * * * *